(12) United States Patent
Gschwind et al.

(10) Patent No.: US 10,664,181 B2
(45) Date of Patent: May 26, 2020

(54) PROTECTING IN-MEMORY CONFIGURATION STATE REGISTERS

(71) Applicant: INTERNATIONAL BUSINESS MACHINES CORPORATION, Armonk, NY (US)

(72) Inventors: Michael K. Gschwind, Chappaqua, NY (US); Valentina Salapura, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/812,190

(22) Filed: Nov. 14, 2017

(65) Prior Publication Data

US 2019/0146874 A1  May 16, 2019

(51) Int. Cl.
*G06F 3/06* (2006.01)
*G06F 11/10* (2006.01)
*G06F 9/455* (2018.01)
*G11C 29/52* (2006.01)

(52) U.S. Cl.
CPC ............ *G06F 3/0629* (2013.01); *G06F 3/065* (2013.01); *G06F 3/0619* (2013.01); *G06F 3/0673* (2013.01); *G06F 9/45533* (2013.01); *G06F 11/1076* (2013.01); *G11C 29/52* (2013.01)

(58) Field of Classification Search
CPC ............ G06F 11/1076; G06F 12/0811; G06F 12/0804; G06F 3/0619; G06F 3/076; G06F 3/065; G06F 3/067; G06F 3/0673; G06F 3/0629; G11C 29/52
See application file for complete search history.

(56) References Cited

U.S. PATENT DOCUMENTS

| | | |
|---|---|---|
| 4,528,666 A | 7/1985 | Cline et al. |
| 5,590,295 A | 12/1996 | Deosaran et al. |
| 5,684,993 A | 11/1997 | Willman |
| 5,802,347 A | 9/1998 | Yabumoto |
| 5,835,925 A | 11/1998 | Kessler |
| 5,864,875 A | 1/1999 | Van Huben |

(Continued)

FOREIGN PATENT DOCUMENTS

| | | |
|---|---|---|
| CN | 102163141 A | 8/2011 |
| JP | 2003218870 A | 7/2003 |

(Continued)

OTHER PUBLICATIONS

Anonymous, "Application Program Code Sharing Across Multiple Guest Operating Systems in a Virtualized Environment," Jun. 19, 2012, pp. 1-4 (+ cover).

(Continued)

*Primary Examiner* — Shelly A Chase
(74) *Attorney, Agent, or Firm* — Steven Chiu, Esq.; Blanche E. Schiller, Esq.; Heslin Rothenberg Farley & Mesiti P.C.

(57) ABSTRACT

Protecting in-memory configuration state registers. A request to access an in-memory configuration state register, such as a read or write request, is obtained. The in-memory configuration state register is mapped to memory. Error correction code of the memory is used to protect the access to the in-memory configuration state register.

15 Claims, 44 Drawing Sheets

(56) References Cited

U.S. PATENT DOCUMENTS

| | | |
|---|---|---|
| 5,900,025 A | 5/1999 | Sollars |
| 5,936,640 A | 8/1999 | Horan |
| 5,983,308 A | 11/1999 | Kerstein |
| 5,983,342 A | 11/1999 | Tran |
| 6,345,356 B1 | 2/2002 | Derrick et al. |
| 6,356,996 B1 | 3/2002 | Adams |
| 6,393,504 B1 | 5/2002 | Leung |
| 6,449,710 B1 | 9/2002 | Isaman |
| 6,456,891 B1 | 9/2002 | Kranich et al. |
| 6,480,941 B1 | 11/2002 | Franke et al. |
| 6,487,212 B1 | 11/2002 | Erimli |
| 6,549,995 B1 | 4/2003 | Schulz |
| 6,711,673 B1 | 3/2004 | Mitchell |
| 6,877,088 B2 | 4/2005 | Dice |
| 6,907,600 B2 | 6/2005 | Neiger et al. |
| 6,931,639 B1 | 8/2005 | Eickemeyer |
| 7,020,854 B2 | 3/2006 | Killian et al. |
| 7,034,849 B1 | 4/2006 | Weybrew |
| 7,043,679 B1 | 5/2006 | Keltcher et al. |
| 7,058,791 B1 | 6/2006 | Hughes |
| 7,089,377 B1 | 8/2006 | Chen |
| 7,330,942 B2 | 2/2008 | de Dinechin et al. |
| 7,428,626 B2 | 9/2008 | Vega |
| 7,529,915 B2 | 5/2009 | Gelinas et al. |
| 7,636,800 B2 | 12/2009 | Ben-Yehuda |
| 7,647,458 B1 | 1/2010 | Click, Jr. et al. |
| 7,814,287 B2 | 10/2010 | Pratt |
| 7,818,503 B2 | 10/2010 | Hoover et al. |
| 7,856,633 B1 | 12/2010 | Lee et al. |
| 7,873,816 B2 | 1/2011 | Hickey et al. |
| 7,937,710 B1 | 5/2011 | Silkebakken et al. |
| 8,006,204 B2 | 8/2011 | Killian et al. |
| 8,028,288 B2 | 9/2011 | Suzuoki et al. |
| 8,099,274 B2 | 1/2012 | Bohizic et al. |
| 8,135,920 B2 | 3/2012 | Kreuchauf et al. |
| 8,145,878 B2 | 3/2012 | Sundararaman et al. |
| 8,161,263 B2 | 4/2012 | Arimilli et al. |
| 8,191,085 B2 | 5/2012 | Moyer |
| 8,250,347 B2 | 8/2012 | Kra |
| 8,327,083 B2 | 12/2012 | Jacobs et al. |
| 8,364,933 B2 | 1/2013 | Herrenschmidt |
| 8,458,127 B1 | 6/2013 | Lorch, III |
| 8,489,800 B2 | 7/2013 | Tuch et al. |
| 8,595,435 B2 | 11/2013 | Cilfone |
| 8,640,008 B2 | 1/2014 | Schon et al. |
| 8,661,213 B2 | 2/2014 | Scales et al. |
| 8,850,557 B2 | 9/2014 | Boivie et al. |
| 8,880,801 B1 | 11/2014 | Robins |
| 9,037,785 B2 | 6/2015 | Driever et al. |
| 9,218,862 B1 | 12/2015 | Greiner |
| 9,250,902 B2 | 2/2016 | Farrell et al. |
| 9,298,642 B2 | 3/2016 | Kagan |
| 9,384,007 B2 | 7/2016 | Kang |
| 9,384,133 B2 | 7/2016 | Gschwind |
| 9,405,567 B2 | 8/2016 | Robenko et al. |
| 9,462,316 B2 | 10/2016 | Gladwin |
| 9,471,342 B2 | 10/2016 | Mitsugi et al. |
| 9,571,570 B1 | 2/2017 | Mutnuru |
| 9,621,427 B1 | 4/2017 | Shah |
| 9,767,028 B2 | 9/2017 | Cheng et al. |
| 9,774,684 B2 | 9/2017 | Dhuse |
| 9,842,207 B2 | 12/2017 | Cohn et al. |
| 9,846,540 B1 | 12/2017 | Franklin |
| 9,858,006 B1 | 1/2018 | Wu |
| 10,216,757 B1 | 2/2019 | Armangau |
| 2002/0087846 A1 | 7/2002 | Nickolls |
| 2002/0144080 A1 | 10/2002 | McGrath |
| 2003/0126387 A1 | 7/2003 | Watanabe |
| 2003/0140179 A1 | 7/2003 | Wilt et al. |
| 2003/0154223 A1 | 8/2003 | Henry |
| 2004/0010674 A1 | 1/2004 | Boyd et al. |
| 2004/0024989 A1 | 2/2004 | Chauvel |
| 2004/0064668 A1 | 4/2004 | Kjos et al. |
| 2004/0098545 A1 | 5/2004 | Pline |
| 2004/0187117 A1 | 9/2004 | Orion |
| 2005/0138338 A1 | 6/2005 | Sodani |
| 2005/0283649 A1 | 12/2005 | Turner |
| 2006/0026383 A1 | 2/2006 | Dinechin |
| 2006/0026407 A1 | 2/2006 | Chauvel |
| 2006/0036830 A1 | 2/2006 | Dinechin et al. |
| 2006/0174066 A1 | 8/2006 | Bridges et al. |
| 2006/0200647 A1 | 9/2006 | Cohen |
| 2007/0067590 A1 | 3/2007 | Savagaonkar et al. |
| 2007/0078901 A1 | 4/2007 | Satou |
| 2007/0112999 A1 | 5/2007 | Oney et al. |
| 2007/0220495 A1 | 9/2007 | Chen |
| 2007/0299887 A1 | 12/2007 | Novik |
| 2007/0299990 A1 | 12/2007 | Ben-Yehuda |
| 2008/0103736 A1 | 5/2008 | Chin |
| 2008/0109592 A1 | 5/2008 | Karamcheti |
| 2008/0126744 A1 | 5/2008 | Moyer |
| 2008/0172550 A1 | 7/2008 | Su |
| 2008/0229067 A1 | 9/2008 | Froemming et al. |
| 2009/0024902 A1 | 1/2009 | Jo et al. |
| 2009/0217056 A1 | 8/2009 | Malpani |
| 2009/0265293 A1 | 10/2009 | Nicholas |
| 2009/0307438 A1 | 12/2009 | Logan et al. |
| 2009/0307440 A1 | 12/2009 | Jacobs |
| 2009/0327619 A1 | 12/2009 | Cantin |
| 2010/0094955 A1 | 4/2010 | Zuckerman |
| 2010/0153638 A1 | 6/2010 | Yochai |
| 2010/0235321 A1 | 9/2010 | Shukla |
| 2011/0029711 A1 | 2/2011 | Dhuse |
| 2011/0029731 A1 | 2/2011 | Cilfone |
| 2011/0029809 A1 | 2/2011 | Dhuse |
| 2011/0040920 A1 | 2/2011 | Chou |
| 2011/0071988 A1 | 3/2011 | Resch |
| 2011/0072210 A1 | 3/2011 | Dhuse |
| 2011/0072321 A1 | 3/2011 | Dhuse |
| 2011/0078373 A1 | 3/2011 | Hoffman |
| 2011/0106904 A1 | 5/2011 | Resch |
| 2011/0125999 A1 | 5/2011 | Cilfone |
| 2011/0161666 A1 | 6/2011 | Gladwin |
| 2011/0184997 A1 | 7/2011 | Grube |
| 2011/0185141 A1 | 7/2011 | Dhuse |
| 2011/0225362 A1 | 9/2011 | Leggette |
| 2011/0225386 A1 | 9/2011 | Motwani |
| 2011/0228931 A1 | 9/2011 | Grube |
| 2011/0276744 A1 | 11/2011 | Sengupta |
| 2011/0295796 A1 | 12/2011 | Muhunthan |
| 2012/0072906 A1 | 3/2012 | Tsirkin |
| 2012/0089809 A1 | 4/2012 | Resch |
| 2012/0102316 A1 | 4/2012 | Resch |
| 2012/0117351 A1 | 5/2012 | Motwani |
| 2012/0137091 A1 | 5/2012 | Grube |
| 2012/0163596 A1 | 6/2012 | Grube |
| 2012/0166757 A1 | 6/2012 | Volvovski |
| 2012/0198197 A1 | 8/2012 | Gladwin |
| 2012/0215991 A1 | 8/2012 | Moyer |
| 2012/0221611 A1 | 8/2012 | Watanabe |
| 2012/0311068 A1 | 12/2012 | Gladwin |
| 2013/0086368 A1 | 4/2013 | Gschwind |
| 2013/0091568 A1 | 4/2013 | Sharif et al. |
| 2013/0173561 A1 | 7/2013 | Cherian |
| 2013/0198130 A1 | 8/2013 | Resch |
| 2013/0232307 A1 | 9/2013 | Clifone |
| 2013/0238900 A1 | 9/2013 | Leggette |
| 2013/0275545 A1 | 10/2013 | Baptist |
| 2013/0275699 A1 | 10/2013 | Cheriton |
| 2013/0275744 A1 | 10/2013 | Resch |
| 2013/0326264 A1 | 12/2013 | Resch |
| 2013/0339316 A1 | 12/2013 | Hirsch |
| 2013/0339420 A1 | 12/2013 | Srinivasan |
| 2013/0346716 A1 | 12/2013 | Resch |
| 2013/0346795 A1 | 12/2013 | Gladwin |
| 2014/0068259 A1 | 3/2014 | Resch |
| 2014/0074786 A1 | 3/2014 | Leggette |
| 2014/0075158 A1 | 3/2014 | Indukuru |
| 2014/0089602 A1* | 3/2014 | Biswas ............... G06F 12/0804 711/144 |
| 2014/0095847 A1 | 4/2014 | Orenstein |
| 2014/0122828 A1 | 5/2014 | Kagan et al. |
| 2014/0195875 A1 | 7/2014 | Resch |
| 2014/0236913 A1 | 8/2014 | Chakradhar |

(56) References Cited

U.S. PATENT DOCUMENTS

| | | |
|---|---|---|
| 2014/0281353 A1 | 9/2014 | Bybell |
| 2014/0281804 A1 | 9/2014 | Resch |
| 2014/0281817 A1 | 9/2014 | Grube |
| 2014/0283040 A1 | 9/2014 | Wilkerson |
| 2014/0325157 A1 | 10/2014 | Sangapu |
| 2014/0330923 A1 | 11/2014 | Baptist |
| 2014/0344227 A1 | 11/2014 | Grube |
| 2014/0344617 A1 | 11/2014 | Resch |
| 2014/0351457 A1 | 11/2014 | Baptist |
| 2015/0002522 A1 | 1/2015 | Nalluri |
| 2015/0006780 A1 | 1/2015 | Shao |
| 2015/0067087 A1 | 3/2015 | Guerin et al. |
| 2015/0089184 A1 | 3/2015 | Mukherjee et al. |
| 2015/0106566 A1 | 4/2015 | Godard et al. |
| 2015/0113326 A1 | 4/2015 | Talagala |
| 2015/0169238 A1 | 6/2015 | Lee |
| 2015/0242212 A1 | 8/2015 | Sudhakar |
| 2015/0248291 A1 | 9/2015 | Gschwind |
| 2015/0248554 A1 | 9/2015 | Dumitru |
| 2015/0268859 A1 | 9/2015 | Mori |
| 2015/0277869 A1 | 10/2015 | Gschwind |
| 2015/0277872 A1 | 10/2015 | Gschwind |
| 2015/0347440 A1 | 12/2015 | Habouzit |
| 2015/0356004 A1 | 12/2015 | Cordero |
| 2015/0370728 A1 | 12/2015 | Yamada |
| 2016/0004533 A1 | 1/2016 | Schuchman et al. |
| 2016/0019168 A1 | 1/2016 | Rychlik et al. |
| 2016/0062894 A1 | 3/2016 | Schwetman |
| 2016/0070652 A1 | 3/2016 | Sundararaman |
| 2016/0147555 A1 | 5/2016 | Hepkin |
| 2016/0162316 A1 | 6/2016 | King |
| 2016/0188253 A1 | 6/2016 | Resch |
| 2016/0224511 A1 | 8/2016 | Moudgill et al. |
| 2016/0232103 A1 | 8/2016 | Schmisseur |
| 2016/0246728 A1 | 8/2016 | Ron et al. |
| 2016/0247080 A1 | 8/2016 | Trantham et al. |
| 2016/0259735 A1 | 9/2016 | Evans |
| 2016/0335190 A1 | 11/2016 | Li |
| 2016/0364236 A1 | 12/2016 | Moudgill |
| 2016/0378678 A1 | 12/2016 | Lemay et al. |
| 2017/0031685 A1 | 2/2017 | Craske |
| 2017/0060422 A1 | 3/2017 | Sharifie |
| 2017/0090922 A1 | 3/2017 | Tu et al. |
| 2017/0123987 A1* | 5/2017 | Cheng ................. G06F 15/7821 |
| 2017/0153942 A1 | 6/2017 | Cabral |
| 2017/0161195 A1 | 6/2017 | Henry et al. |
| 2017/0177364 A1 | 6/2017 | Ould-Ahmed-Vall |
| 2017/0293558 A1* | 10/2017 | Guthrie ............... G06F 12/0811 |
| 2017/0353580 A1 | 12/2017 | Horan |
| 2018/0032721 A1 | 2/2018 | De |
| 2018/0067866 A1 | 3/2018 | Shanbhogue |
| 2018/0107397 A1 | 4/2018 | Gray |
| 2018/0107431 A1 | 4/2018 | Resch |
| 2018/0232254 A1 | 8/2018 | Mohan |
| 2018/0253328 A1 | 9/2018 | Tsirkin |
| 2018/0322090 A1 | 11/2018 | Tamir |
| 2018/0373459 A1 | 12/2018 | Resch |
| 2019/0347045 A1 | 11/2019 | Gschwind |

FOREIGN PATENT DOCUMENTS

| | | |
|---|---|---|
| JP | 2727887 B2 | 10/2005 |
| JP | 3727887 B2 | 10/2005 |
| JP | 02037431 | 2/2009 |
| WO | WO2015121713 A1 | 8/2015 |

OTHER PUBLICATIONS

Anonymous, "Collaborative Scheduling," IP.com No. IPCOM000240244D, Jan. 15, 2015, pp. 1-7 (+ cover).

Anonymous, "Cooperative Active memory Sharing Across OS's in a Virtualized Environment," Jun. 19, 2012, pp. 1-2 (+ cover).

Anonymous, "Method and System for Automated Structuring of Interior Pins of Bus for Better Timing and Hierarchical Wire Management," IP.com No. IPCOM000227750D, May 14, 2013, pp. 1-4 (+ cover).

Anonymous, "Method and System for Controlling Memory Ballooning," IP.com No. IPCOM000196692D, Jun. 11, 2010, pp. 1-5 (+ cover).

Holey, Anup Purushottam et al., "Enhancing CPU Programmability and Correctness Through Transactional Execution," Jan. 2015, pp. 1-136.

Hoozemans, Joost J., "Porting Linux to the p-VEX Reconfigurable VLIW Softcore," pp. i-xiv, 1-88 (+ cover sheets), 2014.

IBM, "Kernel Virtual Machine (KVM)—Best Practices for KVM," Second Edition, Apr. 2012, pp. 1-41 (+ cover and pp. i-iv).

IBM, "Power ISA—V2.07B," Apr. 9, 2016, pp. 1-1527.

IBM, "Storing Multiple Under-Utilized Cache Blocks in One Physical Cache Line," IP.com No. IPCOM000143550D, Nov. 28, 2006, pp. 1-5 (+cover).

IBM, "Tracing Hypervisor Activity," IP.com No. IPCOM000013470D, Jun. 2013, pp. 1-3 (+ cover).

IBM, "Wiring SPR Out to Hardware In-Memory Trace for a Programmable Software Trace Capability," IP.com No. IPCOM000124721D, May 2005, p. 1 ( + cover).

IBM, "z/Architecture—Principles of Operation," IBM Publication No. SA22-7832-10, Eleventh Edition, Mar. 2015, pp. 1-1732.

Mel, Peter and Tim Grance, "The NIST Definition of Cloud Computing," National Institute of Standards and Technology, Information Technology Laboratory, Special Publication 800-145, Sep. 2011, pp. 1-7.

Rosenblum, Nathan E., et al., "Virtual Machine-Provided Context Sensitive Page Mappings," Proceedings of the $4^{th}$ International Conference on Virtual Execution Environments, Mar. 2008, pp. 1-9.

Soares, Livio et al., "FlexSC: Flexible System Call Scheduling with Exception-Less System Calls," 9th USENIX Symposium on Operating Systems Design and Implementation, Oct. 2010, pp. 33-46.

Yeh, Chiang et al., "Software Method for Controlling Hardware Peripherals From Inside a Virtual Machine," IP.com No. IPCOM000244215D, Nov. 24, 2015, pp. 1-2 (+ cover).

Gschwind, Michael K. et al., "Separation of Memory-Based Configuration State Registers Based on Groups," U.S. Appl. No. 15/812,319, filed Nov. 14, 2017, pp. 1-123.

Gschwind, Michael K. et al., "Bulk Store and Load Operations of Configuration State Registers," U.S. Appl. No. 15/811,982, filed Nov. 14, 2017, pp. 1-123.

Gschwind, Michael K. et al., "Single Call to Perform Pin and Unpin Operations," U.S. Appl. No. 15/812,024, filed Nov. 14, 2017, pp. 1-122.

Gschwind, Michael K. et al., "Memory Based Configuration State Registers," U.S. Appl. No. 15/812,344, filed Nov. 14, 2017, pp. 1-125.

Gschwind, Michael K. et al., "Portions of Configuration State Registers In-Memory," U.S. Appl. No. 15/812,277, filed Nov. 14, 2017, pp. 1-125.

Gschwind, Michael K. et al., "Configurable Architectural Placement Control," U.S. Appl. No. 15/812,297, filed Nov. 14, 2017, pp. 1-121.

Gschwind, Michael K. et al., "Address Translation Prior to Receiving a Storage Reference Using the Address to Be Translated," U.S. Appl. No. 15/812,403, filed Nov. 14, 2017, pp. 1-121.

Gschwind, Michael K. et al., "Automatic Pinning of Units of Memory," U.S. Appl. No. 15/812,228, filed Nov. 14, 2017, pp. 1-122.

Gschwind, Michael K. et al., "Configuration State Registers Grouped Based on Functional Affinity," U.S. Appl. No. 15/811,943, filed Nov. 14, 2017, pp. 1-123.

Gschwind, Michael K. et al., "Context Switch by Changing Memory Pointers," U.S. Appl. No. 15/812,034, filed Nov. 14, 2017, pp. 1-123.

List of IBM Patents or Patent Applications Treated as Related, May 2018, 2 pages.

Hoozemans, Joost J., "Porting Linux to the p-VEX Reconfigurable VLIW Softcore," pp. i-xiv, 1-88 (+ cover sheets)), 2014 (no further date information available).

(56) References Cited

OTHER PUBLICATIONS

Anonymous, "Method and System for Controlling Memory Ballooning," IP.com No. IPCOM000196692D, Jun. 2010, pp. 1-5 (+ cover).
Gschwind, Michael K. et al., "Portions of Configuration State Registers In-Memory," U.S. Appl. No. 16/519,121, filed Jul. 23, 2019, pp. 1-125.
List of IBM Patents or Patent Applications Treated as Related, Jul. 25, 2019, 2 pages.
Gschwind, Michael K. et al., "Context Switch Changing Memory Pointers," U.S. Appl. No. 16/542,607, filed Aug. 16, 2019, pp. 1-123.
Gschwind, Michael K. et al., "Protecting In-Memory Configuration State Registers," U.S. Appl. No. 16/546,945, filed Aug. 21, 2019, pp. 1-124.
Gschwind, Michael K. et al., "Automatic Pinning of Units of Memory," U.S. Appl. No. 16/576,014, filed Sep. 19, 2019, pp. 1-123.
List of IBM Patents or Patent Applications Treated As Related, Dec. 20, 2019, 2 pages.

* cited by examiner

1500

| | |
|---|---|
| | - |
| 13 | AMR |
| | - |
| 128 | TFHAR4 |
| 129 | TFIAR4 |
| 130 | TEXASR4 |
| 131 | TEXASRU4 |
| | - |
| 136 | CTRL |
| | - |
| 256 | VRSAVE |
| | - |
| 259 | SPRG3 |
| | - |
| 268 | TB2 |
| 269 | TBU2 |
| | - |
| 768 | SIER |
| 769 | MMCR2 |
| 770 | MMCRA |
| 771 | PMC1 |
| 772 | PMC2 |
| 773 | PMC3 |
| 774 | PMC4 |
| 775 | PMC5 |
| 776 | PMC6 |

| | |
|---|---|
| | - |
| 779 | MMCR0 |
| 780 | SIAR |
| 781 | SDAR |
| 782 | MMCR1 |
| | - |
| 800 | BESCRS |
| 801 | BESCRSU |
| 802 | BESCRR |
| 803 | BESCRRU |
| 804 | EBBHR |
| 805 | EBBRR |
| 806 | BESCR |
| | - |
| 808 | reserved3 |
| 809 | reserved3 |
| 810 | reserved3 |
| 811 | reserved3 |
| | - |
| 813 | LMRR |
| 814 | LMSER |
| 815 | TAR |
| | - |
| 896 | PPR10 |
| | - |
| 898 | PPR32 |

FIG. 15B

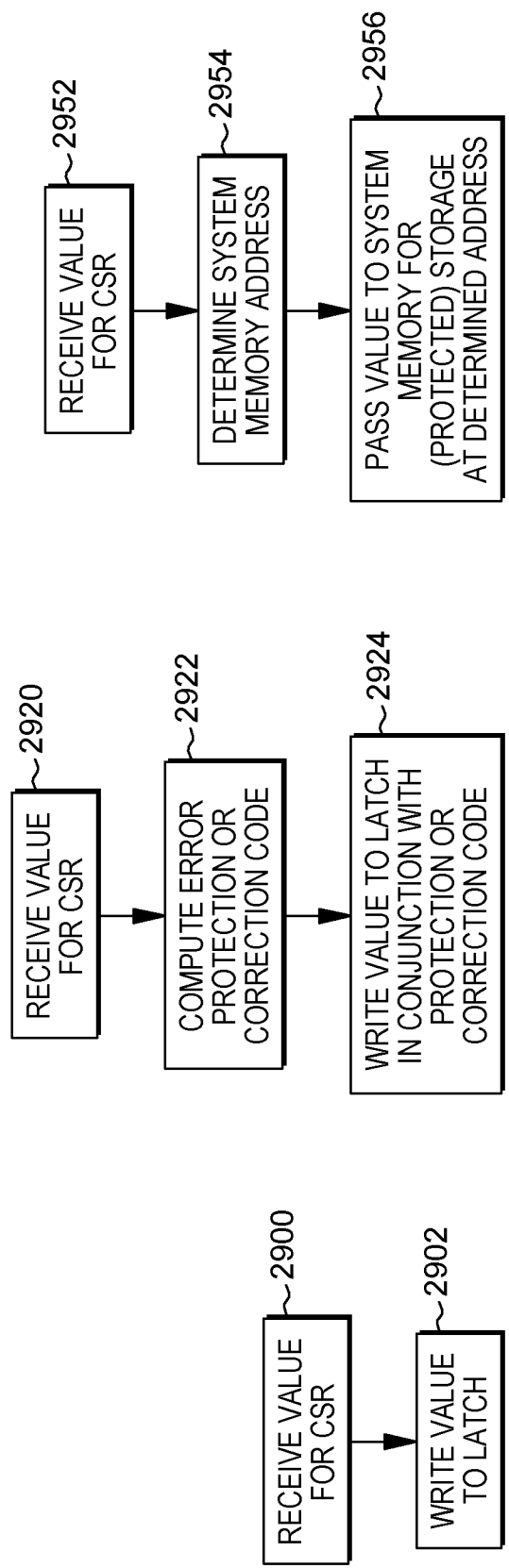

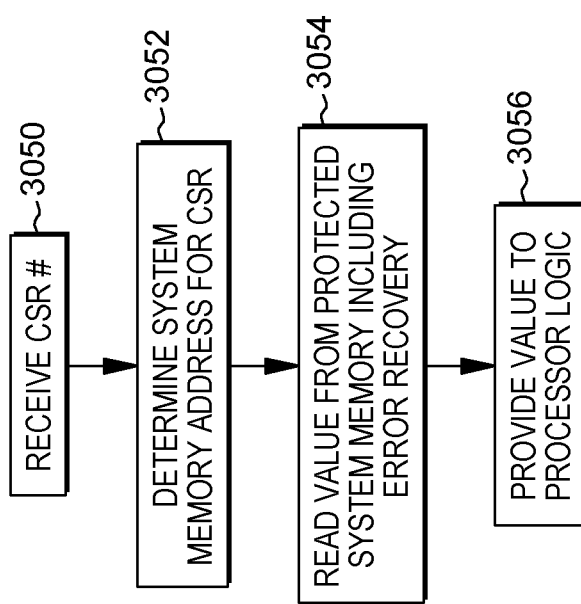
FIG. 30C
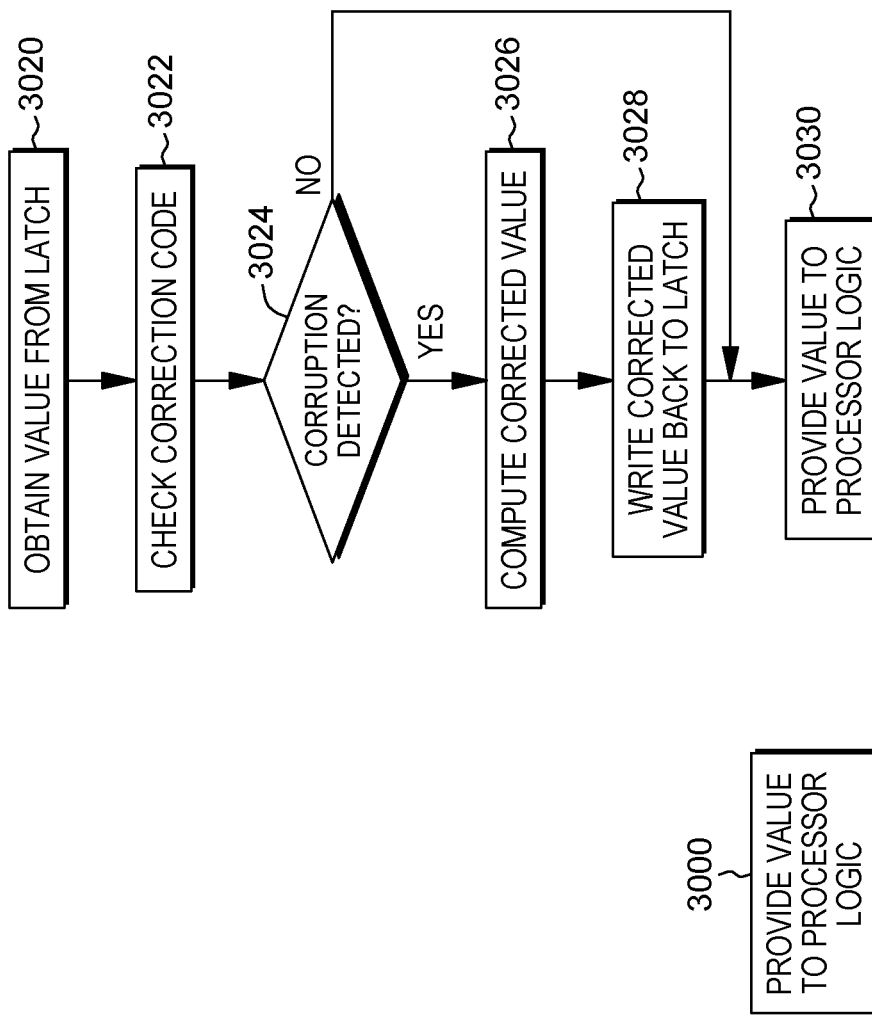
FIG. 30B
FIG. 30A

OBTAIN A REQUEST TO ACCESS AN IN-MEMORY CONFIGURATION STATE REGISTER ~3100

THE IN-MEMORY CONFIGURATION STATE REGISTER BEING MAPPED TO MEMORY ~3102

USE ERROR CORRECTION CODE OF THE MEMORY TO PROTECT THE ACCESS TO THE IN-MEMORY CONFIGURATION STATE REGISTER ~3104

THE REQUEST IS A WRITE REQUEST AND INCLUDES A VALUE TO BE STORED IN THE IN-MEMORY CONFIGURATION STATE REGISTER ~3106

DETERMINE A MEMORY ADDRESS FOR A UNIT OF MEMORY STORING THE IN-MEMORY CONFIGURATION STATE REGISTER ~3108

STORE THE VALUE AT THE MEMORY ADDRESS ~3110

THE STORING THE VALUE INCLUDES COMPUTING AN ERROR CORRECTION CODE FOR THE VALUE, THE VALUE BEING A RECEIVED IN-MEMORY CONFIGURATION STATE REGISTER VALUE ~3112          ~3114

STORING THE COMPUTED ERROR CORRECTION CODE IN CONJUNCTION WITH THE RECEIVED IN-MEMORY CONFIGURATION STATE REGISTER VALUE ~3116

FIG. 31A

THE REQUEST IS A READ REQUEST THAT INCLUDES AN INDICATION OF THE IN-MEMORY CONFIGURATION STATE REGISTER FROM WHICH DATA IS TO BE READ —3120

DETERMINE, BASED ON THE INDICATION OF THE IN-MEMORY CONFIGURATION STATE REGISTER, A MEMORY ADDRESS FROM WHICH THE DATA IS TO BE OBTAINED —3122

READ THE DATA FROM THE MEMORY ADDRESS —3124

DETERMINE, AT LEAST IN PART BY USING THE ERROR CORRECTION CODE, WHETHER CORRUPTION HAS OCCURRED, IN WHICH THE DATA IS CORRUPTED —3126

PERFORM ONE OR MORE ACTIONS BASED ON DETERMINING THE DATA IS CORRUPTED —3128

THE ONE OR MORE ACTIONS INCLUDE PERFORMING RECOVERY —3130

THE RECOVERY INCLUDES COMPUTING A CORRECTED VALUE FOR THE CORRUPTED DATA USING THE ERROR CORRECTION CODE —3132

FIG. 31B

PROTECTING IN-MEMORY CONFIGURATION STATE REGISTERS

BACKGROUND

One or more aspects relate, in general, to processing within a computing environment, and in particular, to facilitating such processing.

Computers of a computing environment include central processing units (CPUs) or processors that control processing within the computers. Behavior of a central processing unit is controlled by control registers. Control registers are processor registers that perform particular tasks, such as interrupt control, switching the addressing mode, paging control and/or coprocessor control, as examples.

Control registers are typically implemented as latches, such as solid state elements directly on a processor chip. Some computers use a large number of control registers, as defined by the architectural implementation of the computers. Thus, control registers represent a growing area of the chip.

Moreover, some computers support multi-threading in which a central processing unit can execute multiple processes or threads concurrently. Each thread uses a separate set of control registers; thereby, increasing the number of control registers on a chip.

An increasing number of latch-based control registers may affect performance, chip area and/or power consumption. For instance, control registers are switched during context switches, and thus, an increase in the number of control registers, increases the cost of context switching. Further, with latch-based control registers, updates to controls occur in program order, which may also affect performance.

Different architectures may have different names for control registers. For instance, in the Power Architecture offered by International Business Machines Corporation, Armonk, N.Y., the control registers are referred to as special purpose register (SPRs). Other architectures may use other names. The use of control registers herein includes control registers of other names, including, for instance, SPRs, as well as others.

SUMMARY

Shortcomings of the prior art are overcome and additional advantages are provided through the provision of a computer program product for facilitating processing within a computing environment. The computer program product includes a computer readable storage medium readable by a processing circuit and storing instructions for performing a method. The method includes, for instance, obtaining a request to access an in-memory configuration state register. The in-memory configuration state register is mapped to memory, and error correction code of the memory is used to protect the access to the in-memory configuration state register. By storing the configuration state register in memory, protections of the memory are afforded, thereby improving reliability and performance.

As one example, the request is a write request and includes a value to be stored in the in-memory configuration state register. In one embodiment, a determination is made of a memory address for a unit of memory storing the in-memory configuration state register, and the value is stored at the memory address.

Further, in one aspect, the storing the value includes computing an error correction code for the value. The value is a received in-memory configuration state register value, and the computed error correction code is stored in conjunction with the received in-memory configuration state register value.

As another example, the request is a read request that includes an indication of the in-memory configuration state register from which data is to be read. Based on the indication of the in-memory configuration state register, a memory address from which the data is to be obtained is determined. The data is read from the memory address.

In one aspect, a determination is made, at least in part by using the error correction code, as to whether corruption has occurred, in which the data is corrupted. Based on determining the data is corrupted, one or more actions are performed. The one or more actions include, for example, performing recovery. The recovery includes, for instance, computing a corrected value for the corrupted data using the error correction code.

Computer-implemented methods and systems relating to one or more aspects are also described and claimed herein. Further, services relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIGS. 15A-15B depict one example of linear mapping of configuration state registers, in accordance with an aspect of the present invention;

FIGS. 29A-29C provide various examples of a data write, in accordance with one or more aspects of the present invention;

FIGS. 30A-30C provide various examples of a data read, in accordance with one or more aspects of the present invention;

FIGS. 31A-31B depict one embodiment of facilitating processing within a computing environment, in accordance with an aspect of the present invention;

DETAILED DESCRIPTION

Figure 1A:
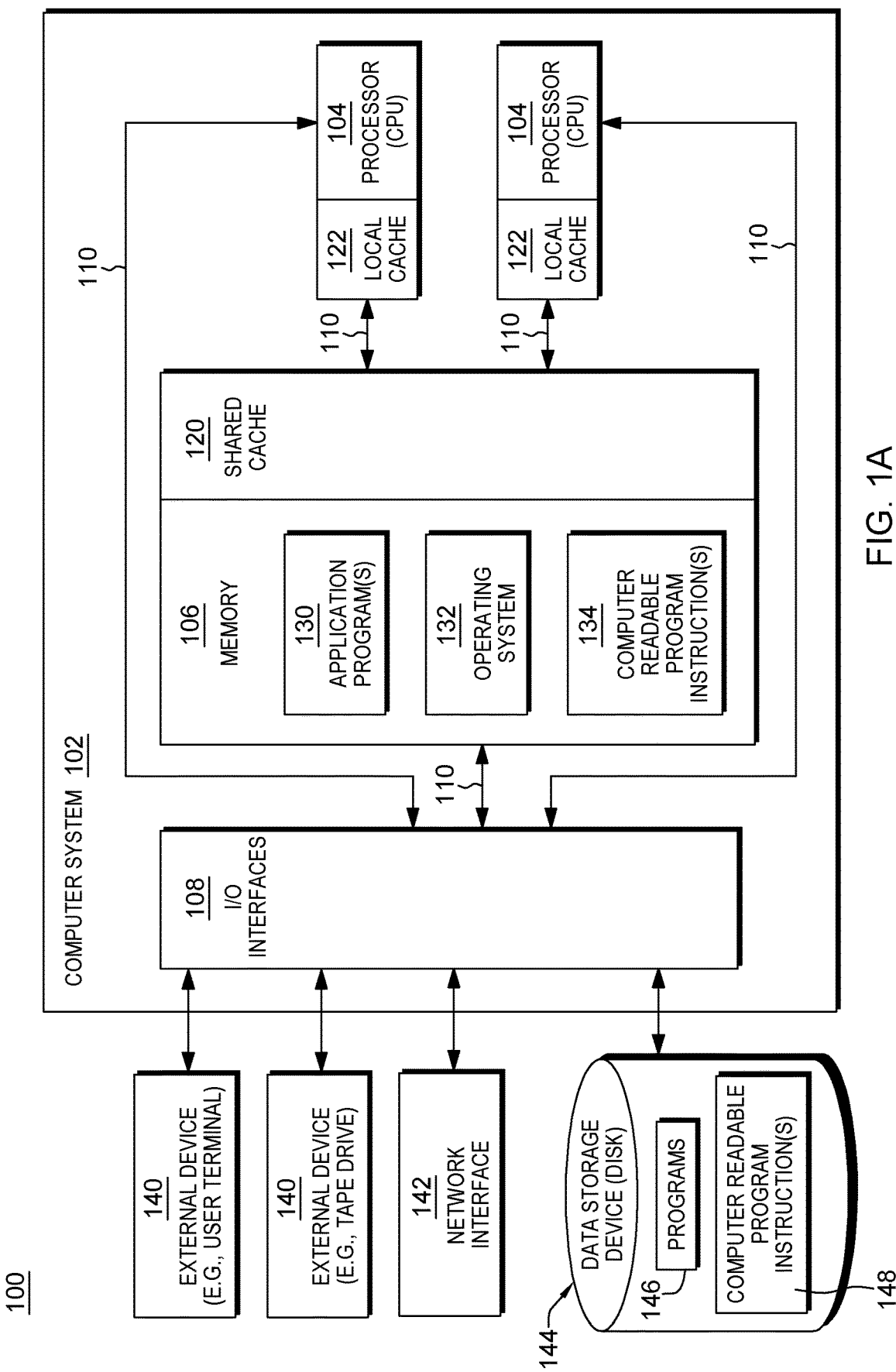
FIG. 1A depicts one example of a computing environment to incorporate and use one or more aspects of the present invention.

In accordance with an aspect of the present invention, various configuration state registers are provided in-memory rather than in-processor. As used herein, the term "configuration state register" includes control registers; machine state registers (MSRs), such as a program status word (PSW) or other machine state registers; status registers (e.g., floating point status control register); special purpose register (SPRs); configuration registers; and/or other registers that configure operations, e.g., of instructions.

Selected configuration state registers (or portions thereof in a further aspect) are provided in-memory, in which those registers are mapped to system memory and are included in the memory hierarchy which is coupled to, but separate from, the processor. The memory hierarchy includes, for instance, load/store queues, one or more memory caches, and system memory (also referred to herein as main memory, central storage, storage, main storage, memory). By being in-memory, instead of in-processor, the registers are accessed by using a memory address, and access requests may be re-ordered or speculatively processed. In contrast, access requests for configuration state registers that are in-processor are not processed out-of-order or speculatively. In-processor configuration state registers are implemented as, for instance, solid state elements (such as latches), e.g., directly on-chip. On-chip denotes or relates to circuitry included in a single integrated circuit or in the same integrated circuit as a given device.

Based on the configuration state registers being stored in system memory, certain instructions, such as a move to configuration state register instruction (e.g., move to SPR (mtspr) instruction) and a move from configuration state register instruction (e.g., move from SPR (mfspr) instruction), are replaced by load and store instructions or operations by instruction decode logic. The load and store instructions/operations that are generated are committed to store queues, and typical load and store processing are performed.

As one example, a storage area to include the configuration state registers is defined by the operating system and/or a hypervisor and set aside for storing memory-based registers. In one embodiment, a physical memory region is architecturally specified (e.g., the first or last n pages of physical memory).

In a further aspect, one or more portions of a configuration state register are provided in-memory, while one or more other portions of the configuration state register are provided in-processor. In one example, the portions provided in-memory are those used less frequently.

In yet a further aspect, a remapping of configuration state registers is provided such that configuration state registers (or at least portions thereof) that are typically used together, are placed in memory together (e.g., in a single cache line or adjacent cache lines) to improve processing performance.

Further, in another aspect, instructions or operations are provided to perform a bulk store or load of multiple configuration state registers. This is to facilitate, for instance, context switching, improving performance thereof.

Yet further, in one aspect, processing is facilitated and performance is improved by defining a set of controls to identify where in memory the configuration state registers are stored.

In a further aspect, efficiencies are achieved during context switching by manipulating memory pointers of in-memory configuration state registers. The pointers are manipulated, rather than copying the old configuration data. This improves processing within the computing environment by increasing the speed and reducing complexity during context switches.

Moreover, in another aspect, based on executing an instruction that loads an address to be used as a base address, address translation is automatically performed in order to avoid a potential page fault later on in processing of the instruction.

In yet a further aspect, configuration state registers are segregated by context or group (e.g., hypervisor, operating system, process, thread) to facilitate processing by increasing management flexibility.

As a further aspect, an indication of automatic pinning for an initialized memory backing state is provided.

Yet further, in another aspect, pinning of memory pages is efficiently managed using paravirtualized pinning calls.

Even further, in one aspect, system memory is protected against single event upsets.

Various aspects are described herein. Further, many variations are possible without departing from a spirit of aspects of the present invention. It should be noted that, unless otherwise inconsistent, each aspect or feature described herein and variants thereof may be combinable with any other aspect or feature.

One embodiment of a computing environment to incorporate and use one or more aspects of the present invention is described with reference to FIG. 1A. In one example, the computing environment is based on the z/Architecture, offered by International Business Machines Corporation, Armonk, N.Y. One embodiment of the z/Architecture is described in "z/Architecture Principles of Operation," IBM Publication No. SA22-7832-10, March 2015, which is hereby incorporated herein by reference in its entirety. Z/ARCHITECTURE is a registered trademark of International Business Machines Corporation, Armonk, N.Y., USA.

In another example, the computing environment is based on the Power Architecture, offered by International Business Machines Corporation, Armonk, N.Y. One embodiment of the Power Architecture is described in "Power ISA™ Version 2.07B," International Business Machines Corporation, Apr. 9, 2015, which is hereby incorporated herein by reference in its entirety. POWER ARCHITECTURE is a registered trademark of International Business Machines Corporation, Armonk, N.Y., USA.

The computing environment may also be based on other architectures, including, but not limited to, the Intel x86 architectures. Other examples also exist.

As shown in FIG. 1A, a computing environment 100 includes, for instance, a computer system 102 shown, e.g., in the form of a general-purpose computing device. Computer system 102 may include, but is not limited to, one or more processors or processing units 104 (e.g., central processing units (CPUs)), a memory 106 (a.k.a., system memory, main memory, main storage, central storage or storage, as examples), and one or more input/output (I/O) interfaces 108, coupled to one another via one or more buses and/or other connections 110.

Bus 110 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI).

Memory 106 may include, for instance, a cache 120, such as a shared cache, which may be coupled to local caches 122 of processors 104. Further, memory 106 may include one or more programs or applications 130, an operating system 132, and one or more computer readable program instructions 134. Computer readable program instructions 134 may be configured to carry out functions of embodiments of aspects of the invention.

Computer system 102 may also communicate via, e.g., I/O interfaces 108 with one or more external devices 140, one or more network interfaces 142, and/or one or more data storage devices 144. Example external devices include a user terminal, a tape drive, a pointing device, a display, etc. Network interface 142 enables computer system 102 to communicate with one or more networks, such as a local area network (LAN), a general wide area network (WAN), and/or a public network (e.g., the Internet), providing communication with other computing devices or systems.

Data storage device 144 may store one or more programs 146, one or more computer readable program instructions 148, and/or data, etc. The computer readable program instructions may be configured to carry out functions of embodiments of aspects of the invention.

Computer system 102 may include and/or be coupled to removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media. It should be understood that other hardware and/or software components could be used in conjunction with computer system 102. Examples, include, but are not limited to: microcode, device drivers, redundant processing units, external disk drive arrays, RAID systems, tape drives, and data archival storage systems, etc.

Computer system 102 may be operational with numerous other general purpose or special purpose computing system environments or configurations. Examples of well-known computing systems, environments, and/or configurations that may be suitable for use with computer system 102 include, but are not limited to, personal computer (PC) systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Figure 1B:
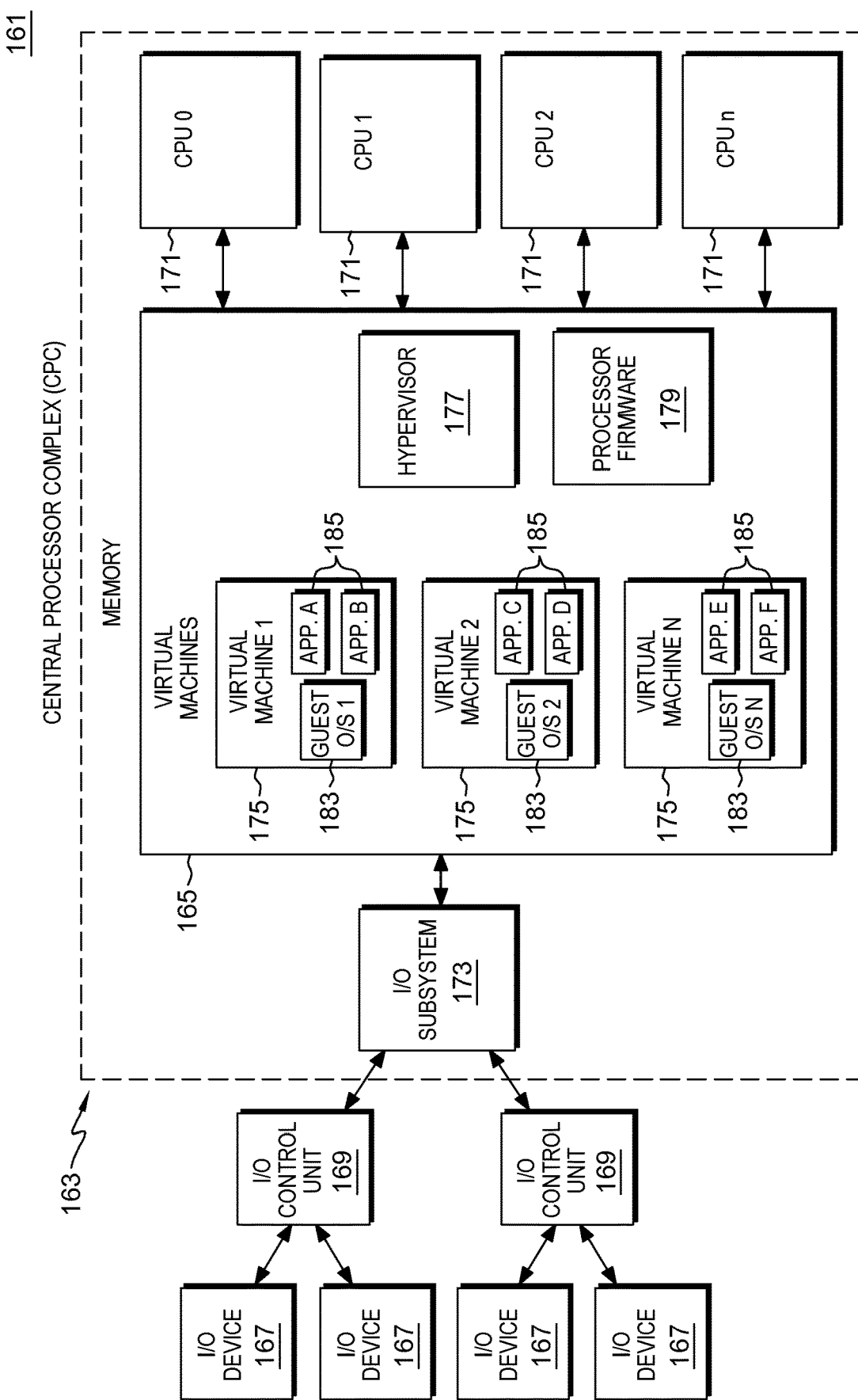
FIG. 1B depicts another example of a computing environment to incorporate and use one or more aspects of the present invention.

In another embodiment, the computing environment supports virtual machines. One example of such an environment is described with reference to FIG. 1B. In one example, a computing environment 161 includes a central processor complex (CPC) 163 providing virtual machine support. CPC 163 is coupled to one or more input/output (I/O) devices 167 via one or more control units 169. Central processor complex 163 includes, for instance, a memory 165 (a.k.a., system memory, main memory, main storage, central storage, storage) coupled to one or more processors (a.k.a., central processing units (CPUs)) 171, and an input/output subsystem 173, each of which is described below.

Memory 165 includes, for example, one or more virtual machines 175, a virtual machine manager, such as a hypervisor 177, that manages the virtual machines, and processor firmware 179. One example of hypervisor 177 is z/VM, offered by International Business Machines Corporation, Armonk, N.Y. The hypervisor is sometimes referred to as a host. Further, as used herein, firmware includes, e.g., the microcode of the processor. It includes, for instance, the hardware-level instructions and/or data structures used in implementation of higher level machine code. In one embodiment, it includes, for instance, proprietary code that is typically delivered as microcode that includes trusted software or microcode specific to the underlying hardware and controls operating system access to the system hardware.

The virtual machine support of the CPC provides the ability to operate large numbers of virtual machines 175, each capable of operating with different programs 185 and running a guest operating system 183, such as Linux. Each virtual machine 175 is capable of functioning as a separate system. That is, each virtual machine can be independently reset, run a guest operating system, and operate with different programs. An operating system or application program running in a virtual machine appears to have access to a full and complete system, but in reality, only a portion of it is available.

Memory 165 is coupled to processors (e.g., CPUs) 171, which are physical processor resources assignable to virtual machines. For instance, virtual machine 175 includes one or more logical processors, each of which represents all or a share of a physical processor resource 171 that may be dynamically allocated to the virtual machine.

Further, memory 165 is coupled to an I/O subsystem 173. Input/output subsystem 173 directs the flow of information between input/output control units 169 and devices 167 and main storage 165. It is coupled to the central processing complex, in that it can be a part of the central processing complex or separate therefrom.

Figure 1C:
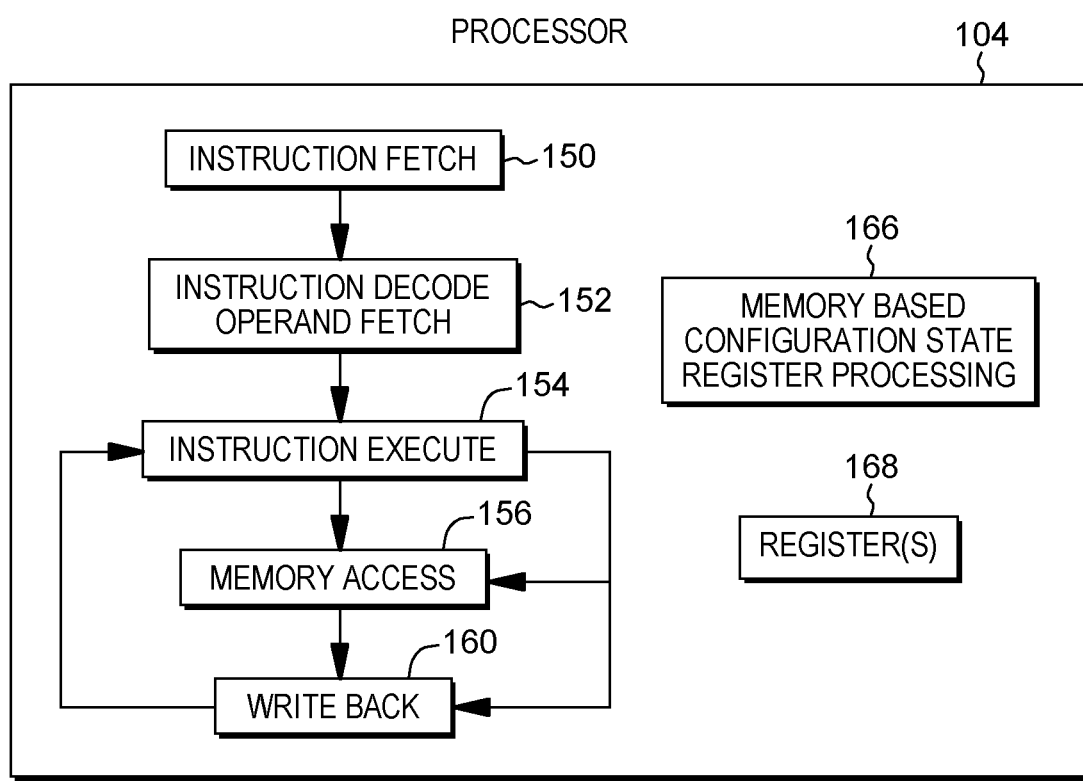
FIG. 1C depicts further details of a processor of FIG. 1A or FIG. 1B, in accordance with one or more aspects of the present invention.

Further details regarding one example of a processor, such as processor 104 (or processor 171), are described with reference to FIG. 1C. A processor, such as processor 104 (or processor 171), includes a plurality of functional components used to execute instructions. These functional components include, for instance, an instruction fetch component 150 to fetch instructions to be executed; an instruction decode unit 152 to decode the fetched instructions and to obtain operands of the decoded instructions; instruction execution components 154 to execute the decoded instructions; a memory access component 156 to access memory for instruction execution, if necessary; and a write back component 160 to provide the results of the executed instructions. One or more of these components may, in accordance with an aspect of the present invention, be used to execute one or more instructions and/or operations associated with memory-based configuration state register processing 166.

Processor 104 (or processor 171) also includes, in one embodiment, one or more registers 168 to be used by one or more of the functional components. Processor 104 (or processor 171) may include additional, fewer and/or other components than the examples provided herein.

Further details regarding an execution pipeline of a processor, such as processor 104 or processor 171, are described with reference to FIG. 1D. Although various processing stages of the pipeline are depicted and described herein, it will be understood that additional, fewer and/or other stages may be used without departing from the spirit of aspects of the invention.

Figure 1D:
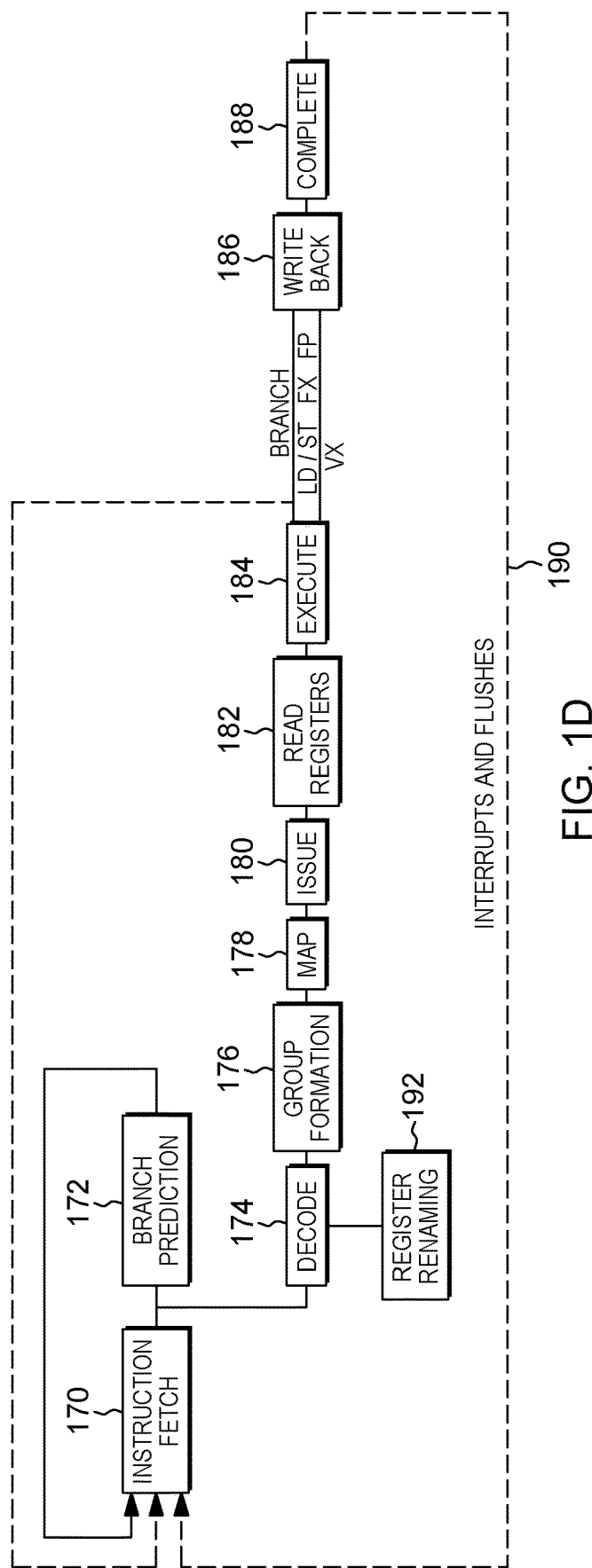
FIG. 1D depicts further details of one example of an instruction execution pipeline used in accordance with one or more aspects of the present invention.

Referring to FIG. 1D, in one embodiment, an instruction is fetched 170 from an instruction queue, and branch prediction 172 and/or decoding 174 of the instruction may be performed. The decoded instruction may be added to a group of instructions 176 to be processed together. The grouped instructions are provided to a mapper 178 that determines any dependencies, assigns resources and dispatches the group of instructions/operations to the appropriate issue queues. There are one or more issue queues for the different types of execution units, including, as examples, branch, load/store, floating point, fixed point, vector, etc. During an issue stage 180, an instruction/operation is issued to the appropriate execution unit. Any registers are read 182 to retrieve its sources, and the instruction/operation executes during an execute stage 184. As indicated, the execution may be for a branch, a load (LD) or a store (ST), a fixed point operation (FX), a floating point operation (FP), or a vector operation (VX), as examples. Any results are written to the appropriate register(s) during a write back stage 186. Subsequently, the instruction completes 188. If there is an interruption or flush 190, processing may return to instruction fetch 170.

Further, in one example, coupled to the decode unit is a register renaming unit 192, which may be used in the saving/restoring of registers.

Figure 1E:
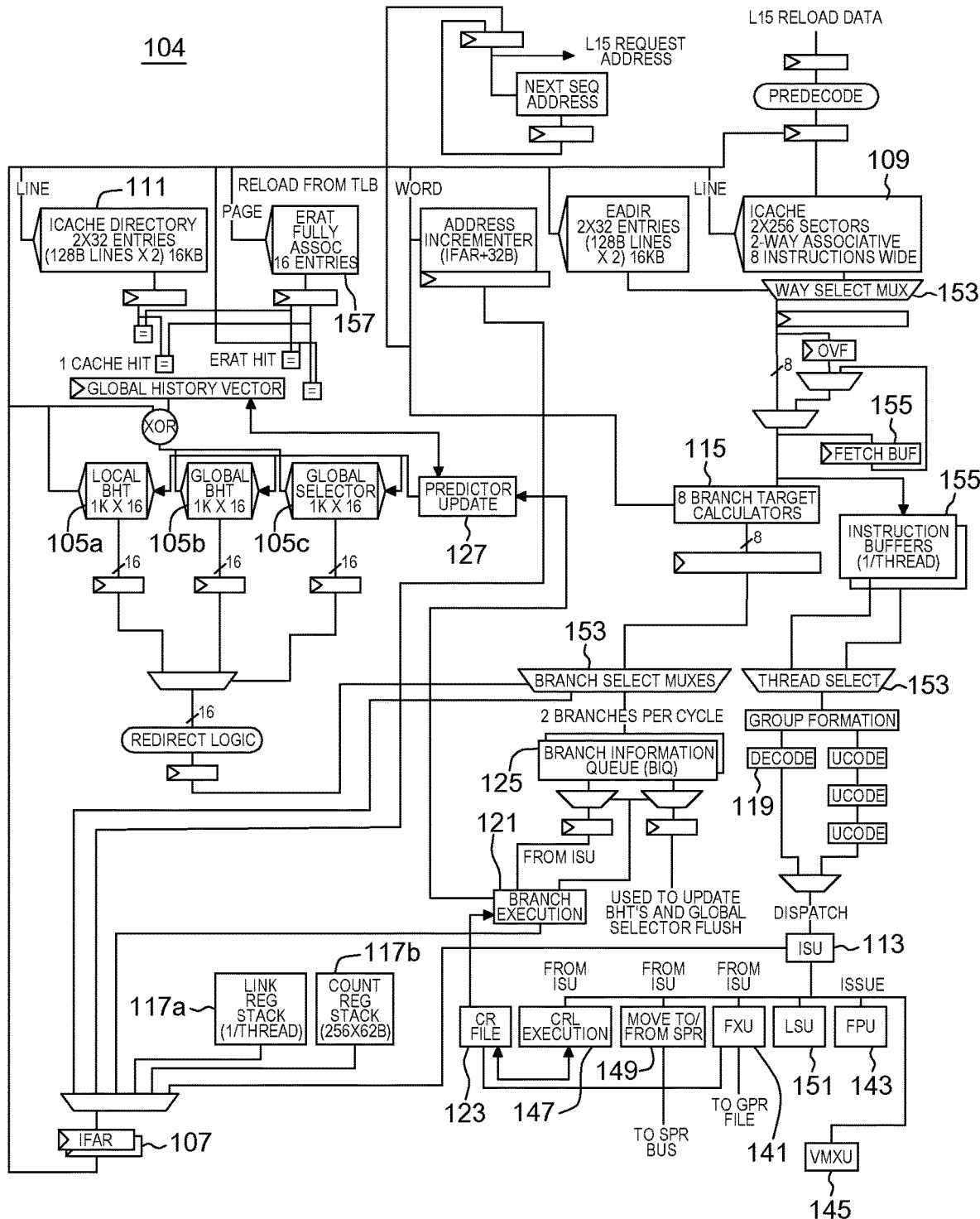
FIG. 1E depicts further details of one example of a processor, in accordance with an aspect of the present invention.

Additional details regarding a processor are described with reference to FIG. 1E. In one example, a processor, such as processor 104 (or processor 171), is a pipelined processor that may include prediction hardware, registers, caches, decoders, an instruction sequencing unit, and instruction execution units, as examples. The prediction hardware includes, for instance, a local branch history table (BHT) 105a, a global branch history table (BHT) 105b, and a global selector 105c. The prediction hardware is accessed through an instruction fetch address register (IFAR) 107, which has the address for the next instruction fetch.

The same address is also provided to an instruction cache 109, which may fetch a plurality of instructions referred to as a "fetch group". Associated with instruction cache 109 is a directory 111.

The cache and prediction hardware are accessed at approximately the same time with the same address. If the prediction hardware has prediction information available for an instruction in the fetch group, that prediction is forwarded to an instruction sequencing unit (ISU) 113, which, in turn, issues instructions to execution units for execution. The prediction may be used to update IFAR 107 in conjunction with branch target calculation 115 and branch target prediction hardware (such as a link register prediction stack 117a and a count register stack 117b). If no prediction information is available, but one or more instruction decoders 119 find a branch instruction in the fetch group, a prediction is created for that fetch group. Predicted branches are stored in the prediction hardware, such as in a branch information queue (BIQ) 125, and forwarded to ISU 113.

A branch execution unit (BRU) 121 operates in response to instructions issued to it by ISU 113. BRU 121 has read access to a condition register (CR) file 123. Branch execution unit 121 further has access to information stored by the branch scan logic in branch information queue 125 to determine the success of a branch prediction, and is operatively coupled to instruction fetch address register(s) (IFAR) 107 corresponding to the one or more threads supported by the microprocessor. In accordance with at least one embodiment, BIQ entries are associated with, and identified by an identifier, e.g., by a branch tag, BTAG. When a branch associated with a BIQ entry is completed, it is so marked. BIQ entries are maintained in a queue, and the oldest queue entries are de-allocated sequentially when they are marked as containing information associated with a completed branch. BRU 121 is further operatively coupled to cause a predictor update when BRU 121 discovers a branch misprediction.

When the instruction is executed, BRU 121 detects if the prediction is wrong. If so, the prediction is to be updated. For this purpose, the processor also includes predictor update logic 127. Predictor update logic 127 is responsive to an update indication from branch execution unit 121 and configured to update array entries in one or more of the local BHT 105a, global BHT 105b, and global selector 105c. The predictor hardware 105a, 105b, and 105c may have write ports distinct from the read ports used by the instruction fetch and prediction operation, or a single read/write port may be shared. Predictor update logic 127 may further be operatively coupled to link stack 117a and count register stack 117b.

Referring now to condition register file (CRF) 123, CRF 123 is read-accessible by BRU 121 and can be written to by the execution units, including but not limited to, a fixed point unit (FXU) 141, a floating point unit (FPU) 143, and a vector multimedia extension unit (VMXU) 145. A condition register logic execution unit (CRL execution) 147 (also referred to as the CRU), and special purpose register (SPR) handling logic 149 have read and write access to condition register file (CRF) 123. CRU 147 performs logical operations on the condition registers stored in CRF file 123. FXU 141 is able to perform write updates to CRF 123.

Processor 104 (or processor 171) further includes, a load/store unit 151, and various multiplexors 153 and buffers 155, as well as address translation tables 157, and other circuitry.

Figure 2:
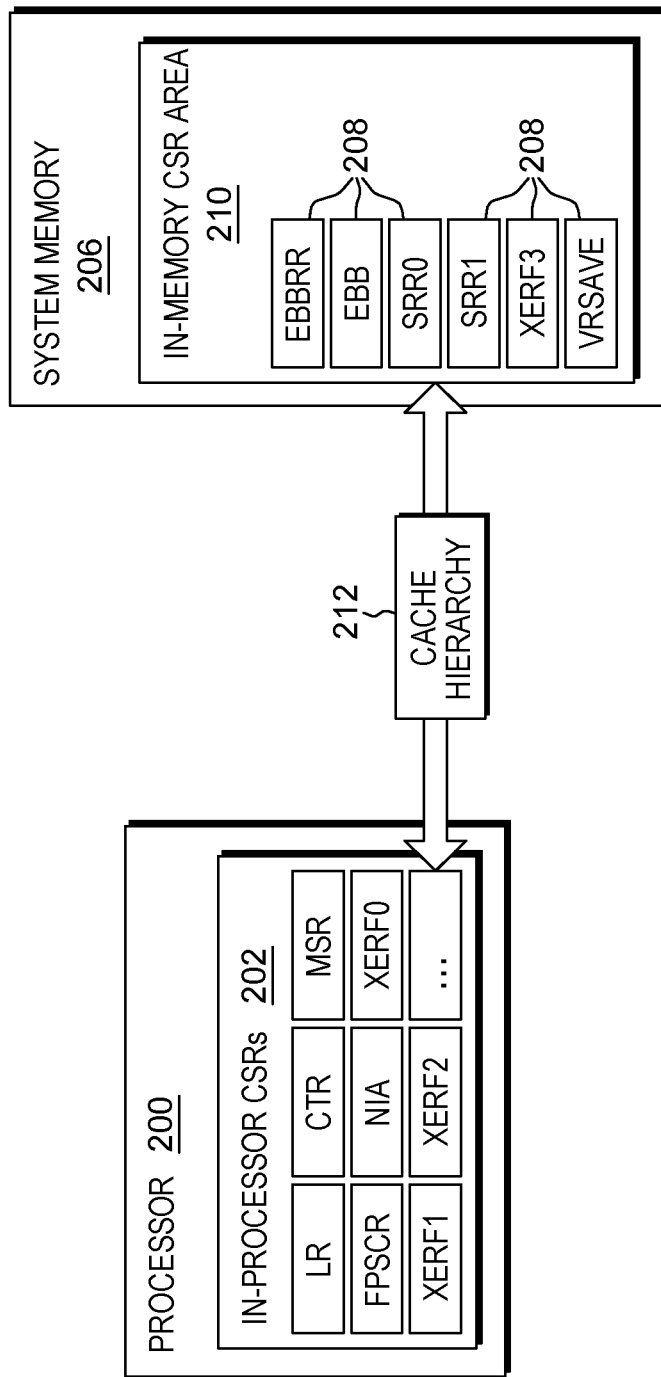
FIG. 2 depicts one example of in-processor configuration state registers and in-memory configuration state registers, in accordance with an aspect of the present invention.

Further details regarding various registers used by a processor 200, such as processor 104 or processor 171, are described with reference to FIG. 2. As shown, processor 200 includes a plurality of in-processor configuration state registers (CSRs) 202. As examples, the in-processor configuration state registers include a link register (LR), a counter register (CTR), a machine state register (MSR), a floating point status control register (FPSCR), a next instruction address (NIA) register, and one or more integer exception registers (XER) registers. Further, in accordance with an aspect of the present invention, system memory 206 coupled to processor 200 includes one or more in-memory configuration state registers 208. As examples, the in-memory configuration state registers include event based branch return registers (EBBRR), event based branch registers (EBB), state restoration registers (SRRs); an integer exception register (XER); and a vector register save register (VRSAVE). In one example, the in-memory configuration state registers 208 are stored in an in-memory configuration state register area 210 of system memory 206.

A configuration state register that is accessed frequently (e.g., several accesses in a row) may be moved to a cache hierarchy 212 coupled to processor 200 and system memory 206.

In accordance with one aspect, based on one or more configuration state registers being moved or placed in-memory, in-processor accesses to those configuration state registers are replaced with accesses to memory. One example of decode logic that determines the type of access is described with reference to FIG. 3. This processing is performed by, e.g., the decode unit and/or another unit of the processor.

Figure 3:
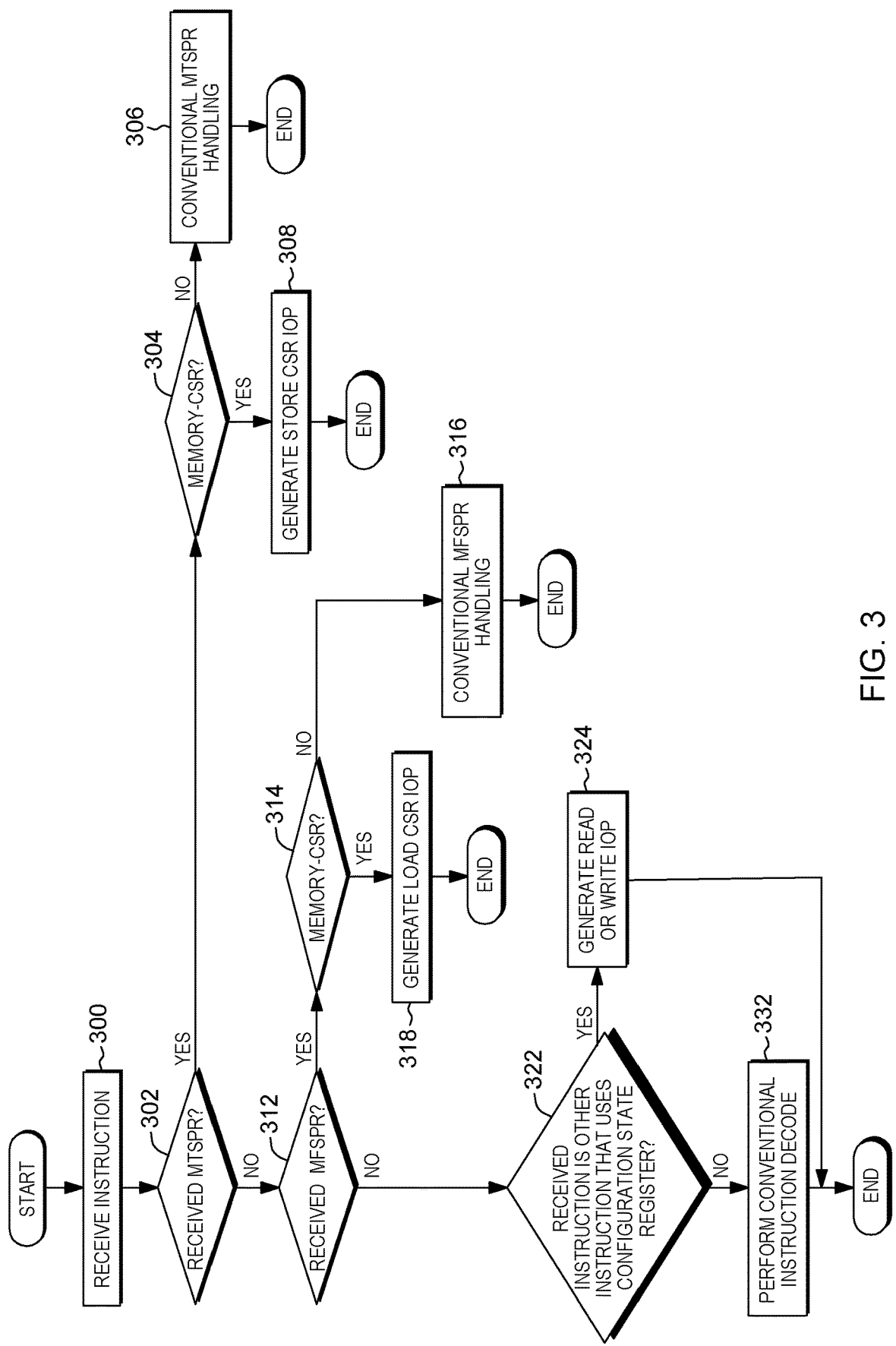
FIG. 3 depicts one example of decode logic associated with using in-memory configuration state registers, in accordance with an aspect of the present invention.

Referring to FIG. 3, initially, an instruction is received, STEP 300. A determination is made as to whether the instruction is a move to configuration state register instruction, such as a Move to SPR (mtspr) instruction, INQUIRY 302. If the instruction is a move to configuration state register instruction, then a further determination is made as to whether the configuration state register indicated in the instruction is an in-memory configuration state register, INQUIRY 304. If not, then conventional handling of the move to configuration state register instruction is performed, STEP 306. However, if the configuration state register is an in-memory configuration state register, then a store configuration state register internal operation is generated to store the configuration state register in memory (e.g., store the new contents of the configuration state register in memory), STEP 308.

Returning to INQUIRY 302, if the received instruction is not a move to configuration state register instruction, then a further determination is made as to whether the instruction is a move from configuration state register instruction, such as a Move from SPR (mfspr) instruction, INQUIRY 312. If the instruction is a move from configuration state register instruction, then a determination is made as to whether the configuration state register indicated in the instruction is in-memory, INQUIRY 314. If not, then conventional move from configuration state register handling is performed, STEP 316. Otherwise, a load configuration state register internal operation is generated to obtain the contents of the register from memory, STEP 318.

Returning to INQUIRY 312, if the received instruction is not a move to or move from configuration state register instruction, then yet a further determination may be performed to determine whether the received instruction is another instruction that uses a configuration state register, INQUIRY 322. If so, then a read and/or write internal operation may be generated depending on the function being performed by the instruction, STEP 324. Otherwise, processing continues to STEP 332, in which conventional instruction decode processing is performed.

In other aspects of the present invention, internal operations to load configuration state register and store configuration state register values are performed in conjunction with the performing of processor operations not corresponding to instructions, e.g., in response to entering an exception handler responsive to receiving an interrupt request.

Figure 4:
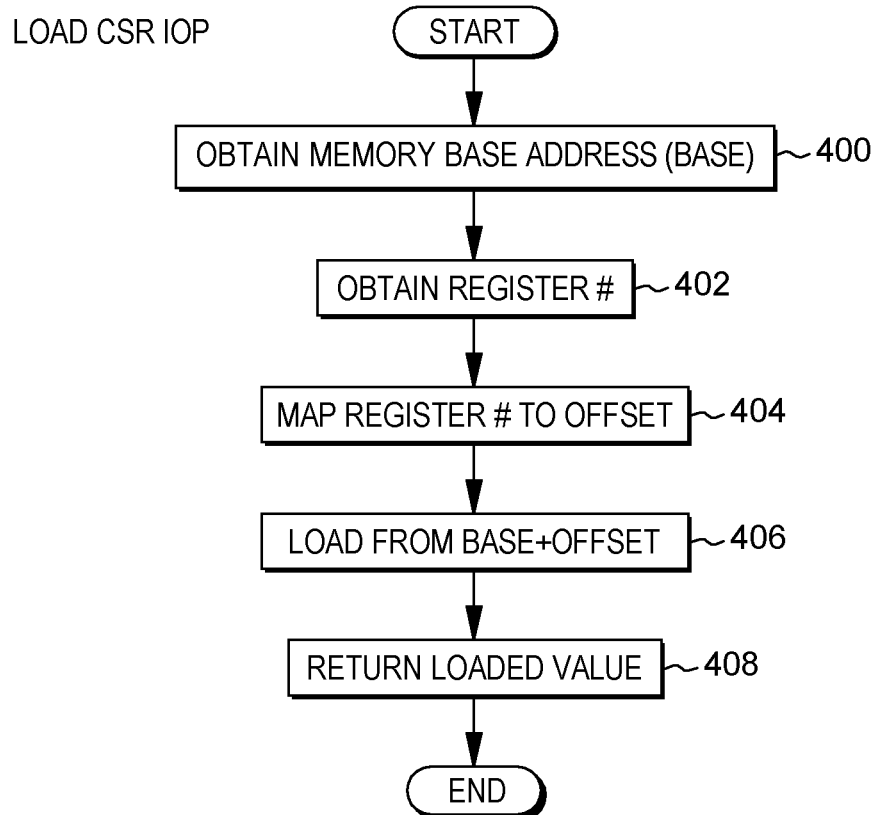
FIG. 4 depicts one example of a load configuration state register internal operation, in accordance with an aspect of the present invention.

Further details regarding a load configuration state register internal operation are described with reference to FIG. 4. This processing is performed by a processor. Referring to FIG. 4, initially, a memory base address (base) is obtained from a register or location (e.g., a base register, such as a thread control base register (TCBR)) that contains an address of a memory unit (e.g., memory page) that is the base address of the memory that includes the configuration state registers, STEP 400. Additionally, a register number indicated in the operation is obtained, STEP 402. That register number is mapped to an offset in memory, STEP 404. For instance, each configuration state register number (or other identification in another embodiment) is mapped to a particular location in memory. That location, is a certain amount (e.g., offset) from the base address. Then, a load from an address (base address plus offset) is performed, STEP 406, and the loaded value is returned, STEP 408.

As used herein, base refers to a base address of the memory that includes the in-memory configuration state registers, and base register refers to a register that includes the base. One example of a base register is a thread control base register (TCBR), but other contexts (e.g., operating system, etc.) may use other base registers.

Figure 5:
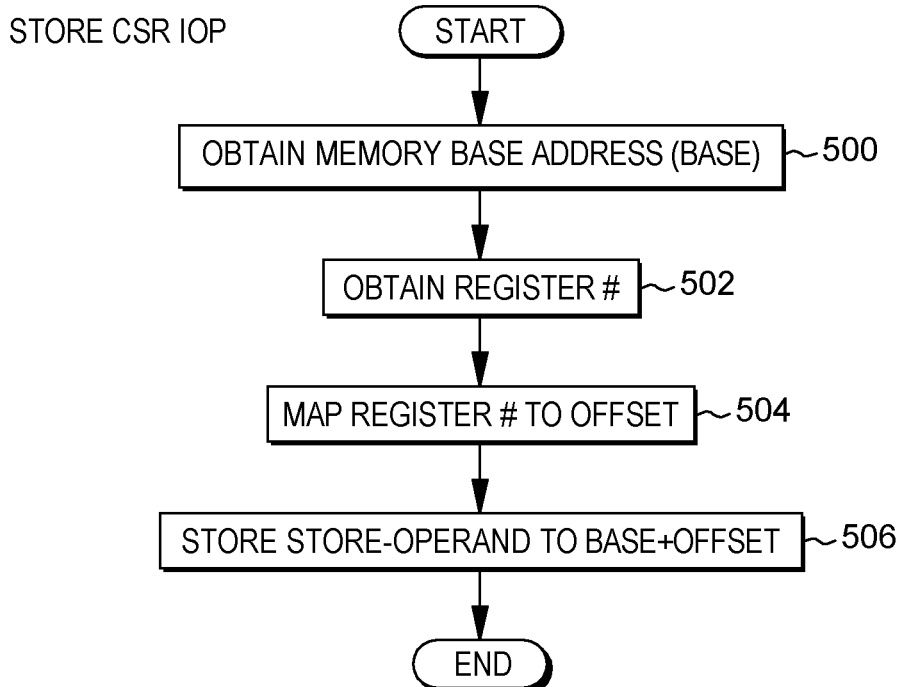
FIG. 5 depicts one example of a store configuration state register internal operation, in accordance with an aspect of the present invention.

Further details regarding a store configuration state register internal operation are described with reference to FIG. 5. This processing is performed by a processor. Referring to FIG. 5, initially, a memory base address (base) is obtained, e.g., from a base register (e.g., from TCBR), STEP 500, as well as, the register number indicated in the operation, STEP 502. The register number is mapped to an offset in memory, STEP 504, and a store operand (e.g., the contents of the register) is stored at an address specified by the base address plus offset, STEP 506.

Figure 6:
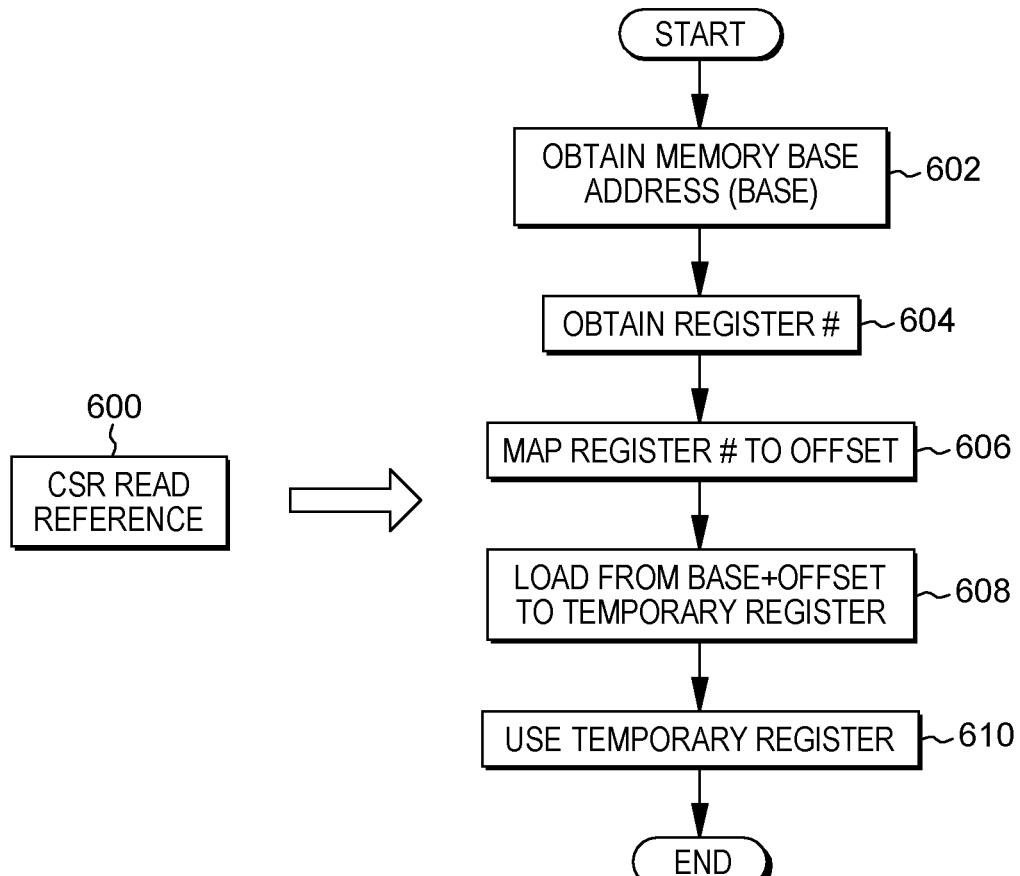
FIG. 6 depicts one example of using an in-memory configuration state register, in accordance with an aspect of the present invention.

As indicated above, instructions other than a move from or a move to configuration state register instruction may use a configuration state register. Thus, processing associated with one of these instructions is described with reference to FIG. 6. This processing is performed by a processor. Referring to FIG. 6, in this embodiment, an instruction/operation is obtained that includes a configuration state register read reference, STEP 600. Based thereon, a memory base address (base) for the configuration state register indicated in the instruction/operation is obtained, e.g., from a base register (e.g., from TCBR), STEP 602, as well as the register number indicated in the instruction/operation, STEP 604. The register number is mapped to an offset in memory, STEP 606, and the contents from the address specified by base plus offset are loaded into a temporary register, STEP 608. The temporary register is then used, STEP 610.

Figure 7:
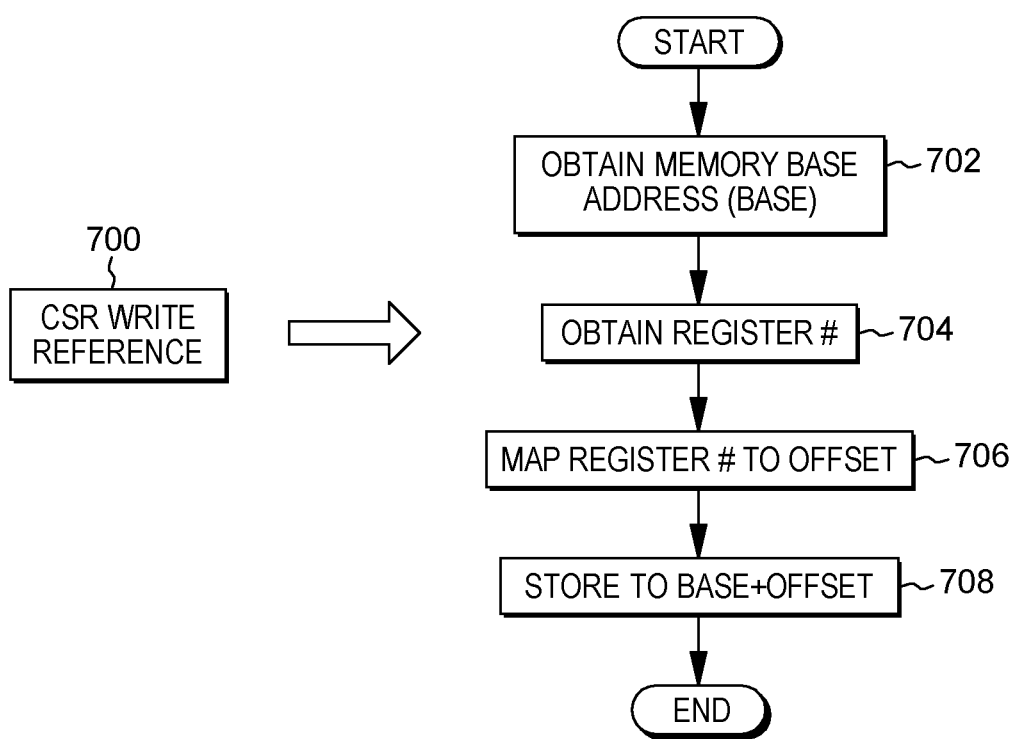
FIG. 7 depicts another example of using an in-memory configuration state register, in accordance with an aspect of the present invention.

Similar processing is performed for a configuration state register write reference, as described with reference to FIG. 7. This processing is performed by a processor. Referring to FIG. 7, in one example, a configuration state register write reference is obtained, STEP 700. Based thereon, a memory base address (base) is obtained, e.g., from a base register (e.g., from TCBR) for the configuration state register indicated in the instruction/operation, STEP 702, in addition to the register number specified in the instruction/operation, STEP 704. The register number is mapped to an offset, STEP 706, and the contents included in the write reference (e.g., in a temporary register) are stored at the address specified at base plus offset, STEP 708.

Figure 8:
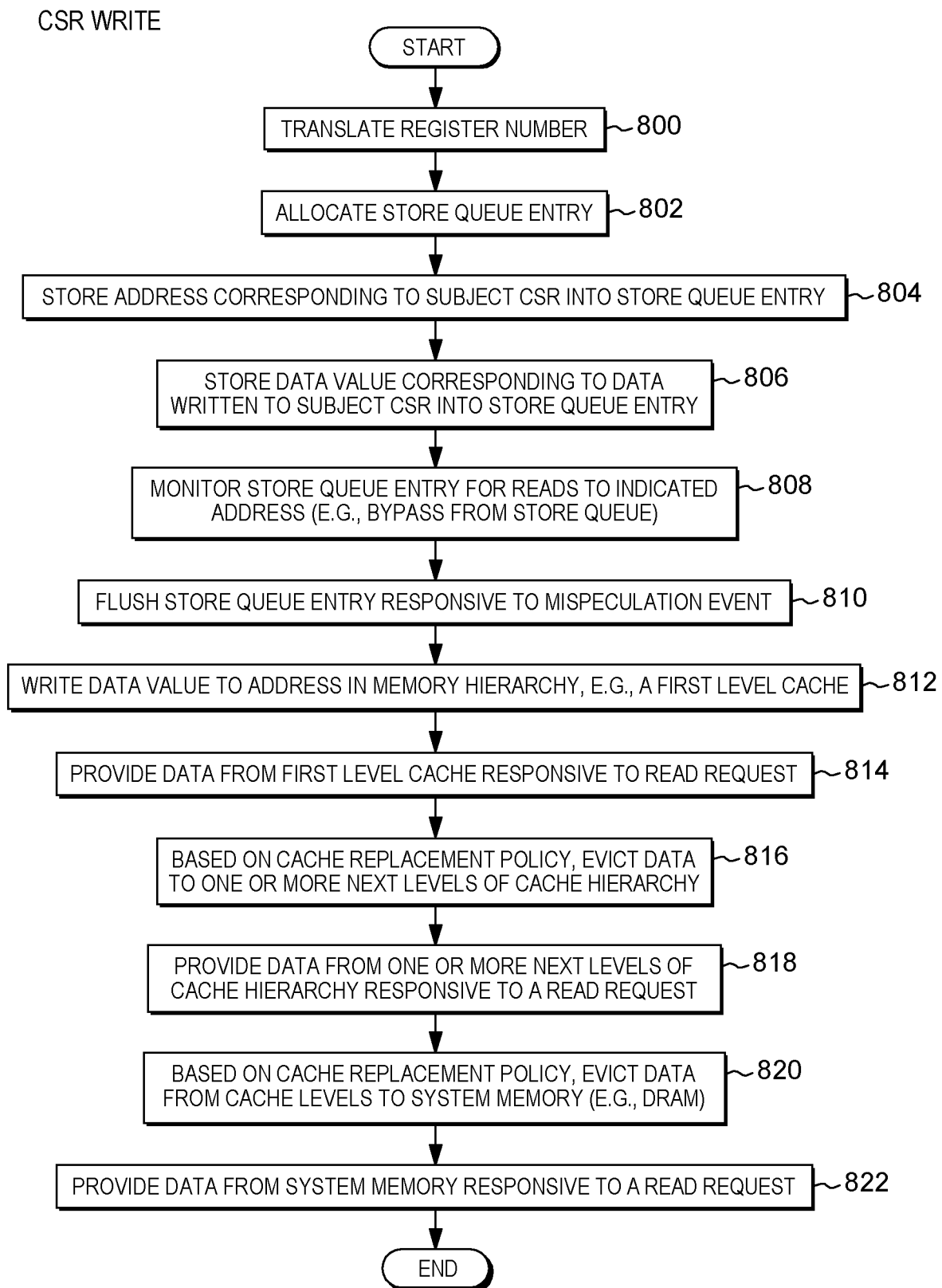
FIG. 8 depicts one example of a configuration state register write operation, in accordance with an aspect of the present invention.

Further details regarding an operational implementation view of a configuration state register write operation (such as a move to configuration state register (e.g., mtspr)) are described with reference to FIG. 8. This processing is performed by a processor. Referring to FIG. 8, in one example, the register number specified in the operation is translated, STEP 800. For instance, the memory address corresponding to or mapped to the register number (or other indication) is determined (e.g., by using a look-up table or calculated). Further, a store queue entry is allocated, STEP 802, and the address corresponding to the subject configuration state register is stored into the store queue entry, STEP 804. Moreover, the contents (e.g., data value(s)) corresponding to the data written to the subject configuration state register is written into the store queue entry, STEP 806. In one example, STEPS 804 and 806 may be performed out-of-order.

The store queue entry is monitored for reads to the indicated address (e.g., bypass from store queue), STEP 808. Further, the store queue entry may be flushed based on a mispeculation event, which, in one example, can occur up to an architectural in-order point, STEP 810.

The contents (e.g., data values) are written to an address in the memory hierarchy, e.g., a first level cache, STEP 812. The data from the first level cache is provided based on a read request, STEP 814. Further, based on a cache replacement policy, data is evicted from the first level cache to one or more next levels of the cache hierarchy, STEP 816. Data from one or more next levels of the cache hierarchy are provided based on a read request, STEP 818. Based on the cache replacement policy, data from the cache levels is evicted to system memory, e.g., DRAM, STEP 820. The data from the system memory is provided based on a read request, STEP 822.

Figure 9:
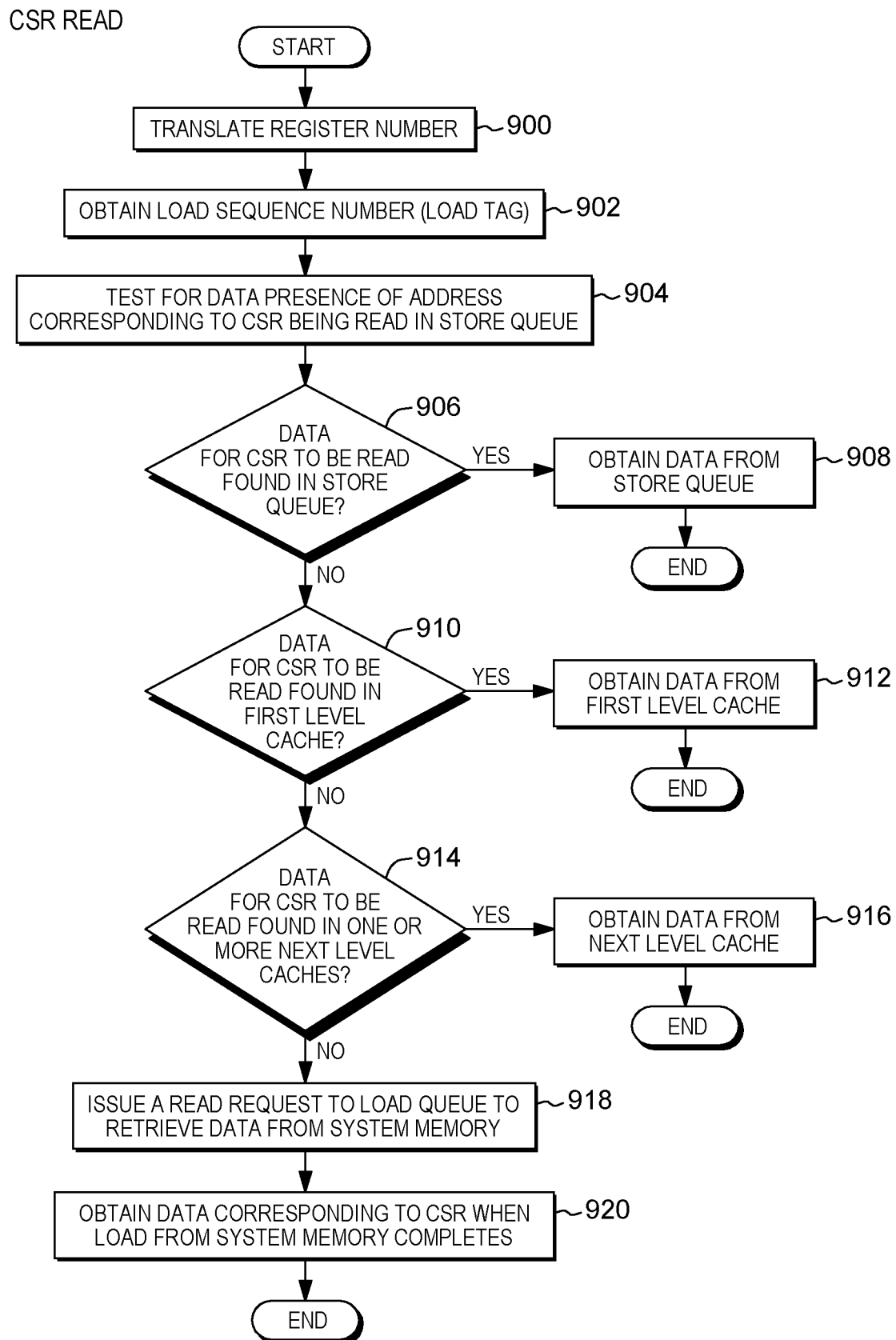
FIG. 9 depicts one example of a configuration state register read operation, in accordance with an aspect of the present invention.

Further details regarding an operational implementation view of a configuration state register read operation are described with reference to FIG. 9. This processing is performed by a processor. Referring to FIG. 9, in one example, the register number specified by the read operation is translated to a corresponding memory address, STEP 900. A load sequence number used to indicate a position in a load queue used to track load requests and a load tag that tracks dependencies are obtained, STEP 902. A test for the presence of data at the address corresponding to the configuration state register being read in the store queue is performed, STEP 904 (i.e., is the data to be read from memory in the store queue). If the data for the configuration state register to be read is found in the store queue, INQUIRY 906, then the value is obtained from the store queue, STEP 908, and processing is complete.

Returning to INQUIRY 906, if the data for the configuration state register to be read is not found in the store queue, then a further determination is made as to whether the data for the configuration state register to be read is found in the first level cache, INQUIRY 910. If so, then the value is obtained from the first level cache, STEP 912, and processing is complete.

Returning to INQUIRY 910, however, if the data is not found in the first level cache, then a further determination is made as to whether the data for the configuration state register to be read is found in one or more next level caches, INQUIRY 914. If the data is found in one or more next level caches, then the data is obtained from a next level cache, STEP 916, and processing is complete.

Returning to INQUIRY 914, if the data is not in one or more next level caches, then a read request is issued to the load queue to retrieve the data from system memory, STEP 918. The data corresponding to the configuration state register is obtained when the load from system memory completes, STEP 920.

In accordance with an aspect of the present invention, the allocation of in-memory memory units (e.g., pages) is performed in order to provide software compatibility. For instance, the allocation is performed by firmware for a processor to be able to execute legacy hypervisors, and hypervisors to be able to execute legacy operating systems, and so forth.

In one example, upon initial boot of the system, firmware allocates in-memory pages for the in-memory configuration state registers, in firmware-owned memory. In one example, if a hypervisor is unaware of the in-memory configuration state registers, then the firmware-owned pages are used throughout the entire execution of the system without any further software reference to a base register, e.g., TCBR, etc.

As such, the hypervisor will simply perform context switches by reading the context using, e.g., a move from configuration state register, e.g., mfspr, and reloading the context with, e.g., a move to configuration state register, e.g., mtspr. This offers significant design simplicity and performance advantages within the computer system.

Further, in one example, when a hypervisor is aware of memory-backed pages, it may configure each new partition to have a set of backing pages. Further, if an operating system is unaware of in-memory configuration state registers, then the hypervisor owned page(s) is used throughout the entire execution of the system without any further software reference to, e.g., a base register, e.g., TCBR, etc. If the hypervisor is unaware as well, then the operating system will use firmware-owned pages.

As such, the operating system will simply perform context switches by reading the context using, e.g., a move from configuration state register, such as, e.g., mfspr, and reloading the context with, e.g., a move to configuration state register, such as, e.g., mtspr. This offers significant design simplicity and performance advantages, facilitating processing within the computer system.

As described herein, in accordance with one or more aspects, selected configuration state registers are stored in system memory. Thus, move to and from configuration state registers are replaced by load and store instructions by instruction decode logic. Loads and stores that are so generated are committed to store queues, and normal load and store processing are performed. In one example, the configuration state registers that are not constantly needed (e.g., those other than registers, such as the program counter (PC), data and address break point registers, PSW, floating point control, etc.) are those stored in memory.

As an example, the storage area is defined by the operating system and hypervisor and set aside for storing memory-based registers. In one embodiment, a physical memory region is architecturally specified (e.g., the first or last n pages of physical memory).

In at least one embodiment, in-memory configuration state registers are mapped to normal cacheable memory. When a configuration state register is to be updated, it is stored into a store queue. The store queue is not only a queuing mechanism, but effectively provides a way to rename locations for storage in order to enable speculative execution of memory accesses. Multiple versions of speculative values for an address can be in the store queue (in addition to an authoritative, architected value at an architectural in-order point, which is in cache or system memory). The cache entries may be updated out-of-order, once they have been allocated. Also stores may be undone by flushing entries from the store queue.

Consequently, an in-memory configuration state register can be updated by using the store queue and read back out-of-order with no performance cost, where an in-core latch based configuration state register forces two serialization and in-order access cost penalties because implementing means for speculative execution of in-processor configuration state registers are most often prohibitively expensive.

Further, when a value is not in the store queue, a read of the value can be done more efficiently than from a latch because frequently used memory controls (e.g., in-memory configuration state registers) will be found in the cache and may be available in as little as 2-3 cycles (time to access a first level cache), much faster than the special purpose logic needed to access a latch based configuration state register in a processor.

In one embodiment, when a page is allocated to hold configuration state registers, the architecture disallows access to the page using memory operands. This avoids an interlock between a memory operation and move from/move to configuration state register instructions.

In accordance with a further aspect of the present invention, one or more portions of a configuration state register are provided in-memory, while one or more other portions of the configuration state register are provided in-processor. For instance, a configuration state register may have a plurality of portions (e.g., fields) and one or more of those portions that are, for instance, frequently accessed, may remain in-processor and the remaining portions that are, for instance, infrequently used, may be moved to memory. This is described in further detail with reference to FIGS. 10-14.

Figure 10:
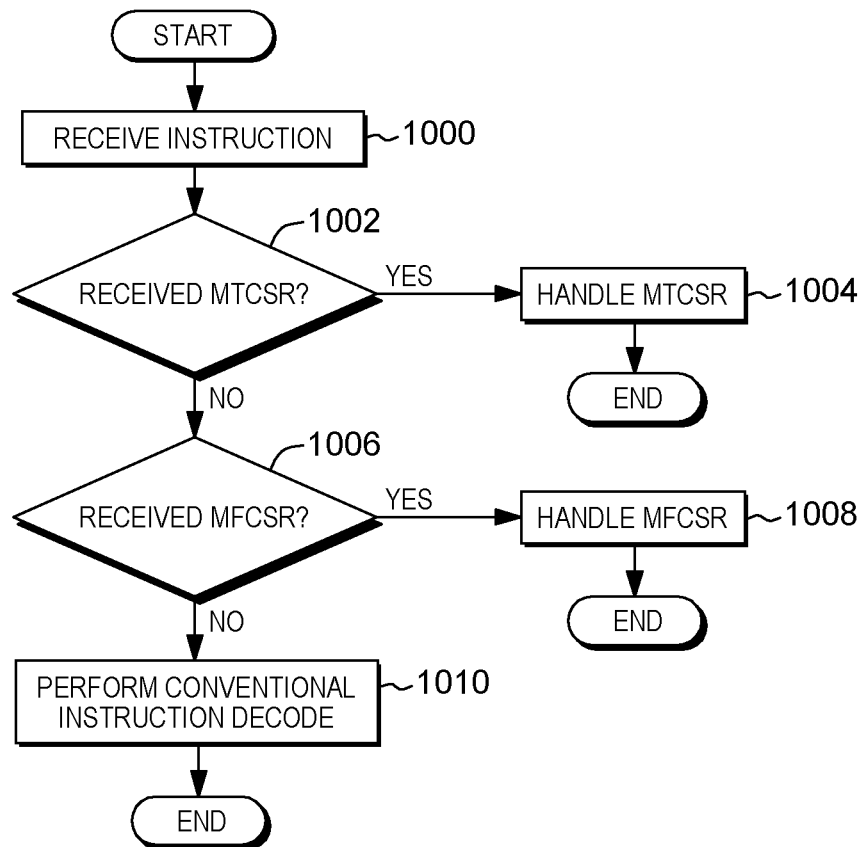
FIG. 10 depicts one embodiment of decode logic associated with a move to or a move from configuration state register, in accordance with an aspect of the present invention.

Initially, referring to FIG. 10, the decode unit of a processor (or another component) receives an instruction, STEP 1000. A determination is made by the decode unit (or another component) as to whether that instruction is a move to configuration state register instruction (mtcsr), such as to a Move to SPR (mtspr) instruction, INQUIRY 1002. If it is a move to configuration state register instruction, then that instruction is handled, STEP 1004, as described below.

Returning to INQUIRY 1002, if the instruction is not a move to configuration state register instruction, then a further determination is made as to whether the instruction is a move from configuration state register instruction (mfcsr), such as a Move from SPR (mfspr) instruction, INQUIRY 1006. If it is a move from configuration state register instruction, then that instruction is handled, as described below, STEP 1008. Returning to INQUIRY 1006, if the instruction is neither a move to or a move from configuration state register instruction, then conventional instruction decode is performed, STEP 1010.

In a further embodiment, other inquiries may be made as to whether it is another instruction that uses a configuration state register, and if so, those instructions may be handled, as appropriate, examples of which are described herein. In yet a further embodiment, processor operations not corresponding to instructions (e.g., initiating an exception handling sequence) may be similarly performed.

Further details regarding handling a move to configuration state register instruction are described with reference to FIG. 11. In one example, the configuration state register may be a special purpose register (SPR), and the instruction is a Move to SPR (mtspr) instruction. However, this is only one example. Other configuration state registers may be processed similarly. This logic is performed by a processor, such as, for instance, the decode unit of the processor. In other examples, one or more other components perform this logic.

Figure 11:
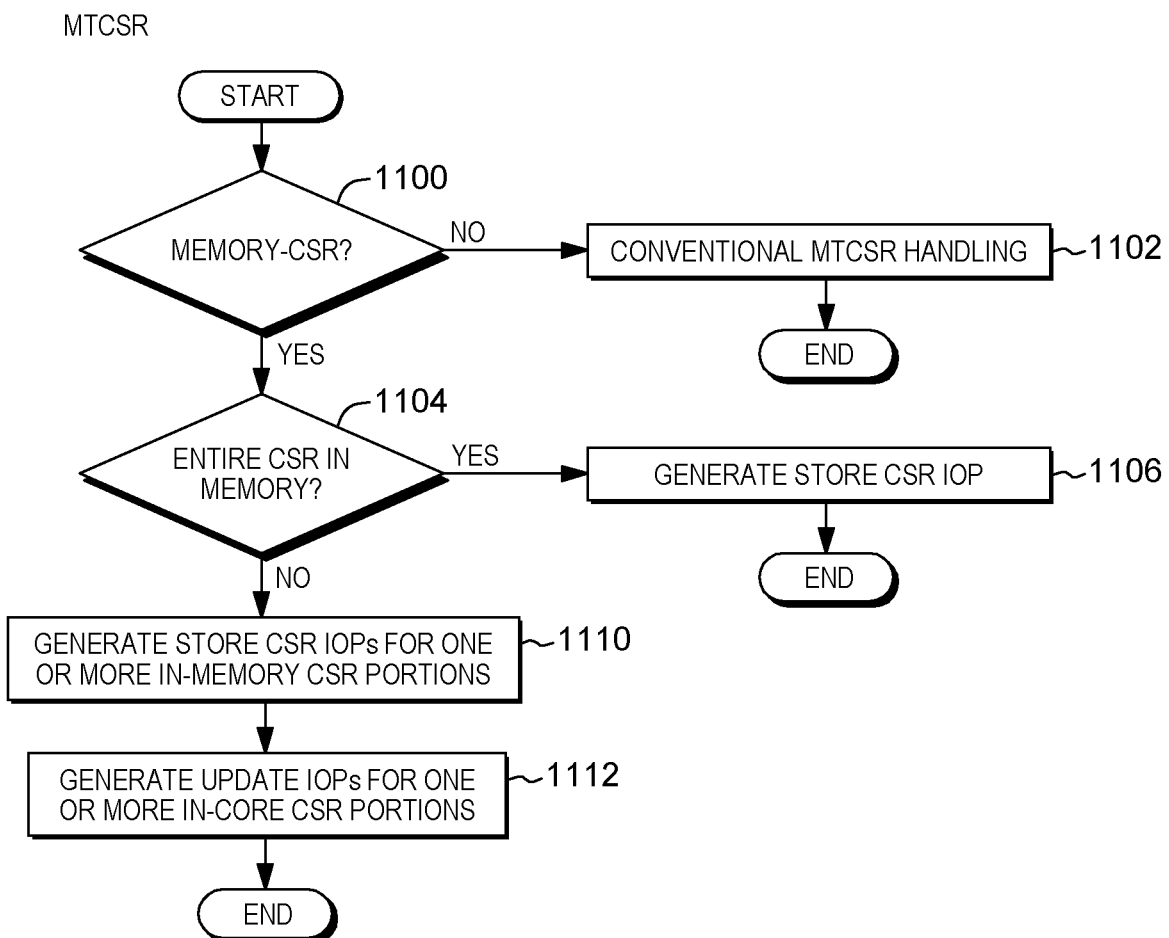
FIG. 11 depicts further details associated with a move to configuration state register instruction, in accordance with an aspect of the present invention.

Referring to FIG. 11, based on obtaining (e.g., receiving, provided, selecting, etc.) a move to configuration state register instruction, such as an mtspr instruction, a determination is made as to whether a least a portion of the configuration state register (CSR) specified by the instruction is in-memory, INQUIRY 1100. If not, then conventional processing of the move to configuration state register instruction (e.g., mtspr) is performed, STEP 1102.

Returning to INQUIRY 1100, if at least a portion of the configuration state register is in-memory, then a further determination is made as to whether the entire configuration state register is in-memory, INQUIRY 1104. If the entire configuration state register is in-memory, then a store configuration state register internal operation is generated, STEP 1106. An example of processing associated with this internal operation is described with reference to FIG. 5.

Returning to INQUIRY 1104, if only one or more portions of the configuration state register are in-memory, then one or more store configuration state register operations are generated for the one or more in-memory configuration state register portions, STEP 1110. Further, updated internal operations are generated for the one or more in-core configuration state register portions, STEP 1112. The updated internal operations may be one or more instructions, a state machine or other that performs the operation of copying the contents of one or more general purpose registers including data for the specified in-core portions to the appropriate portion(s) of the in-core configuration state register. Processing is complete.

Further details regarding processing associated with handling a move from configuration state register instruction are described with reference to FIG. 12. In one example, the configuration state register may be a special purpose register (SPR), and the instruction is a Move from SPR (mfspr) instruction. However, this is only one example. Other configuration state registers may be processed similarly. This logic is performed by a processor, such as, for instance, the decode unit of the processor. In other examples, one or more other components perform this logic.

Figure 12:
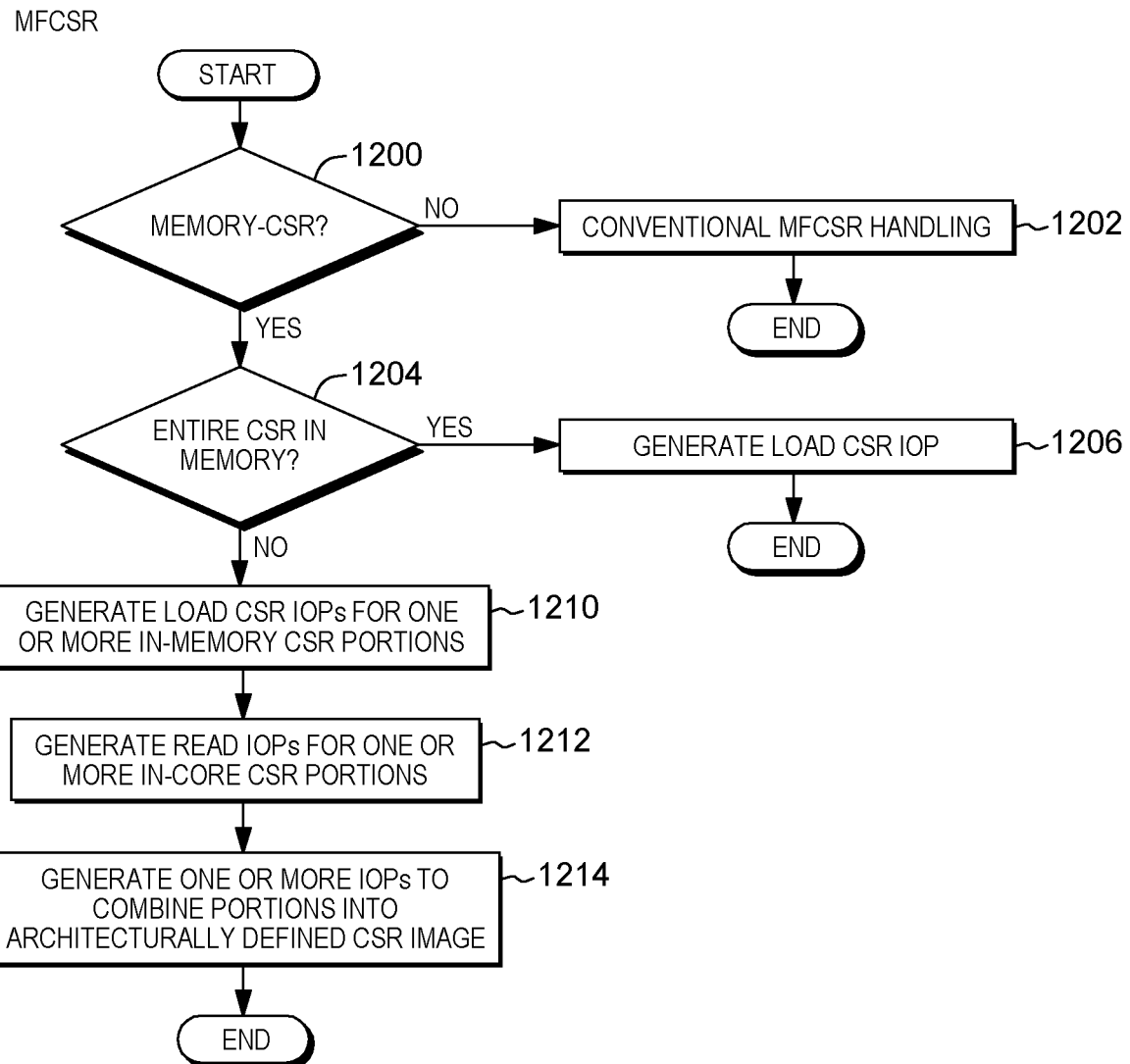
FIG. 12 depicts further details of a move from configuration state register instruction, in accordance with an aspect of the present invention.

Referring to FIG. 12, based on obtaining (e.g., receiving, providing, selecting, etc.) a move from configuration state register instruction, such as an mfspr instruction, a determination is made as to whether at least a portion of the configuration state register is in-memory. If not, then conventional processing is performed for the move from configuration state register instruction, STEP 1202.

Returning to INQUIRY 1200, if at least a portion of the configuration state register is in-memory, then a further determination is made as to whether the entire configuration state register is in-memory, INQUIRY 1204. If the entire configuration state register is in-memory, then a load configuration state register internal operation is generated, STEP 1206. An example of processing associated with this operation is described with reference to FIG. 4.

Returning to INQUIRY 1204, if only one or more portions of the configuration state register are in-memory, then one or more load configuration state register internal operations are generated for one or more of the in-memory configuration state register portions, STEP 1210. Further, one or more read internal operations are generated for the one or more in-core configuration state register portions, STEP 1212.

Additionally, in one embodiment, one or more internal operations are generated to combine the in-memory and in-core portions into an architecturally defined configuration state register image, STEP 1214. This may include using, for instance, an Insert Under Mask instruction, or OR, AND, and/or NOT logic circuits, as described further below.

Further details regarding the use of a composite configuration state register in which one or more portions are in-processor and one or more portions are in-memory are described with reference to FIG. 13A, in which a read reference is described. This logic is performed by a processor, such as, for instance, the decode unit of the processor. In other examples, one or more other components perform this logic.

Figure 13A:
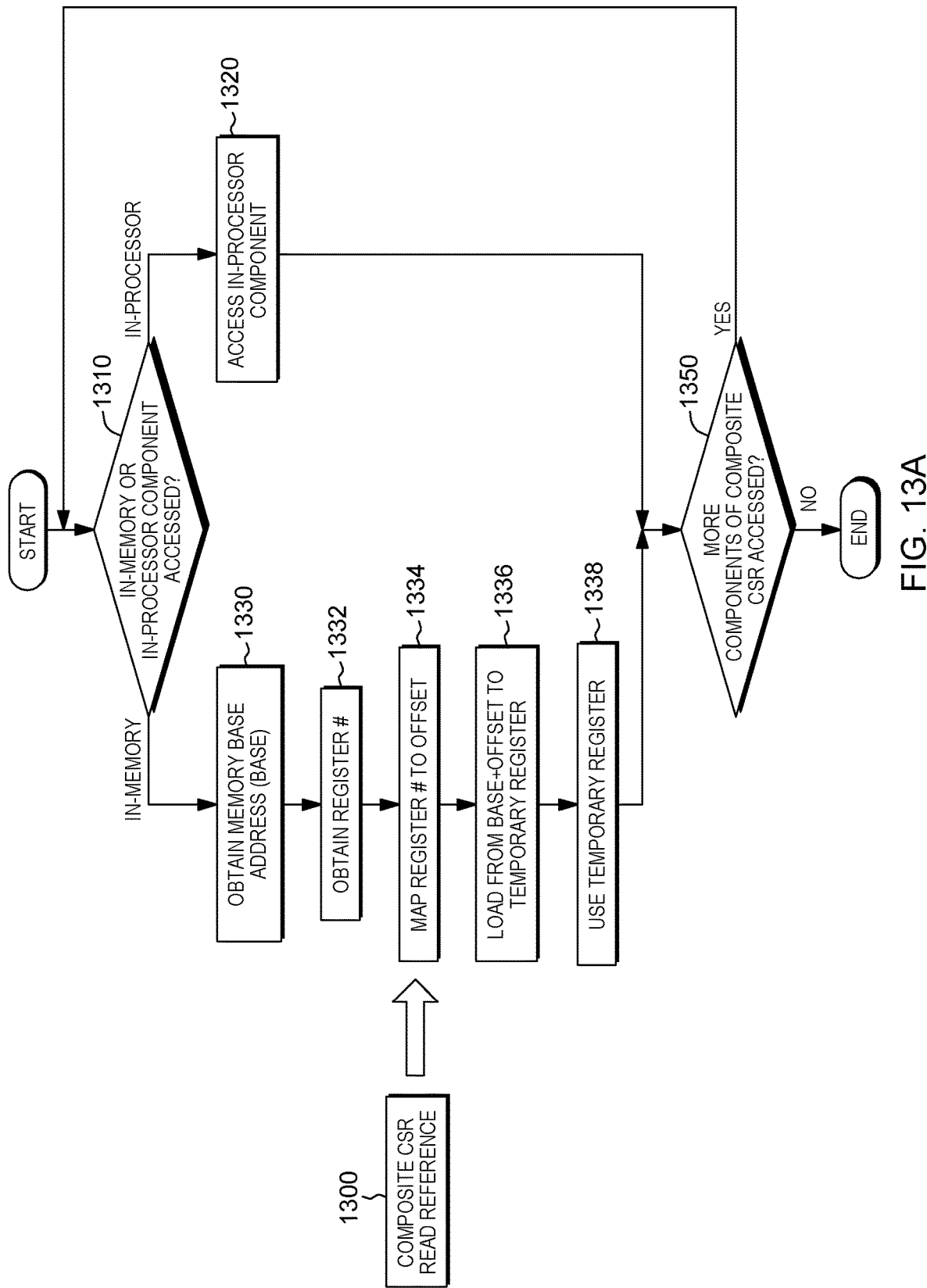
FIG. 13A depicts one embodiment of logic associated with a composite configuration state register read reference, in accordance with an aspect of the present invention.

Referring to FIG. 13A, based on a composite configuration state register read reference 1300, a determination is made as to whether a particular portion (also referred to as a component; e.g., a field) being accessed is in-memory or in-processor, INQUIRY 1310. If it is in-processor, then the in-processor component is accessed, STEP 1320, and processing continues to INQUIRY 1350, described below. However, if the particular component is in-memory, INQUIRY 1310, then processing is performed, as described with reference to FIG. 6. For instance, the memory base address (base) is obtained, STEP 1330, as well as a register number indicated in the instruction referencing the composite configuration state register, STEP 1332. The register number is mapped to an offset, STEP 1334, and a load is performed from the address (base+offset) to a temporary register, STEP 1336. The temporary register is then used, STEP 1338. Thereafter, or after STEP 1320, a determination is made as to whether another component of the composite configuration register is to be accessed, INQUIRY 1350. If so, then processing continues with INQUIRY 1310. Otherwise, processing is complete.

Further details regarding the use of a composite configuration state register in which one or more portions are in-processor and one or more portions are in-memory are described with reference to FIG. 13B, in which a write reference is described. This logic is performed by a processor, such as, for instance, the decode unit of the processor. In other examples, one or more other components perform this logic.

Figure 13B:
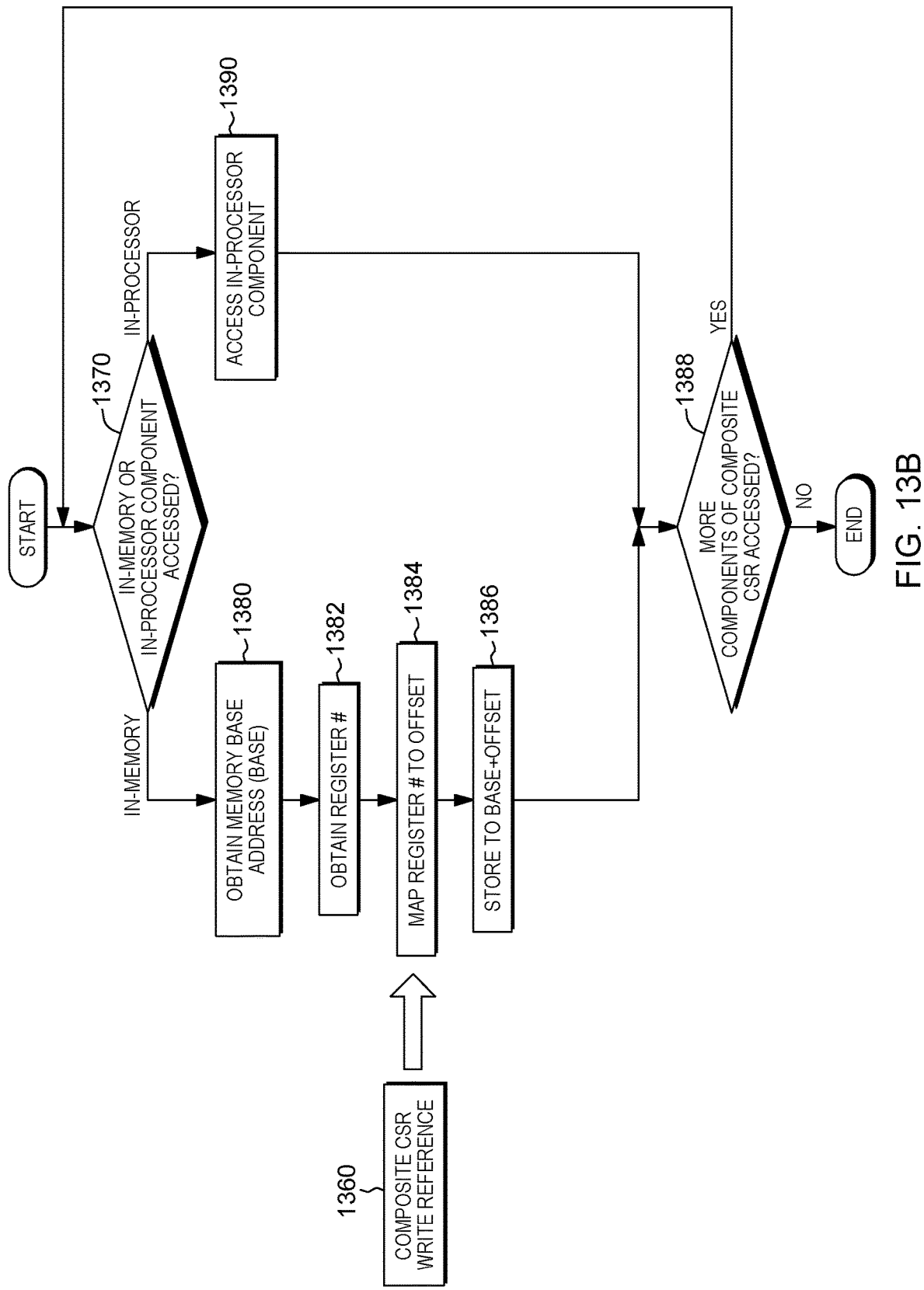
FIG. 13B depicts one embodiment of logic associated with a composite configuration state register write reference, in accordance with an aspect of the present invention.

Referring to FIG. 13B, based on a composite configuration state register write reference 1360, a determination is made as to whether a particular portion (also referred to as a component; e.g., a field) being accessed is in-memory or in-processor, INQUIRY 1370. If it is in-processor, then the in-processor component is accessed, STEP 1390, and processing continues to INQUIRY 1388, described below. However, if the particular component is in-memory, INQUIRY 1370, then processing is performed, as described with reference to FIG. 7. For instance, the memory base address (base) is obtained, STEP 1380, as well as a register number indicated in the instruction referencing the composite configuration state register, STEP 1382. The register number is mapped to an offset, STEP 1384, and a store is performed to an address defined by base+offset, STEP 1386. Thereafter, or after STEP 1390, a determination is made as to whether another component of the composite configuration register is to be accessed, INQUIRY 1388. If so, then processing continues with INQUIRY 1370. Otherwise, processing is complete.

Figure 14:
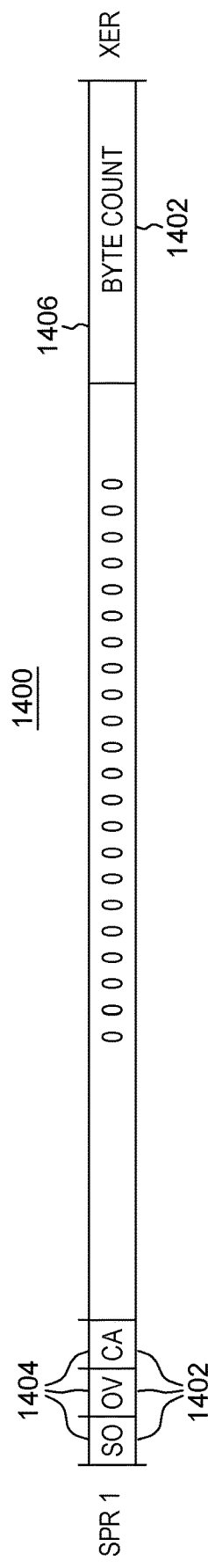
FIG. 14 depicts one example of a composite configuration state register, in accordance with an aspect of the present invention.

One example of a composite configuration state register is depicted in FIG. 14. As shown, in this example, a composite configuration state register 1400 is special purpose register (SPR) 1, which corresponds to an integer exception register (XER). This register includes a plurality of fields 1402. In one example, one or more of the fields are in-processor fields 1404, and another field 1406 is an in-memory field. In this particular example, Xerf0, 1, 2 (i.e., fields 0, 1, and 2 of XER) are renamed in-processor to SO (summary overflow), OV (overflow) and CA (carry); and Xerf3 (field 3 of XER), which is not renamed in this example, is a byte count field in-memory. With this configuration, the following IOP sequences may be generated and used to perform a mtspr and a mfspr, respectively, for a composite configuration state register:

| mtspr_xer | mtxerf2 |
| | mtxerf0 |
| | mtxerf1 |
| | stxerf3 |

With the above, the mtspr for the XER register includes: a move to field 2 of XER (mtxerf2), in which contents of a general purpose register are copied to XER field 2; a move to field 0 of XER (mtxerf0), in which contents of a general purpose register are copied to XER field 0; and a move to field 1 of XER (mtxerf1), in which contents of a general purpose register are copied to XER field 1. It also includes a store to field 3 of XER (stxerf3), which is performed by a store operation, since field 3 is in memory.

| mfspr_xer | mfxerf2 |
| | mfxerf0 |
| | or |
| | ldxerf3 |
| | or |
| | mfxerf1 |
| | or |

For the move from XER, each of the fields is read, either from in-processor or in-memory and those fields are combined by, e.g., an OR operation. For example, the contents of field 2 and field 0 are read and an OR operation is performed to provide a result 1; then, the contents of field 3 are read (e.g., using a load, such as, for example, a load xerf3 internal operation, ldxerf3, since field 3 is in-memory) and OR'd with result 1 to produce result 2. Further, the contents of field 1 are read and OR'd with result 2 to provide a final result, which is an image of XER with its fields, regardless of whether in-processor or in-memory.

As described herein, in accordance with an aspect of the present invention, a move from configuration state register instruction generates a sequence of moves from the in-processor portions, and a read for the portion stored in-memory. The contents of the read in-memory and in-processor portions are collated, e.g., using a sequence of, e.g., OR instructions. Further, a move to configuration state register instruction generates a sequence of moves to the in-processor portions, and a store for the portion stored in-memory.

In one aspect, when memory is assigned to configuration state registers, the offsets are architecturally (e.g., defined and externally visible) or micro-architecturally (defined but not externally visible) specified. For instance, an offset may be derived directly from the configuration state register number (or other indication).

As one example mapping, each configuration state register is mapped to the corresponding offset (in doublewords), i.e., base*configuration state register #, in which configuration state register 1 is at a first location; configuration state register 2 is at the first location plus a defined number of bytes (e.g., 8), and so forth.

However, configuration state register numbers are non-contiguous, wasting memory, and cache efficiency. Thus, in another embodiment in accordance with an aspect of the present invention, the configuration state register number is not used to directly derive an offset into a memory page, rather configuration state registers are allocated offsets based on functional affinity. Thus, configuration state registers that are used together in common operations are allocated to the same or adjacent cache lines, to enhance cache locality. For example, EBB handling uses the following registers: e.g., EBBHR, EBBRR, BESCR, and TAR. TAR is not contiguous with the others. However, they all are to be allocated to memory, so that they end up in the same cache line or an adjacent cache line.

One example of a linear mapping is depicted in FIGS. 15A-15B. As shown, in one example, a linear mapping 1500 is sparse. For instance, in one example, 8 KB (2 pages) is used, even though fewer than 1K of configuration state registers is mapped. Further, jointly used configuration state registers, such as EBBHR, EBBRR, BESCR, and TAR, are not contiguous. Additionally, groups of configuration state registers are not on an alignment boundary to ensure they are in the same cache line (e.g., 779 MMCR0; 780 STAR; 781 SDAR; 782 MMCR1). Yet further, some configuration state registers may refer to the same register; e.g., different access permissions, subfields, etc. This is an inefficient use of cache. There is a lack of prefetch (to ensure each activity only suffers one cache miss); and an overly large cache foot print (resulting in an increased working set which reduces hit rate). Thus, in accordance with an aspect of the present invention, configuration state registers are not stored at, e.g., base+(idx*8). Rather, they are stored at, for instance, base+remap[idx].

This remap ensures groups are adjacent in order to share a cache line; it eliminates/reduces sparsity, providing a more efficient cache use; and handles multiple names. As one example, the remapping is static and is performed at processor design and provided in a data structure, such as a table, or by computation of a defined equation. As another example, the remapping is dynamic and determined by use. For instance, if tracking of registers shows that registers of a set of registers are used together, then those registers are grouped and placed adjacent to one another. Other possibilities exist.

Figure 16:
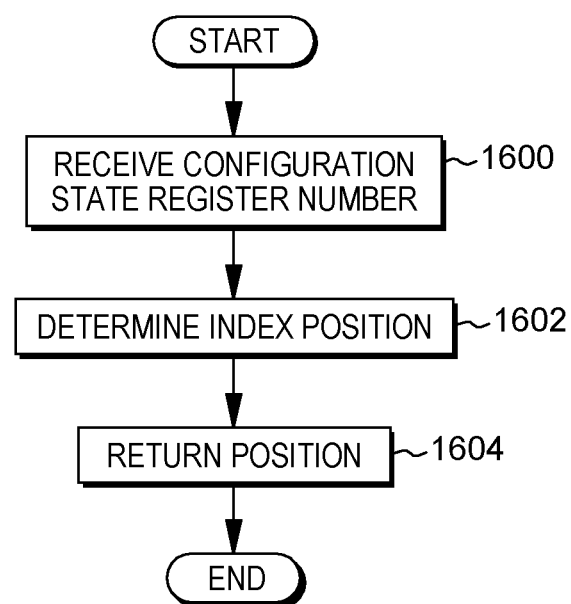
FIG. 16 depicts one example of remap flow logic for configuration state registers, in accordance with an aspect of the present invention.

Further details of remapping are described with reference to FIG. 16. This processing is performed by a processor. In one example, a configuration state register number is obtained by the processor, STEP 1600. Based on the configuration state register number, an index position (a.k.a., an offset) into the memory unit (e.g., page) is determined, STEP 1602. This may be determined by a table look-up or by computation. The index position is returned to the requester (e.g., an internal operation), STEP 1604.

In a further example, a circuit that includes mapping logic is used. A configuration state register number is input to the mapping logic, and the output is a page index.

As described above, in one embodiment, the configuration state register numbers, as defined in the architecture, are remapped such that those configuration state registers that are used together are placed close to one another in order to provide a more efficient cache. This reduces the number of cache lines used for the configuration state registers and competes less with other programs for use of the cache. Further, it ensures that once a cache line is loaded with a particular configuration state register and the penalty is paid for a cache miss for that value, other configuration state registers that may also be used in conjunction with that configuration state register will hit in the cache and consequently not involve other cache miss penalties.

In a further embodiment, a sync_o_csr instruction writes a version stamp into a page when different offset assignments are possible. A version stamp may be used to adjust offsets when migrating a partition between different hosts; and/or to adjust offsets either directly in hardware (e.g., when a sync_i_csr may read an offset version number for a partition) or in software.

In accordance with another aspect of the present invention, a capability is provided to perform a bulk operation to store or load multiple configuration state registers. An individual load or store of a configuration state register is expensive, since each read or write is to be performed in-order, and is to complete before the next instruction is started. Further, correct exception/error sequencing is to be ensured, since a lack of renaming for in-processor configuration state registers disallows rollback. However, in accordance with one or more aspects of the present invention, bulk configuration state register load to and store from memory units, such as pages, are provided.

For instance, a store configuration state register instruction or operation (e.g., ST_CSR) is used to store multiple in-processor configuration state registers in-memory (i.e., store the contents of the configuration state registers associated with the current context (e.g., application, thread, etc.) in select memory locations defined for the particular configuration state registers); and a load configuration state register instruction or operation (e.g., LD_CSR) is used to load configuration state registers stored in-memory back to in-processor (i.e., load the contents of the configuration state registers associated with the current context from memory back into the processor).

In-processor (also referred to as non-memory backed) configuration state registers that may be stored in memory are assigned locations in memory, e.g., in backing memory units (e.g., pages). In one example, the memory locations and/or units are well-defined, pre-defined locations/units, and therefore, the instructions need not have an operand to specify the locations/units. In another embodiment, the specific locations/units may be specified as an operand of the instruction. Further in another embodiment, each instruction may include an operand to indicate specific registers to be stored/loaded. Other variations are also possible.

Further, pages are just one example of memory units. Other units are possible. Also, although a page is typically 4 KB, in other embodiments, it may be other sizes. Many possibilities exist.

In addition to the ST_CSR and LD_CSR instructions described above, another instruction that may be used, in accordance with an aspect of the present invention, is mtspr TCBR, next_u->csr_page. This instruction is used to load the base address of the memory region used to store the in-memory configuration state registers for a particular context (e.g., processor, thread, etc.) in a register, such as TCBR. This address is then used in processing that employs a base address, as described herein. In this instruction, next_u->csr_page refers to the user data structure that stores data for the context issuing the instruction. This data includes the base address of the memory unit (e.g., page) storing the in-memory configuration state registers. Although mtspr is specified, other move to configuration state register (mtcsr) instructions may be used. Also, TCBR is just one example of a base register. Other base registers may be specified. Many variations are possible.

In addition to the above instructions, two synchronization instructions may be provided to synchronize the cache with memory or in-processor registers. For example, sync_o_csr is used to synchronize the cache and one or more in-memory configuration state registers; and sync_i_csr is used to synchronize the cache and one or more in-processor configuration state registers.

As described herein, in one aspect, multiple configuration state registers are loaded or stored. There are no intervening exceptions; i.e., exceptions are avoided; the operation is either completed on all the configuration state registers of the operation or none. Further, there are no page faults (e.g., pages are pinned; also once a page has been loaded, references are guaranteed to the same page). If desired, hardware can make a process restartable; e.g., a load or store sequence in microcode or a state machine.

By using instructions to store/load multiple configuration state registers, certain expensive operations, such as ensure in-order point and complete instruction in-order, are used less frequently, as described with reference to FIGS. 17A-17C. The processing of FIGS. 17A-17C is performed by a processor.

Figure 17A:
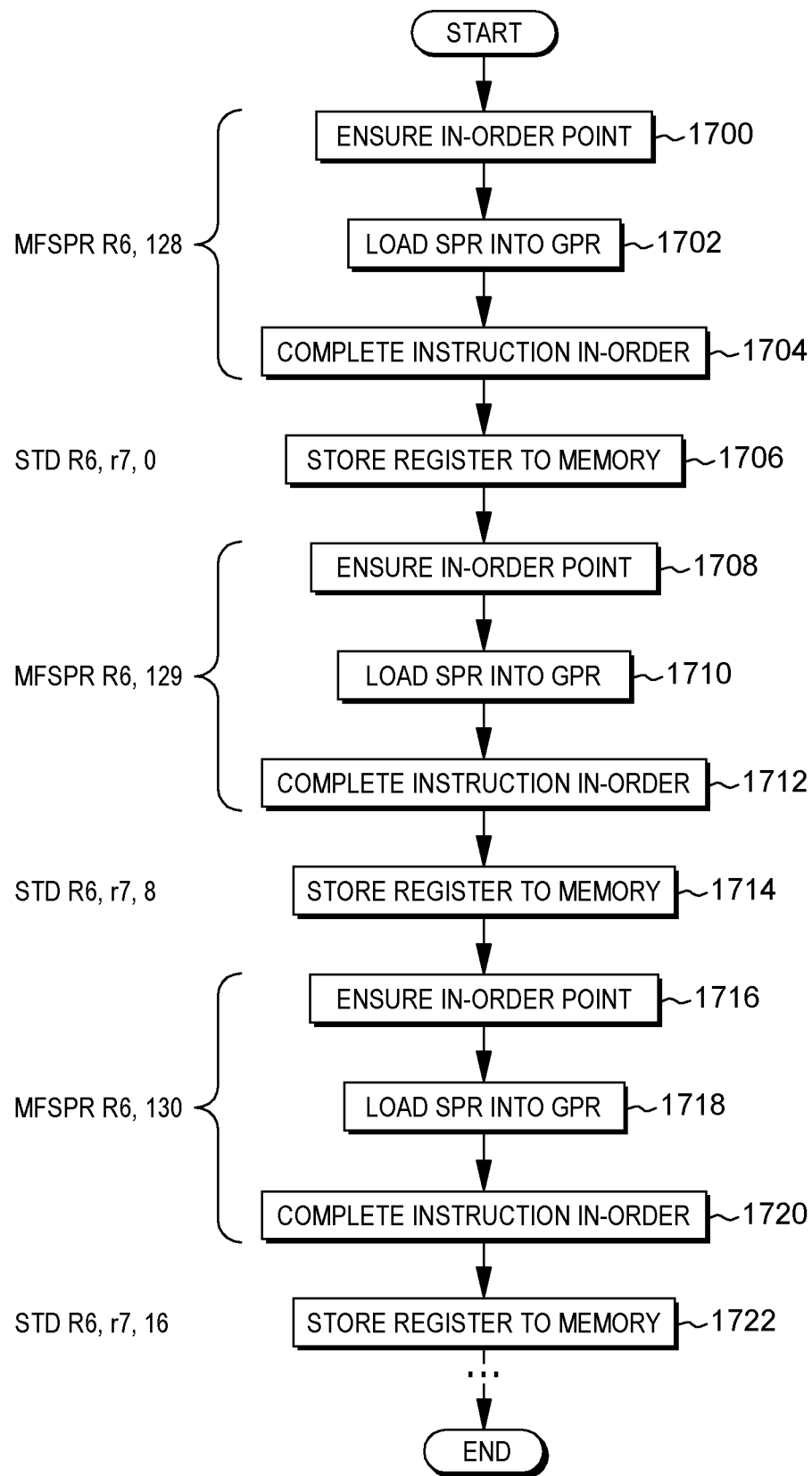
FIG. 17A depicts one example of multiple configuration state register store operations.
Figure 17B:
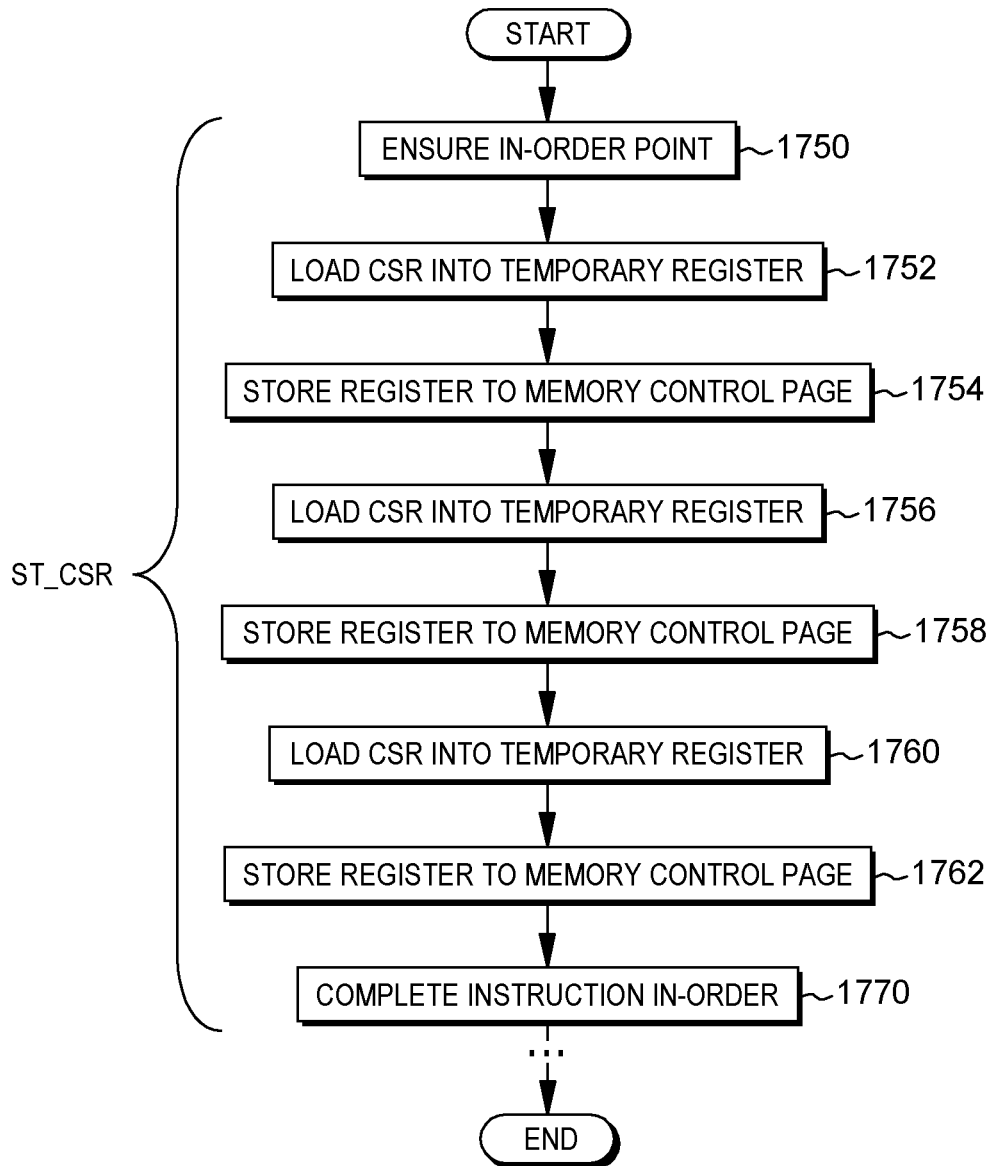
FIG. 17B depicts one example of a bulk store configuration state register operation, in accordance with an aspect of the present invention.
Figure 17C:
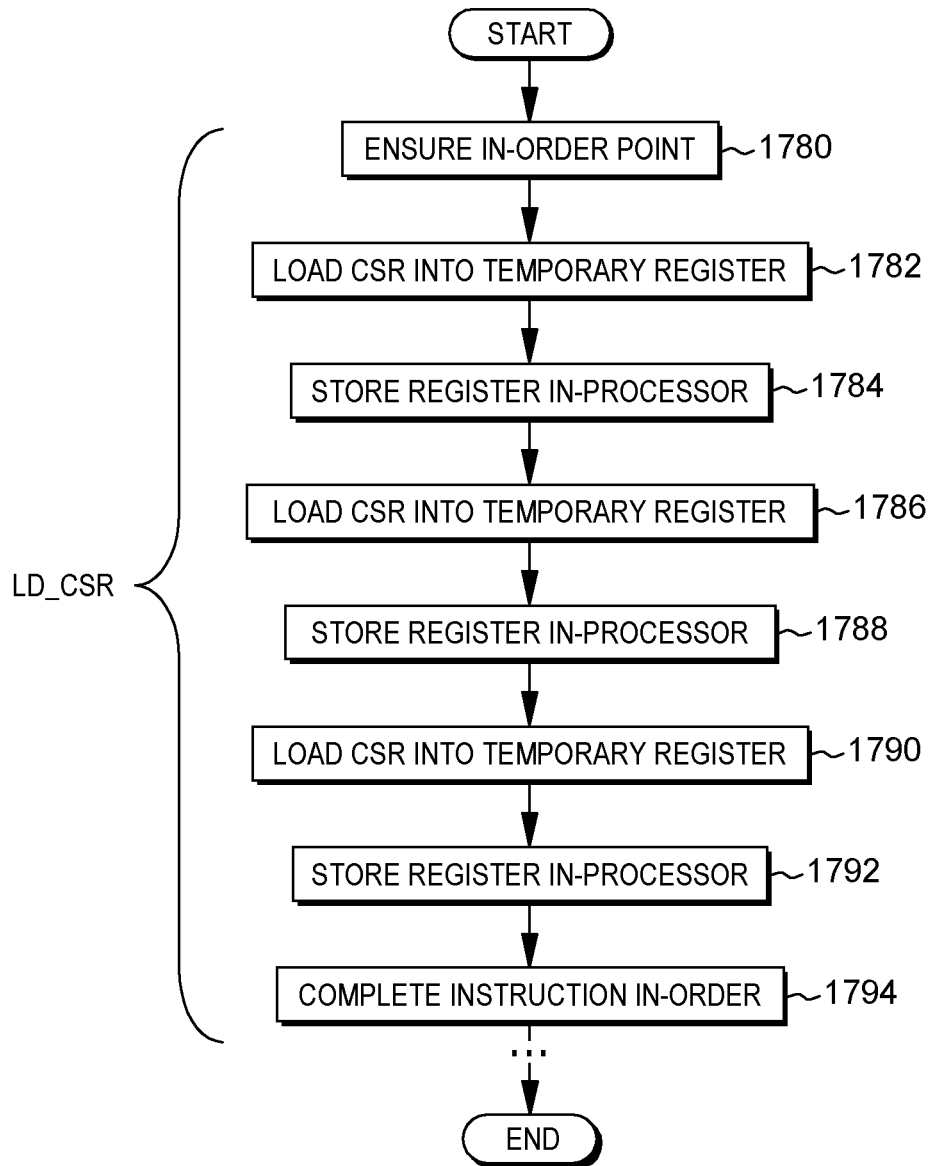
FIG. 17C depicts one example of a bulk load configuration state register operation, in accordance with an aspect of the present invention.

Referring to FIG. 17A, one example of using individual instructions (i.e., not a bulk operation) to store a plurality of configuration state registers to memory is described with reference to FIG. 17A. In one example, to move a configuration state register to memory, a move from configuration state register instruction and a store instruction are used. For instance, in one example, the configuration state register is an SPR and the move from configuration state register instruction is an mfspr. Other configuration state registers and corresponding instructions may be used.

In this example, based on execution of a mfspr instruction, such as a Move from SPR (mfspr) instruction, an in-order point is ensured, STEP 1700. Then, contents of the configuration state register (e.g., SPR) specified by the instruction are copied from the configuration state register into, e.g., a general purpose register (GPR), STEP 1702. The instruction is completed in-order, STEP 1704. Thereafter, via a store instruction (STD), contents of the general purpose register are stored to memory, STEP 1706. This same process is repeated for each configuration state register to be stored in memory (e.g., STEPS 1708-1722), which may be many configuration state registers. Thus, requiring an ensure in-order point and complete instruction in-order operation for each configuration state register to be stored to memory.

However, in accordance with an aspect of the present invention, a store configuration state register (ST_CSR) instruction is provided that stores multiple configuration state registers in memory using a single ensure in-order point and a single complete instruction in-order operation, as described with reference to FIG. 17B.

Referring to FIG. 17B, based on execution of a store configuration state register instruction (ST_CSR), an in-order point is reached, STEP 1750. Then, contents of a selected configuration state register are loaded into a temporary register, STEP 1752. Further, the contents of the temporary register are then stored to memory (e.g., a memory control page), STEP 1754. The load/store operations are repeated one or more times 1756-1762 for one or more additional configuration state registers. Subsequent to copying the chosen configuration state registers to memory (which may be many such registers), the instruction is completed in-order, STEP 1770.

In one example, the ST_CSR instruction does not have an operand to specify the registers to be copied; instead, all of the in-processor configuration state registers of the current context (e.g., process, thread, etc.) are copied. In another example, an operand may be included and used to specify one or more configuration state registers to be copied to memory. Other variations are also possible.

In a further example, multiple configuration state registers may be copied from memory to in-processor using a bulk load operation (e.g., LD_CSR).

Referring to FIG. 17C, based on execution of a load configuration state register (LD_CSR) instruction, an in-order point is ensured, STEP 1780. Then, contents of a selected configuration state register are obtained from memory and loaded into a temporary register, STEP 1782. Then, the contents of the temporary register are stored in a corresponding in-processor configuration state register, STEP 1784. The load/store operations are repeated one or more times 1786-1792 for one or more (and possibly many) additional configuration state registers. Thereafter, the instruction is completed in-order, STEP 1794.

In one example, the LD_CSR instruction does not have an operand to specify the registers to be copied; instead, all of the configuration state registers of the current context (e.g., process, thread, etc.) are copied. In another example, an operand may be included and used to specify one or more configuration state registers to be copied from memory.

In one aspect, an instruction to perform a bulk operation performs the same operation (e.g., a store, a load, etc.) on a group of configuration state registers, in which the group is defined by a common characteristic. The common characteristic may be, for instance, a numeric range of registers; having a same access permission or context (e.g., user, operating system, hypervisor); having a same functional purpose (e.g., exception handling, time keeping, etc.); or having a same implementation property (e.g., a set of configuration state registers being stored in-memory), as examples.

The use of bulk store and/or load operations improves processing within the computer. For instance, by using a bulk store operation to efficiently copy a plurality of configuration state registers to memory, context switch processing may be performed faster and more efficiently. Other benefits may also be realized.

In a further aspect, to facilitate processing, an architectural placement control is provided to indicate where in memory the configuration state registers are stored. For instance, hardware defines a set of controls to identify where in memory the configuration state registers are stored. As an example, at least one configuration state register is provided to specify the base address for storing the application state. As one example, the base address is a guest physical address, i.e., the guest operating system specifies an address in its own address space. For example, when an address is specified, a guest-level address (e.g., guest real, guest physical or guest virtual address) is specified, since allowing a guest to specify a host physical address may compromise virtualization and security.

Figure 18A:
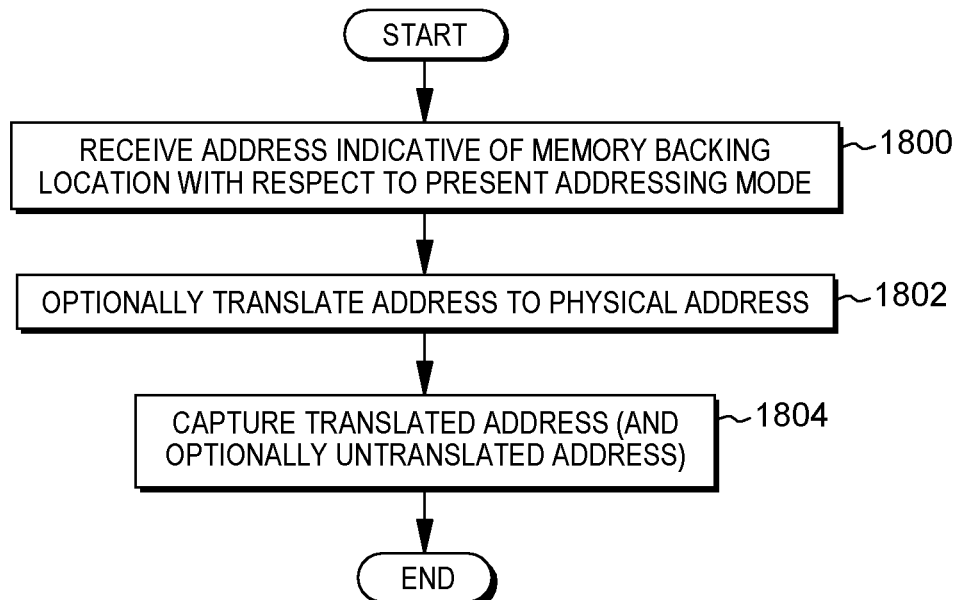
FIG. 18A depicts one example of specifying an architectural configuration control, in accordance with an aspect of the present invention.

Further details regarding specifying an architectural configuration control are described with reference to FIG. 18A. In one example, a processor performs this logic. Initially, an address indicative of a memory backing location (i.e., a base address) with respect to a present execution environment (e.g., application state, thread state, operating system state, hypervisor state, particular guest or host operating system level, etc.) is received, STEP 1800. For instance, a hypervisor uses hypervisor addresses (e.g., host virtual or absolute, physical, real addresses) and an operating system uses guest real or guest virtual addresses with respect to the virtual machine/logical partition. The processor obtains the address that indicates a location of the memory page to store configuration state registers (i.e., the base address).

Optionally, that base address is translated to a physical address, STEP 1802. (A translation may already have been performed or the address does not need to be translated.) In one embodiment, this translation may cause a page fault. In a further embodiment, collaborating hardware and software are used to avoid the page fault, e.g., by pinning the page prior to executing one or more aspects of the present technique.

Additionally, in one example, the translated address is captured, STEP 1804. That is, in one example, the translated address is cached. In another embodiment, both the untranslated and translated addresses are stored.

Figure 18B:
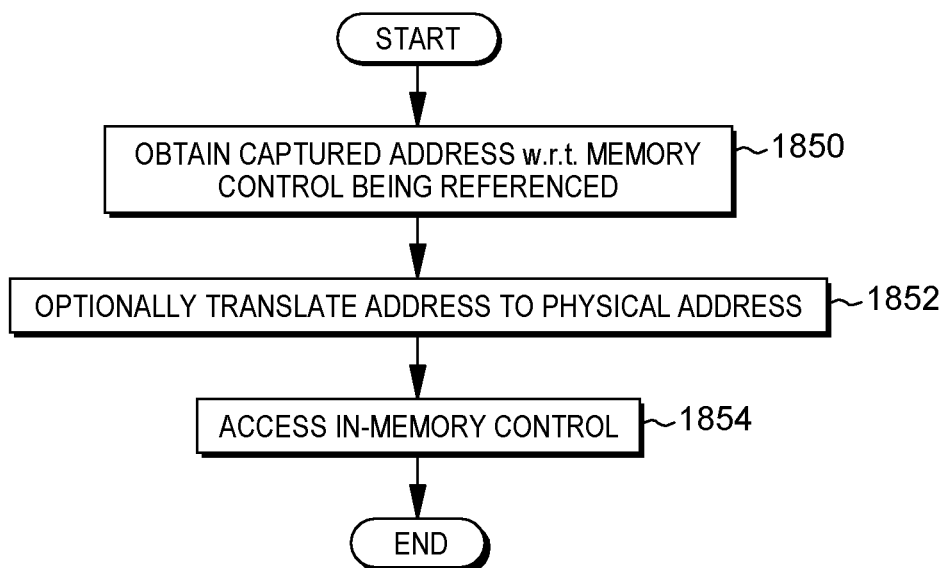
FIG. 18B depicts another example of specifying an architectural configuration control, in accordance with an aspect of the present invention.

In another embodiment with reference to FIG. 18B, a captured address with respect to the memory control (e.g., configuration state register) being referenced is obtained, STEP 1850. Additionally, the address may be translated to a physical address, STEP 1852, and the in-memory control (e.g., configuration state register) is accessed, STEP 1854. The translation may cause a page fault, but using collaborating hardware and software, the page fault may be avoided by, e.g., pinning the page prior to performing one or more aspects of the present technique.

In one embodiment, the base address is stored in a configuration state register, e.g., not in memory, to avoid a circular dependence. Other examples are possible.

Further, in one embodiment, the base address is translated to a physical/real address; and in another embodiment, the base address is translated to the next level's supervisory address (i.e., when an operating system sets a page address, it is translated to a supervisor address). Other examples are possible.

As an example, both the untranslated and translated (physical/real) base addresses are stored. This eliminates the need to perform address translation (e.g., dynamic address translation (DAT)) on every configuration state register access and to handle page faults.

In one embodiment, the translated (real/physical) base address is maintained in a processor register, and the untranslated base address is maintained in an in-memory-configuration state register. In such an embodiment, the untranslated address is provided responsive to a software request to read out the base address of the configuration state register again. The translated address may be used to access such an address from its in-memory location. Other possibilities exist.

As described herein, a control, such as a configuration state register, is provided that includes a base address specifying where in memory one or more in-memory configuration state registers are stored. These in-memory configuration state registers are registers architecturally defined to be in-processor registers, but, in accordance with one or more aspects of the present invention, have been converted to in-memory configuration state registers. These in-memory configuration state registers are different than configuration values that are stored in memory, since, at the very least, those values are not registers and they are architecturally defined to be in-memory. They are not architecturally defined processor registers.

In a further aspect, efficiencies are achieved during a context switch between the program environment and, for instance, the operating system or other supervisor environment and/or between different applications or threads, etc. When a context switch is to be performed, data for a previous context is saved. In one example, to save the context data, contents of the configuration state registers are read out of the in-processor registers and saved to memory.

Then, the data for the next context is loaded, which includes loading the configuration state registers to resume execution. This is an expensive process.

Even, in accordance with an aspect of the present invention, with in-memory configuration state register execution, in which store queue based speculation and out-of-order execution accelerate this process, there are still significant costs associated with saving and restoring context.

Therefore, in accordance with an aspect of the present invention, the context switch is performed by configuration state register page manipulation. In one example, the location of configuration state register in-memory storage is configurable. When switching contexts, instead of copying old configuration state register data out of a configuration state register memory unit (e.g., page) and copying new data into the configuration state register page, a different configuration state register memory unit (e.g., page) is selected, thereby changing the values of configuration state registers seen by the processor.

In accordance with an aspect of the present invention, a context switch is performed by modifying the base pointer or base address (referred to herein as base) included in, e.g., a base configuration state register (referred to herein as a base register) that indicates a location in memory for one or configuration state registers (referred to herein as CSR backing memory), to avoid the need for unloading and reloading the configuration state registers.

There may be several types of context switches that may benefit from this aspect, including an operating system context switch, in which the operating system performs a switch between different applications; a hypervisor context switch, in which a hypervisor or virtual machine monitor switches between different partitions or virtual machines; and a hardware thread context switch between different hardware threads. Each context switch affects different registers. For instance, when switching out an application as part of an operating system used context switch, a few configuration state registers corresponding to the application are changed to another location, but not other configuration state registers (e.g., not the operating system configuration state registers). Further, with hypervisor context switching, there may be more registers to be switched out. Similarly, for a hardware thread context switch. Further details regarding a hardware thread context switch are described below.

In one embodiment, for a hardware thread context switch, the processor uses a thread scheduler to select from a plurality of threads loaded into the processor. In accordance with an aspect of the present invention, however, hardware may select from a plurality of threads that can be scheduled by the hardware, in which the plurality exceeds the number of hardware thread contexts loaded in the processor. That is, in accordance with an aspect of the present invention, the ability to context switch, as described herein, allows the hardware to use more threads than loaded in the processor. The thread is selected, and the hardware schedules the thread by selecting that thread's in-memory configuration information. In one embodiment, some of the executable registers are stored in a register file on-chip or a fast second level storage. In another embodiment, general registers are also stored to an in-memory configuration page and loaded therefrom when a thread is scheduled. This is performed either on demand (e.g., each register when first accessed), or in bulk (e.g., all registers at a scheduled time).

In one embodiment, rather than having a software agent (e.g., operating system or hypervisor) decide to change a pointer to another configuration state register base, the hardware, responsive to a hardware criterion, adjusts the base pointer itself. One of the plurality of threads is selected in hardware and based on the plurality of threads, one of the pointers to a system memory page having configuration state registers is selected.

Figure 19A:
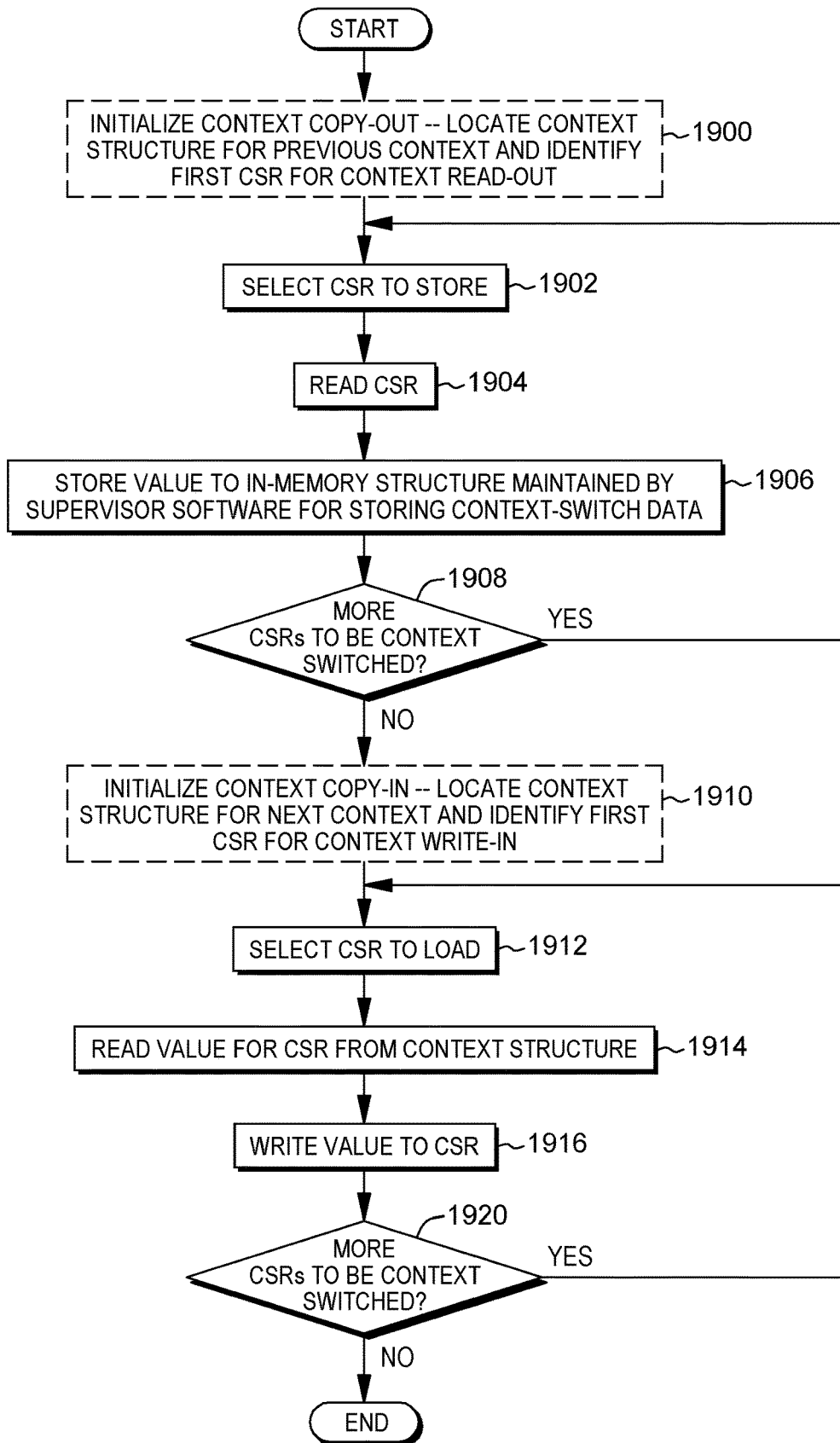
FIG. 19A depicts one example of performing a context switch, in accordance with an aspect of the present invention.
Figure 19B:
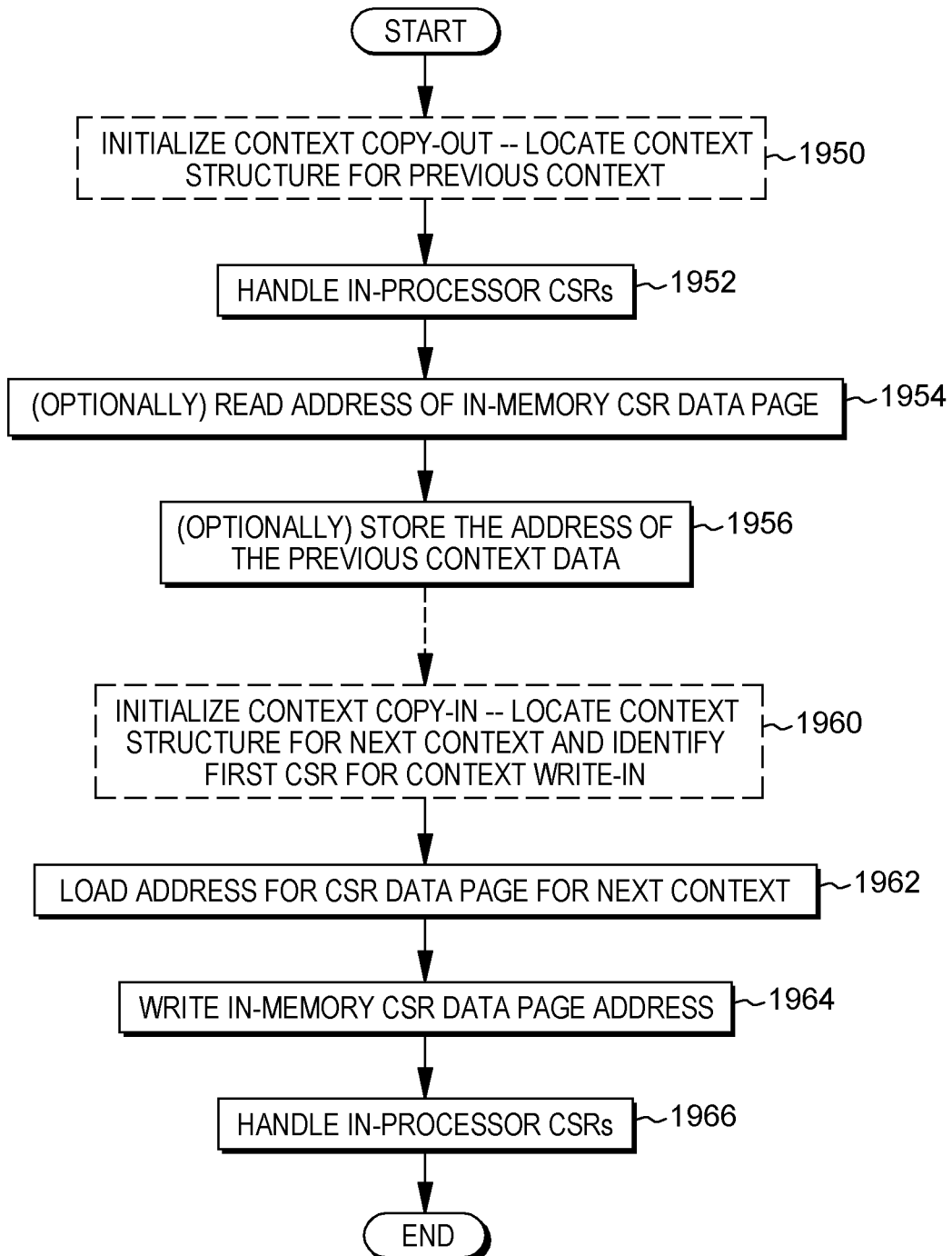
FIG. 19B depicts another example of performing a context switch, in accordance with an aspect of the present invention.

Further details relating to performing a context switch are described with reference to FIGS. 19A and 19B. FIG. 19A depicts one process for performing a context switch, in which the data is copied; and FIG. 19B depicts another process for performing a context switch, in which pointers are modified in accordance with an aspect of the present invention.

Referring initially to FIG. 19A, when a context switch is to be performed, a context copy-out is initialized to copy-out the old context data, STEP 1900. This includes locating the context structure (e.g., a supervisor structure) for a previous context and identifying a first configuration state register for the context to be read-out.

As examples, the context can be one of a virtual machine, a logical partition, a process, a thread, etc. The copy-out process continues.

The configuration state register to be stored is selected, STEP 1902. In this iteration, it is the configuration state register identified above. The selected configuration state register is read, STEP 1904, and the contents of the configuration state register are stored to an in-memory structure maintained by, e.g., the supervisor software (or hardware) for storing context-switch data, STEP 1906. Next, a determination is made as to whether there are more configuration state registers to be context switched, INQUIRY 1908. If so, then processing continues with STEP 1902.

Subsequent to copying-out the data for the previous context, a copy-in process is performed for the new context. Thus, a context copy-in is initialized, in which the context structure for the next context is located and the first configuration state register for the context write-in is identified, STEP 1910. The configuration state register to be loaded in-memory is selected, STEP 1912, and the content for the selected configuration state register is read from a context structure (e.g., a supervisor structure), STEP 1914. The read context data is written to the configuration state register in-memory, STEP 1916. A determination is made as to whether there are more configuration state registers to be context switched, INQUIRY 1920. If so, then processing continues with STEP 1912. Otherwise, processing is complete.

Referring to FIG. 19B, another example of a context switch process in accordance with an aspect of the present invention is described. In this example, instead of copying the data, pointers to the data are manipulated. Initially, a context copy-out is initialized, in which the context structure (e.g., supervisor or hardware structure) for a previous context is located, STEP 1950. Again, the context can be one of a virtual machine, a logical partition, a process, a thread, etc. Next, in-processor configuration state registers are handled, STEP 1952, such that the contents of the registers are stored in memory. In one embodiment, this is accomplished using, for instance, a copy loop, as described with reference to FIG. 19A. In another embodiment, this is accomplished using, for instance, a bulk copy operation (e.g., ST_CSR).

The address of the in-memory configuration state register data unit (i.e., e.g., the address of the memory page used to store the configuration state registers for this context (the base address)) may be read, STEP 1954, and stored to a context structure, STEP 1956. In one example, this address does not change, so there is no need to repeatedly read it and store it to the context structure. Instead, it is stored the first time or when that page is moved to a new location. The value is stored to an in-memory structure maintained, by, e.g., the supervisor software or hardware, for storing context-switch data.

Subsequent to performing the copy-out process, a copy-in process is utilized to point to the new context data. Thus, a context copy-in process is initialized, in which the context structure (e.g., supervisor or hardware structure) is located for the next context and a first configuration state register is identified for the context write-in, STEP 1960. The address for the configuration state register data unit for the next context is loaded, STEP 1962. That is, for instance, the address of the memory page (the base address) to store the configuration state registers for the new context is obtained. Additionally, the in-memory configuration state register data page address (base address) is written, STEP 1964. Further, the in-processor configuration state registers are handled, STEP 1966. As an example, the in-processor configuration state registers for this context are loaded from memory, e.g., using a copy loop or a bulk load (e.g., LD_CSR).

As described above, pointer manipulation may be used in context switching. This is also true for virtual machine migration.

In one embodiment, in-memory registers may be used to accelerate virtual machine (or logical partition) migration and/or live machine migration. In one example, pages are migrated in accordance with conventional techniques; however, in-memory configuration state registers are not moved. As an example, an ST_CSR instruction or operation is used to capture the in-processor configuration state registers, but no configuration state registers are moved. Rather, the in-memory configuration memory page is moved.

In a further embodiment, for live machine migration, the in-memory configuration state register state(s) are moved, when the machine has been quiesced. This may include multiple pages if there are multiple contexts (e.g., multiple threads/processes etc.).

In one embodiment, when the host and target migration formats (e.g., when configuration state registers are mapped to different offsets within an in-memory configuration register page by different implementation of an architecture) are not compatible, an adjustment is performed by the migration agent. In one such embodiment, an architectural or microarchitectural version number of configuration state register formats is provided and the receiving system is responsible for adjusting the layout. In another embodiment, a receiving and sending system negotiate a transfer format. In another embodiment, a transfer format is defined, e.g., a linear list of configuration state register values or a <key, value> pair, in which the key is a configuration state register number and the value is the value of the configuration state register.

In yet other embodiments, processors may support multiple versions of layouts, adapting the remap logic based on an externally configured configuration state register layout map (e.g., software specifies by loading a layout identifier into a configuration state register).

In at least some processor embodiments, the design may cache some values in custom in-processor locations for registers that are identified as in-memory registers. Thus, when performing a context switch, cached copies are to be synchronized, i.e., invalidate old cached values. In one example, a context sync instruction (csync) is provided, which indicates to the processor to invalidate old cached values. This is executed, for instance, each time a context switch is performed. In one example, the cached values corresponding to all the configuration state registers for a context are invalidated. In other examples, cached values for specific registers are invalidated.

As described herein, on a context switch, a new page may be indicated, instead of copying the configuration state registers. This way, the configuration state register context image is already saved, and reduces the context switch, at least for configuration state registers maintained in-memory.

Further, in one embodiment, a context switch with page replace is enabled. A memory image (at least for those registers that should live in memory) is synced before loading a new memory context page.

In accordance with one embodiment, configuration state register sync instructions are provided. Specifically, this may flush any cached values, and suppress caching after the switch has been performed, and conversely may indicate that it may save values to the cache again. Example instructions include:

| | |
|---|---|
| Sync outgoing CSRs: | sync_o_CSR |
| Load new backing page | mtspr TCBR, next_u->spr_page |
| Sync incoming SPRs | sync_i_CSR |

In another embodiment, a move to configuration state register instruction (e.g., mtspr instruction) to a base register (e.g., TCBR) automatically performs synchronization of cached outgoing and incoming values.

In a further aspect, based on loading a guest base address, which indicates a location in memory used to store one or more in-memory configuration state registers and may be stored in a base configuration state register, address translation from the guest base address to a corresponding host base address is performed, in order to avoid the potential of a page fault. This translation is performed, e.g., immediately; i.e., based on receiving the base address and prior to using the base address, e.g., during a storage reference. For example, when a virtual address is loaded into a base register (e.g., a load to base, such as loading a guest base address in a configuration state base register (e.g., TCBR) to be used as a base address), the system automatically performs an address translation to a physical memory address, and the translated physical address is captured in conjunction with the virtual address. In accordance with one architectural embodiment, a load to the base register is identified as an instruction causing or may cause a translation to be performed.

When an address cannot be translated, a translation fault is taken. The page is to be accessible for read and write in accordance with specified permissions in, for instance, a page table entry (described below), or a page fault is raised.

Figure 20:
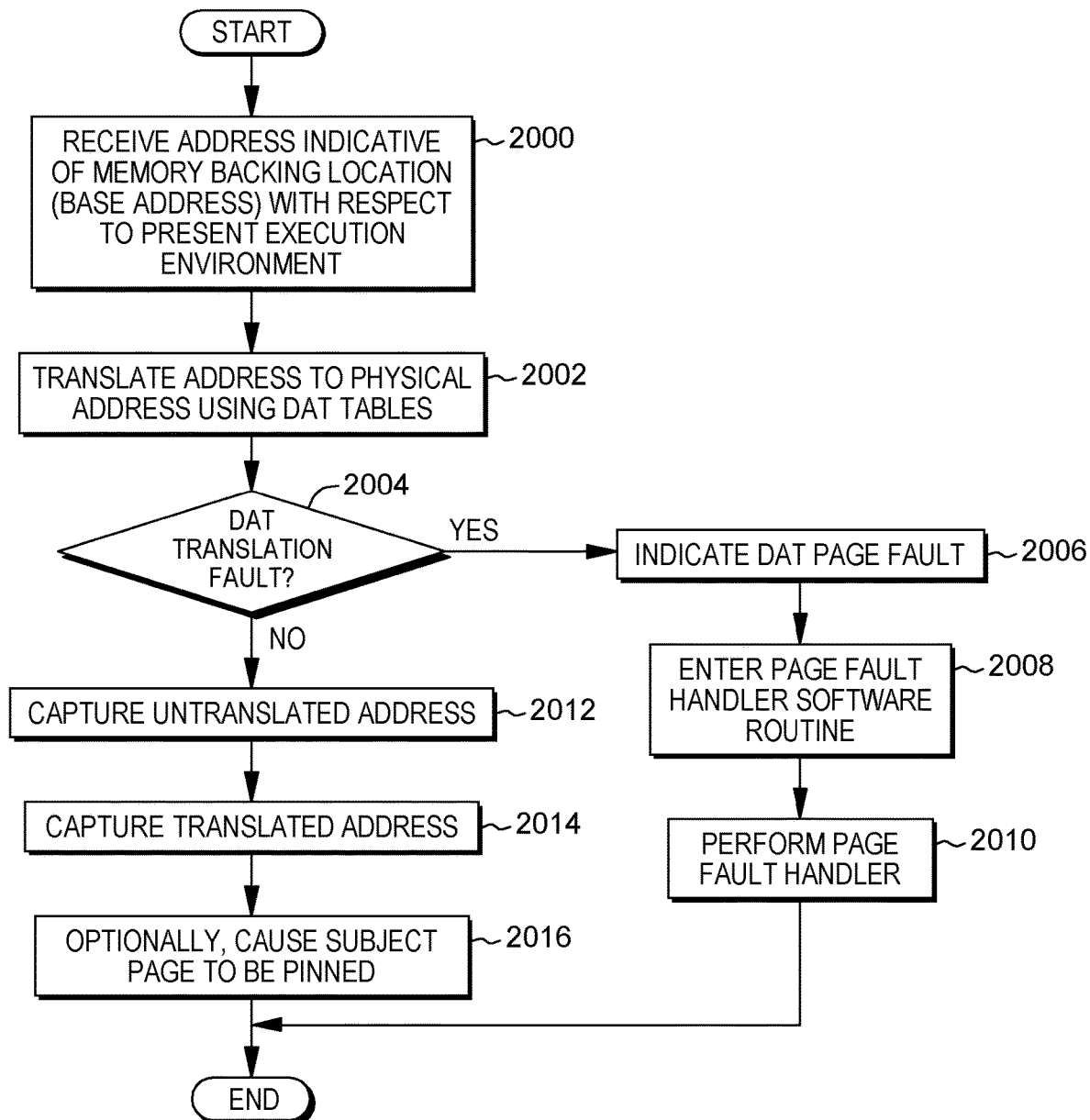
FIG. 20 depicts one embodiment of address translation associated with a move to configuration state register operation, in accordance with an aspect of the present invention.

Further details regarding automatically performing an address translation based on execution of an operation that causes or may cause a translation of a base address to be performed are described with reference to FIG. 20. This processing is performed by a processor, and in one example, this processing is performed based on execution of a move to configuration state register instruction (e.g., an mtspr instruction) to a configuration state register memory base register. It may also be performed based on execution of other instructions.

Based on executing the instruction, an address indicative of a memory backing location (e.g., a base address) with the respect to the present execution environment is received, STEP 2000. In accordance with one definition of the mtspr, the mtspr is defined to possibly incur a dynamic address translation (DAT) page fault. Thus, in accordance with an aspect of the present invention, address translation is automatically performed as part of the mtspr, even before determining a translation is needed.

The received base address is translated to a physical base address using, e.g., DAT tables, an example of which is further described below, STEP 2002. A determination is made as to whether a DAT translation fault has occurred, INQUIRY 2004. If a DAT translation fault has occurred, a DAT page fault is indicated, STEP 2006. A page fault handler software routine is entered, STEP 2008, and the page fault handler is performed, STEP 2010. In one example, in accordance with a page fault handler, the instruction is restarted, if it was a permissible fault (e.g., paged out). Otherwise, the context or execution environment (e.g., operating system, hypervisor, virtual machine, thread, process, etc.) receives an error indication, possibly causing the context's termination.

Returning to INQUIRY 2004, if there is no DAT translation fault, the untranslated base address is captured (e.g., stored in a register), STEP 2012. Further, the translated base address is captured (e.g., cached), STEP 2014. Optionally, the subject page is pinned, STEP 2016.

Figure 21A:
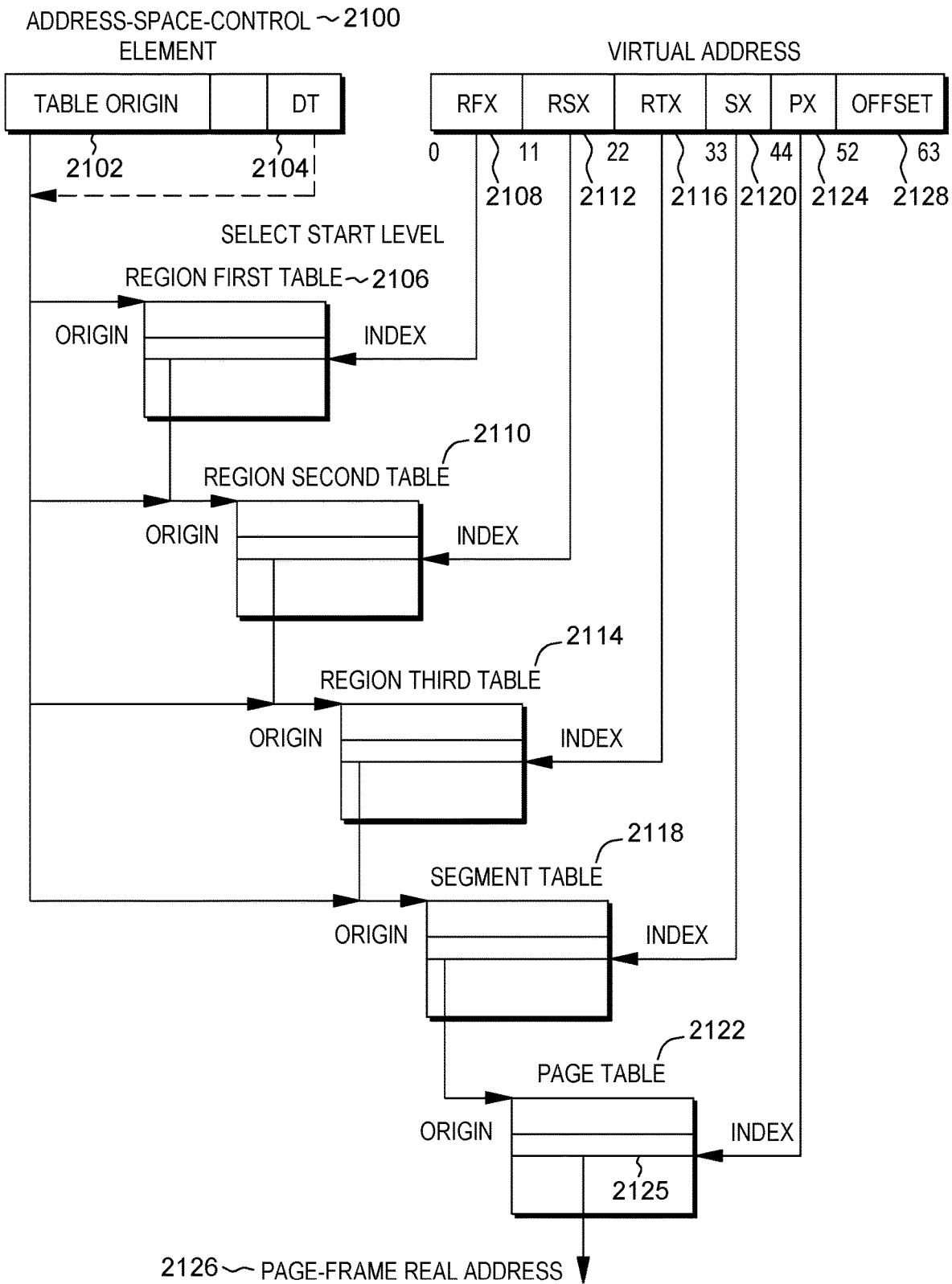
FIGS. 21A-21B depict examples of performing dynamic address translation, in accordance with aspects of the present invention.
Figure 21B:
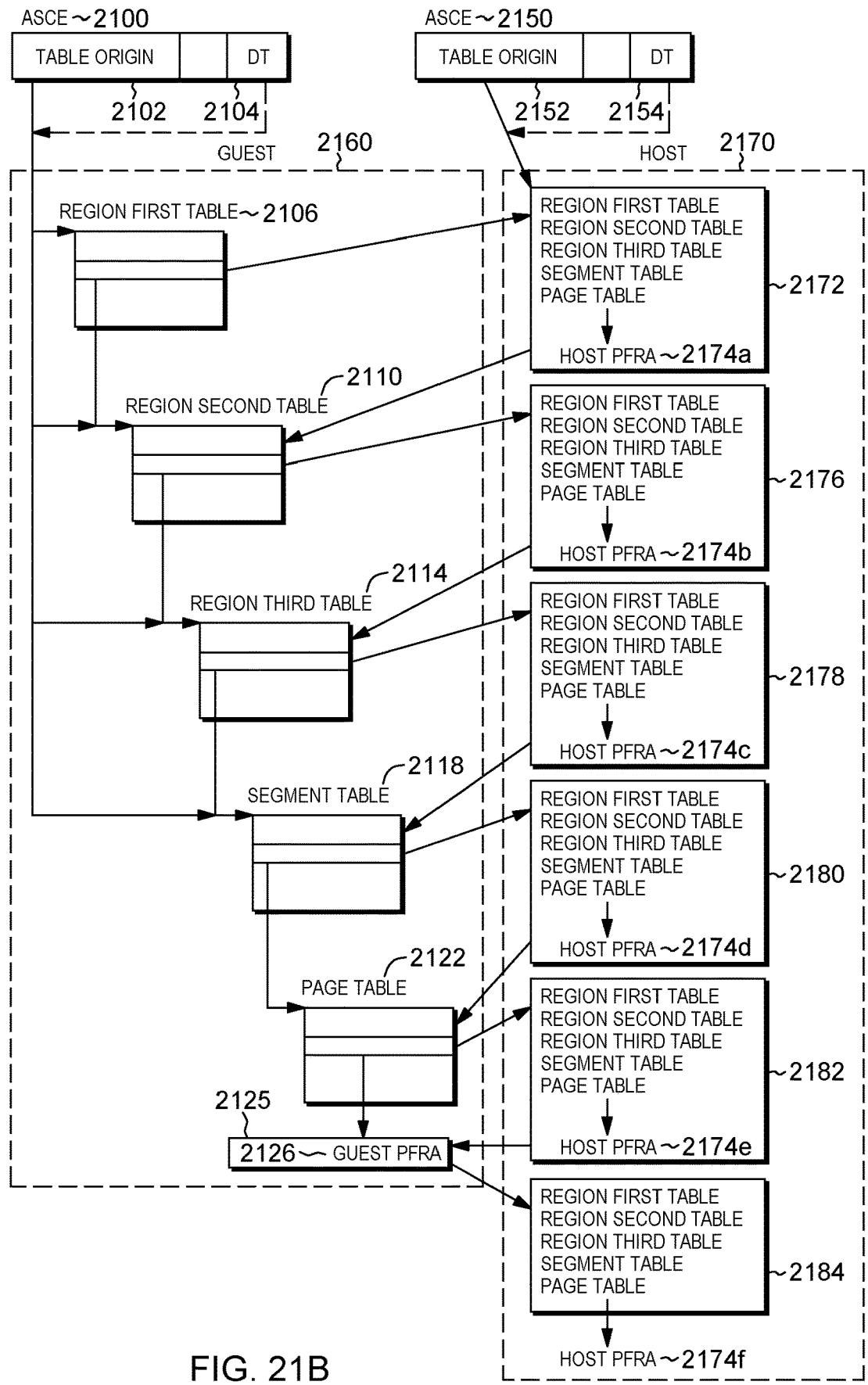

Further details regarding one example of dynamic address translation are described with reference to FIGS. 21A-21B. This processing is performed by a processor.

Dynamic address translation is the process of translating a virtual address into the corresponding real (or absolute) address. Dynamic address translation may be specified for instruction and data addresses generated by the CPU. The virtual address may be a primary virtual address, a secondary virtual address, an AR (Access Register)-specified virtual address, or a home virtual address. The addresses are translated by means of the primary, the secondary, an AR-specified, or the home address space control element (ASCE), respectively. After selection of the appropriate address space control element, the translation process is the same for all of the four types of virtual addresses. An address space control element may be a segment table designation or a region table designation. A segment table designation or region table designation causes translation to be performed by means of tables established by the operating system in real or absolute storage.

In the process of translation when using a segment table designation or a region table designation, three types of units of information are recognized—regions, segments, and pages. The virtual address, accordingly, is divided into four fields. In one example, for a 64-bit address, bits 0-32 are called the region index (RX), bits 33-43 are called the segment index (SX), bits 44-51 are called the page index (PX), and bits 52-63 are called the byte index (BX). The RX part of a virtual address is itself divided into three fields. Bits 0-10 are called the region first index (RFX), bits 11-21 are called the region second index (RSX), and bits 22-32 are called the region third index (RTX), in one embodiment.

One example of translating a virtual address to a real address is described with reference to FIG. 21A. This process is referred to herein as a DAT walk (or a page walk) in which the address translation tables are walked to translate one address (e.g., a virtual address) to another address (e.g., a real address). In this example, an address space control element (ASCE) 2100 includes a table origin 2102, as well as a designation type (DT) control 2104, which is an indication of a start level for translation (i.e., an indication at which level in the hierarchy address translation is to begin). Using table origin 2102 and DT 2104, the origin of a particular table is located. Then, based on the table, bits of the virtual address are used to index into the specific table to obtain the origin of the next level table. For instance, if the region first table (RFT) 2106 is selected, then bits 0-10 (RFX) 2108 of the virtual address are used to index into the region first table to obtain an origin of a region second table 2110. Then, bits 11-21 (RSX) 2112 of the virtual address are used to index into region second table (RST) 2110 to obtain an origin of a region third table 2114. Similarly, bits 22-32 (RTX) 2116 of the virtual address are used to index into region third table (RTT) 2114 to obtain an origin of a segment table 2118. Then, bits 33-43 (SX) 2120 of the virtual address are used to index into segment table 2118 to obtain an origin of page table 2122, and bits 44-51 (PX) 2124 of the virtual address are used to index into page table 2122 to obtain a page table entry (PTE) 2125 having a page frame real address (PFRA) 2126. The page frame real address is then combined (e.g., concatenated) with offset 2128 (bits 52-63) to obtain a real address. Prefixing may then be applied, in one embodiment, to obtain the corresponding absolute address.

Another example of address translation is described with reference to FIG. 21B. In this example, a DAT walk is performed to translate an initial guest virtual address to a final host real address. In this example, address space control element (ASCE) 2100 is a guest address space control element, and DT 2104 of ASCE 2100 indicates that guest translation determined by guest address translation structure 2160 is to start at region first table 2106 pointed to by table origin 2102. Thus, the appropriate bits of the initial guest virtual address (e.g., RFX 2108) are used to index into region first table 2106 to obtain a pointer of an entry of the region first table. The address of the region first table entry (RFTE) is a guest real or absolute address. This guest real or absolute address, with the main storage origin and limit applied, when appropriate, corresponds to a host virtual address. This intermediate host virtual address is then translated using host address translation structures 2170. In particular, address space control element (ASCE) 2150 is a host address space control element used to indicate a start level for translation in host address translation structures 2172. Based on the start level (e.g., region first table) indicated by DT 2154, the particular bits of the host virtual address are used to index into the indicated table with table origin 2152 to be used for translation using host address translation 2172, as described with reference to FIG. 21A. The translation of the host virtual address corresponding to the guest RFTE continues until a host page frame real address (PFRA) 2174*a* is obtained.

Data at the intermediate host page frame real address is a pointer to the next level of guest address translation structures (e.g., guest region second table 2110, in this particular example), and translation continues, as described above. Specifically, host address translation structures 2176, 2178, 2180 and 2182 are used to translate the intermediate host virtual addresses associated with the guest region second table 2110, region third table 2114, segment table 2118 and page table 2122, respectively, resulting in host PFRAs 2174*b*, 2174*c*, 2174*d* and 2174*e*, respectively. Host page frame real address 2174*e* includes the address of a guest page table entry 2125. Guest page table entry 2125 includes a guest page frame real address 2126, which is concatenated with the offset from the initial guest virtual address to obtain the corresponding guest absolute address. In some cases, the main storage origin and limit are then applied to calculate the corresponding host virtual address, which is then translated, as described above, using address translation structures 2184 to obtain host page frame real address 2174*f*. The host page frame real address is then combined (e.g., concatenated) with the offset (e.g., bits 52-63) of the host virtual address to obtain the final host real address. This completes translation of a guest virtual address to a host real address.

Although in the above examples, translation starts at the region first table, this is only one example. Translation may start at any level for either the guest or the host.

In one embodiment, to improve address translation, the virtual address to real or absolute address translation mapping is stored in an entry of a translation look-aside buffer (TLB). The TLB is a cache used by the memory management hardware to improve virtual address translation speed. The next time translation for a virtual address is requested, the TLB will be checked and if it is in the TLB, there is a TLB hit and the real or absolute address is retrieved therefrom. Otherwise, a page walk is performed, as described above.

As indicated, guest translations may be included in the TLB. These entries may be composite guest/host entries which implicitly include one or more host translations. For example, a guest virtual TLB entry may buffer the entire translation from the initial guest virtual address down to the final host real or absolute address. In this case, the guest TLB entry implicitly includes all intermediate host translations 2172, 2176, 2178, 2180 and 2182, as well as the final host translation 2184, as described in FIG. 21B above. In another example, a hierarchical TLB may contain an entry in a first level of the TLB which buffers a translation from the initial guest virtual address down to the associated origin of the guest page table 2122 and a separate entry from a second level of the TLB which buffers the translation from the guest page table entry address down to the final host real or absolute address. In this example, guest entries in the first level of the TLB implicitly include intermediate host translations 2172, 2176, 2178 and 2180 which correspond to the host translations which back guest region and segment tables, and guest entries in the second level implicitly include intermediate host translation 2182 which backs the guest page table and final host translation 2184, as described in FIG. 21B. Many implementations of a translation look-aside buffer are possible.

In the above examples, the page frame real address is included in a page table entry of a page table. The page table includes one or more entries, and further details of a page table entry are described with reference to FIG. 22.

In one example, a page table entry (PTE) 2200 is associated with a particular page of memory and includes, for instance:
(a) Page Frame Real Address (PFRA) 2202: This field provides the leftmost bits of a real (e.g., host real) storage address. When these bits are concatenated with the byte index field of the virtual address on the right, the real address is obtained.
(b) Page Invalid Indicator (I) 2204: This field controls whether the page associated with the page table entry is available. When the indicator is zero, address translation proceeds by using the page table entry. When the indicator is one, the page table entry cannot be used for translation.
(c) Page Protection Indicator 2206: This field controls whether store accesses are permitted into the page.
(d) Pinning indicator 2208: This field is used, in accordance with an aspect of the present invention, to indicate whether this page is to be pinned. In one example, a one indicates it is to be pinned, and a zero indicates it is not to be pinned.

A page table entry may include more, fewer and/or different fields than described herein. For instance, in the Power Architecture, the PTE may include a reference indicator that indicates whether a corresponding block of memory has been referenced, and/or a change indicator that indicates that a corresponding block of memory has been stored into. Other variations are possible.

In yet a further aspect of the present invention, configuration state registers are separated and assigned based on host and guest attributes, context and/or execution environment (e.g., thread state, application state, operating system state, hypervisor state, particular guest or host operating system level, etc.), as examples, in order to enable increased management flexibility. As examples, configuration state registers may be separated by hypervisor, operating system, application, thread number or other execution environments, etc.

As particular examples, hypervisor privilege configuration state registers are stored in a hypervisor assigned unit of memory (e.g., page); operating system privilege configuration state registers are stored in an operating system unit of memory (e.g., page), and so forth. Further, when multiple threads are supported and configuration state registers are replicated for each thread, then separate units of memory (e.g., pages) may be supported for each thread. An example of such separation is depicted in FIG. 23.

Figure 23:
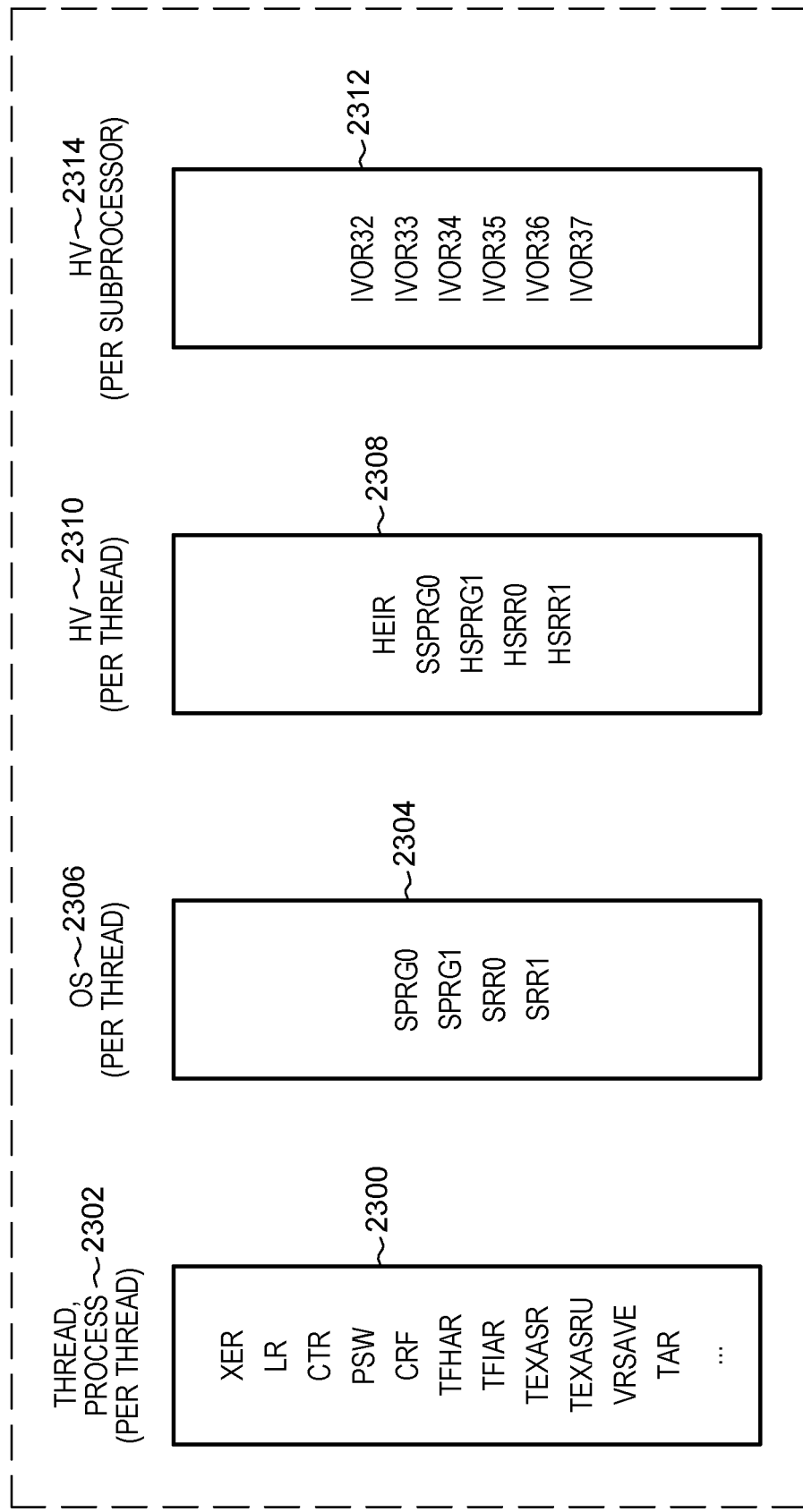
FIG. 23 depicts one example of particular configuration state registers being associated with particular contexts, in accordance with an aspect of the present invention.

As shown in FIG. 23, one set of configuration state registers 2300 is used by a thread or process 2302; another set of configuration state registers 2304 is used by an operating system 2306; a yet further set of configuration state registers 2308 is used by a hypervisor 2310; and still another set of configuration state registers 2312 is used by a hypervisor 2314. Other examples are also possible.

In one example, the configuration registers for a particular execution environment are statically defined for that execution environment, and include those registers readable or writable by the execution environment. In a further example, the registers are dynamically assigned based on use. Other examples are also possible.

In one embodiment, a separate memory region (e.g., as a multiple of an allocatable translation unit) is assigned to each separately controllable execution environment (e.g., thread, process, operating system, hypervisor), and therefore, the set of configuration state registers associated with that execution environment is assigned to that memory region. As an example, configuration state registers are assigned to a corresponding memory area, based on logical ownership, since some configuration state registers may be accessible from multiple execution environments (e.g., read accessible from an operating system, and read/write (R/W) from a hypervisor).

Although different execution environments may have different privilege levels, in one aspect, a higher level privilege level has access control to lower levels. A specific privilege level may be specified with LD_CSR and ST_CSR instructions, and sync operations described herein.

In one example, the configuration state register numbers are remapped, as described above; i.e., indices of configuration state register numbers are compacted to co-locate registers with respect to each grouping.

By providing a specific set of registers per execution environment, certain types of processing are facilitated, including context switching. As described above, the assigning of specific sets of registers based on execution environment and assigning separate memory units to those sets, facilitates the managing of the registers, as well as processes that use those registers, including context switching.

As described herein, a context switch may be performed by changing a base address pointer in a configuration state base register, rather than unloading and reloading the configuration state register state. To accomplish this, a user mode state is to be independently switchable from supervisor state in order to switch user contexts; an operating system state is to be independently switchable from hypervisor state in order to switch virtual machines; and a per-hardware thread or subprocessor state is to be independently switchable, if those are to be switched independently from other threads/sub-processors. The separate memory regions and separately assignable configuration state registers facilitate this.

In accordance with one aspect of the present invention, separate configuration state base registers designate the location (base) of each grouping of in-memory configuration state registers. Further, in at least one embodiment, access control to each of the base registers is to have suitable access permissions. As examples, for contexts to be switched by the operating system, an operating system privilege is a minimum prerequisite to modify the base register; and for contexts to be switched by the hypervisor, a hypervisor privilege is the minimum prerequisite to modify such base registers, and so forth.

In a further aspect, a capability is provided to prevent the moving of a memory unit (e.g., a page) by host level software (such as a hypervisor or virtual machine monitor) that provides the storage for one or more configuration state registers (i.e., the CSR backing memory). In one example, this includes pinning the memory unit and providing an indication of automatic pinning for the CSR backing memory.

When a configuration state register indicating the base of memory that provides the storage for one or more configuration state registers (i.e., the base register, such as TCBR) is written, an indication is provided to the host of the present guest, in accordance with an architectural specification. In at least one embodiment, the indication corresponds to an exception. In one embodiment, an exception type indicates a write event to a configuration state base register. Responsive to receiving an indication of a configuration state base register change, at least one host supervisor software (e.g., a hypervisor or a virtual machine monitor) performs operations to update page pinning information. In one aspect of the invention, updating pinning information includes recording the address of a pinned CSR backing memory page or setting a pinning indicator corresponding to the page. In another aspect, updating pinning information further includes unpinning of a previously pinned CSR backing memory page by removing a previously recorded address for a particular configuration state base register from a pool of one or more recorded addresses corresponding to pinned CSR backing memory or resetting the pinning indicator.

In accordance with one aspect of the present invention, these updates ensure that the one or more host levels do not page out or move CSR backing memory, thereby invalidating a cached address translation, or otherwise causing an update to a configuration state register causing a page translation fault. In another aspect of the present invention, pinning information may also be used to move the location of CSR backing memory, by providing notice of its location, and giving one or more hosts the opportunity to update any cached translations.

Further, in order to support multi-level guest schemes, the instruction that initializes the base register that points to the memory backing the configuration state registers (the CSR backing memory) may further be specified to transitively raise exceptions at multiple levels of host so as to ensure suitable pinning. In one embodiment, only one level of host is notified, and that host will cause pinning by HCALLs (hypervisor calls) as/when appropriate.

By pinning memory backing pages for configuration state registers in memory, page faults are avoided when a configuration state register is accessed. This may be unexpected by the software, and cause panic( ) in some software, such as for example, when software checks what instruction caused a trap and finds it was an instruction not defined to access memory that caused a data page fault. Panic( ) is a call in operating systems performed when an unexpected event happens and usually results in a system crash.

Pinning is also used, for instance, to avoid circular exceptions (e.g., when the page used for exception-related configuration state registers is not available, a page fault exception for that page would have to be raised, etc.); and to ensure a fast response (e.g., to exceptions and other external events that involve configuration state register handling).

In one embodiment, pinning is performed in software. For instance, as described below, pinning may be performed using hypervisor calls (HCALL) in conjunction with a software context switch in a paravirtualized environment.

In one embodiment, when a context (e.g., a thread context, or a process context, or a logical partition context, or a virtual machine context, or an operating system context, and so forth) is initialized by supervisory software, the supervisor allocates memory to provide storage for one or more configuration state registers corresponding to the context being initialized.

In one example, this may be performed by calling an allocation routine providing memory of suitable alignment and size. In accordance with at least one embodiment, the returned address is stored in a memory area storing information corresponding to the context. In one embodiment, this memory area is referred to as the "u area" and denoted by the variable "u". In at least one embodiment, the variable u is a record, struct, class or other composite data type with a plurality of members corresponding to various attributes to be recorded for a context. In at least one embodiment, this structure includes a member (field) corresponding to the address of at least one CSR backing memory page. In at least one example, this member is named "csr_page".

my_csr_page_pointer=allocate backing page
    u.csr_page=my_csr_page_pointer

When performing pinning of CSR backing memory using e.g., HCALLs to a hypervisor in a paravirtualized environment, the context switch context sequence (e.g., a sequence in accordance with one of FIGS. 19A and 19B) is augmented with pinning and unpinning HCALLs. In accordance with one embodiment of a context switch with this aspect of the present invention, the following steps are performed:
  (1) Save non-CSR state of previous context, including but not limited to, general purpose registers, floating point registers, vector registers, etc., in accordance with known techniques;
  (2) Save in-processor configuration state registers (e.g., based on the techniques of one of FIGS. 19A and 19B);
  (3) Pin incoming CSR backing memory page (i.e., page being activated as configuration state register memory page as part of switching in (activating) the next context): HCALL(PIN, next_u->csr_page), in which next_u is a pointer pointing to the u area of the context being switched in (activated) as next context;
  (4) Optionally, in at least one embodiment, sync outgoing configuration state registers; sync_o_csr;
  (5) Load base register with the base address of the CSR backing memory corresponding to the context being activated (in one example, this CSR corresponds to TCBR): mtspr TCBR, next_u->csr_page;

(6) Optionally, in at least one embodiment, sync incoming configuration state registers: sync_i_csr;
(7) Unpin outgoing CSR backing memory page (i.e., page being deactivated as CSR backing memory page as part of switching out (deactivating) the previous context): HCALL(UNPIN, prev_u->csr_page), in which prev_u is a pointer pointing to the u area of the context being switched out (deactivated) as previous context;
(8) Load other non-CSR state of next context, including but not limited to, general purpose registers, floating point registers, vector registers, etc., in accordance with known techniques;
(9) Transfer control to the newly activated context, e.g., transfer from operating system to application thread or process context using, e.g., the rfid instruction (in an implementation in conjunction with Power ISA).

Those skilled in the art will understand that the steps hereinabove may be reordered. For example, the unpin operation may be performed prior to the pinning operation, in at least one embodiment. Other variations are possible.

In another embodiment, pinning is performed responsive to loading a base register, such as TCBR. A notification event (e.g., interrupt) may be raised to a supervisor. If there are multiple supervisor levels, a notification event is raised to each supervisor level, in one embodiment. Responsive to receiving a notification event, pinning information is updated.

In another embodiment, writing a value to a base register causes a page table entry indication flag indicating a pinned page to be set in a corresponding PTE. If there are multiple levels of page table entry, a page table entry indication flag may be set for each level.

In at least another embodiment, at least one of a pin and an unpin instruction is provided that initiates a pin or unpin process.

In yet another embodiment, pinning may be determined by host software by inspecting base registers active in the system to determine which pages are "pinned", i.e., the plurality of contents of base registers (e.g., TCBR) represents the record of pinned pages. In at least one embodiment, before moving or paging out a page, supervisor level software determines whether a page corresponds to a pinned page by determining whether a page address corresponds to an address in at least one of the base registers.

In yet a further embodiment, a host may receive a notification event of pinning, e.g., as an exception in one example embodiment. Based on receiving the notification, the host system receives an address to be pinned and stores it for future reference during memory management. In one embodiment, a notification also includes information about a previous address that is being unpinned (e.g., the previous value stored in the base configuration state register, or another value otherwise supplied, e.g., using a configuration state register).

Figure 24:
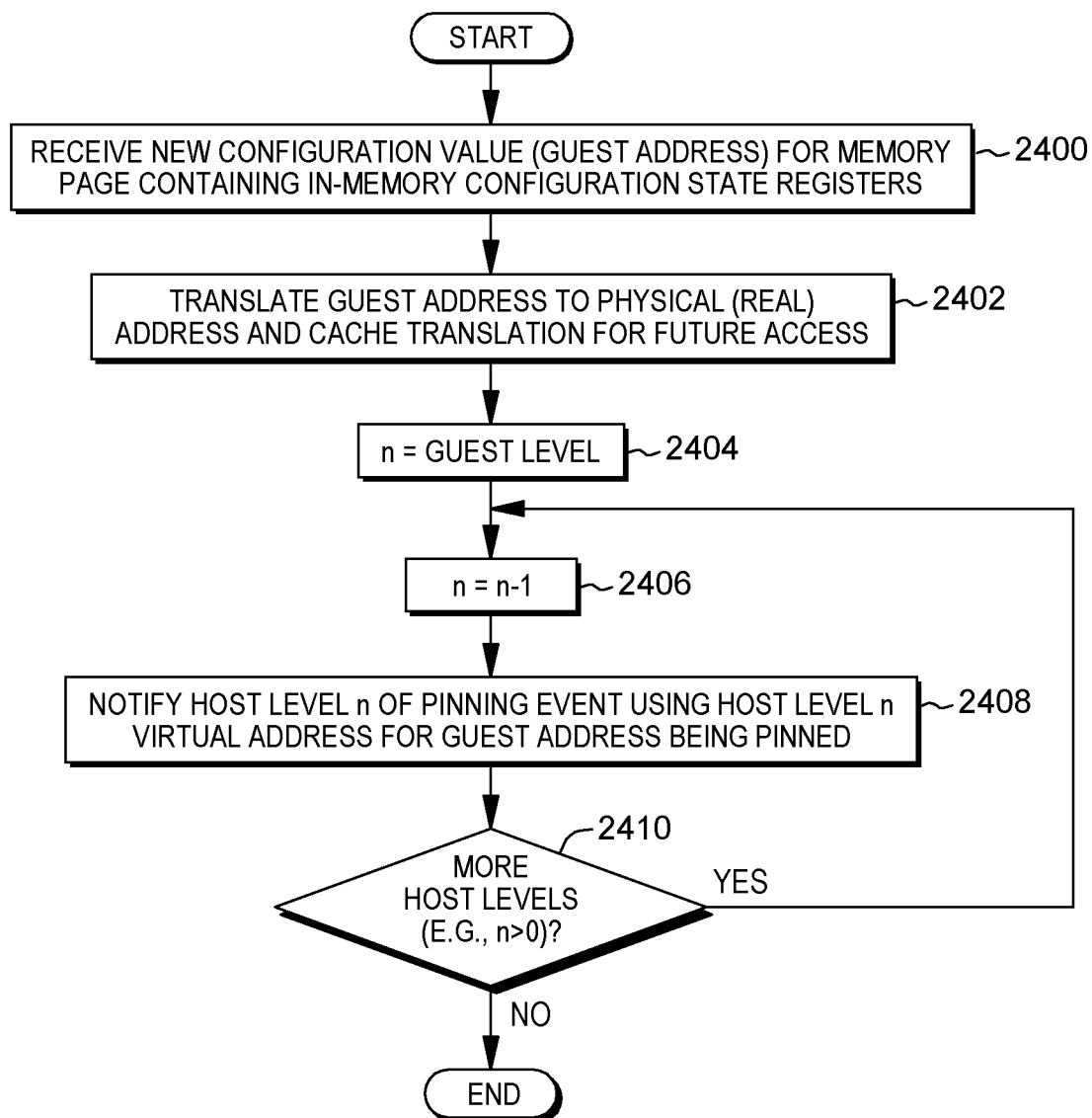
FIG. 24 depicts one embodiment of providing a pinning notification to a host system, in accordance with an aspect of the present invention.

Further details regarding one example of providing a pinning notification to the host are described with reference to FIG. 24. This logic is performed by a processor. Referring to FIG. 24, a new configuration value (e.g., a guest address) is received for a memory page (or other unit of memory) containing in-memory configuration state registers, STEP 2400. In one example, this new configuration value is stored in a base register (such as, e.g., TCBR). However, in other embodiments, the value may be provided in another manner.

The guest address (e.g., a guest virtual address or a guest real address) of the memory page is translated, STEP 2402. In one example, the guest address is translated to a physical real address and the translation is cached for future access.

A variable n is set equal to the guest level, STEP 2404. Then, n is decremented by a select value, e.g., 1, STEP 2406. Host level n is notified of a pinning event using the host level n virtual address corresponding to the guest address being pinned, STEP 2408. Further, a determination is made as to whether there are more host levels (e.g., is n greater than 0), INQUIRY 2410. If there are more host levels, then processing continues with STEP 2406. Otherwise, processing is complete.

Figure 22:
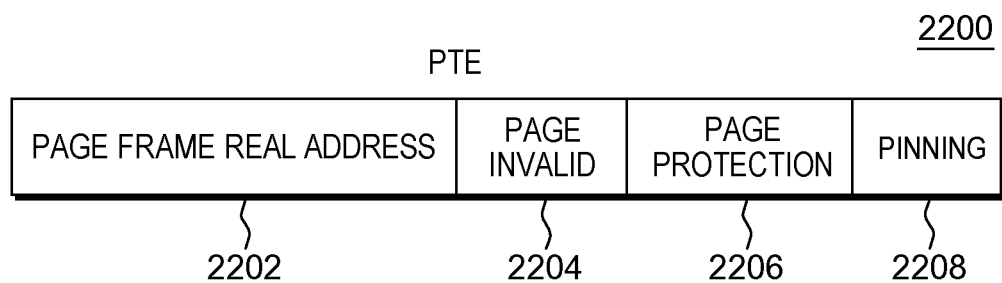
FIG. 22 depicts one example of a page table entry, in accordance with an aspect of the present invention.

In one embodiment, the pinning is indicated by an indicator, such as a bit, in a page table entry corresponding to the address. The bit indicates that the page is pinned and in use by a guest. One example of this pin indicator is depicted in FIG. 22.

Figure 25:
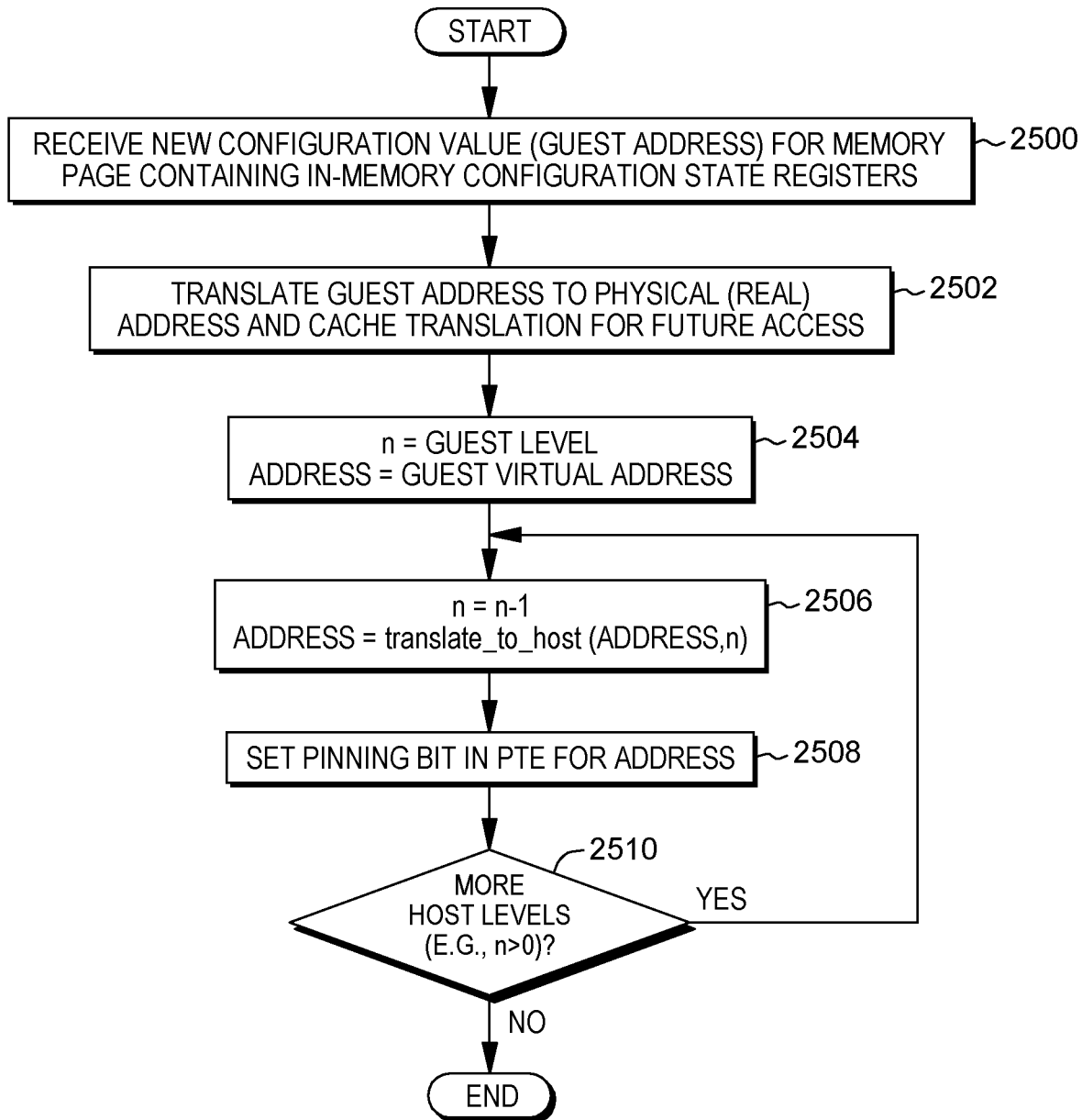
FIG. 25 depicts one embodiment of specifying a pin operation in a page table entry, in accordance with an aspect of the present invention.

Further details relating to pinning are described with reference to the example translate and pin operations depicted in FIG. 25. In one example, a processor performs this processing. Initially, a new configuration value (e.g., guest address) for a memory page containing in-memory configuration state registers is received, STEP 2500. The guest address is translated to a physical address and the translation is cached for future access, STEP 2502. A variable n is set equal to the guest level, and ADDRESS is set equal to the guest virtual address, STEP 2504. Thereafter, n is decremented by a defined value, such as 1, and ADDRESS is set equal to translate_to_host (ADDRESS, n), STEP 2506. That is, ADDRESS is set to the translated host address for the host level. The pinning indicator (e.g., bit) is set (e.g., set to one) in the page table entry for the address, STEP 2508. Further, a determination is made as to whether there are more host levels; that is, is n greater than zero, INQUIRY 2510? If there are more host levels, then processing continues with STEP 2506. Otherwise, processing ends. At this point, ADDRESS corresponds to the physical address of a pinned page and can be used for synergy with address translation.

Based on translation and caching, the indicator (e.g., bit) is set, in one example, at all host levels. In one embodiment, page table walking and pin indication are combined. This improves performance since translation accesses the same page table entries used for pin indication.

In one embodiment, unpinning is performed on another value (e.g., the previous value (address) stored in the configuration state register, or another value otherwise supplied, e.g., using a configuration register).

Figure 26:
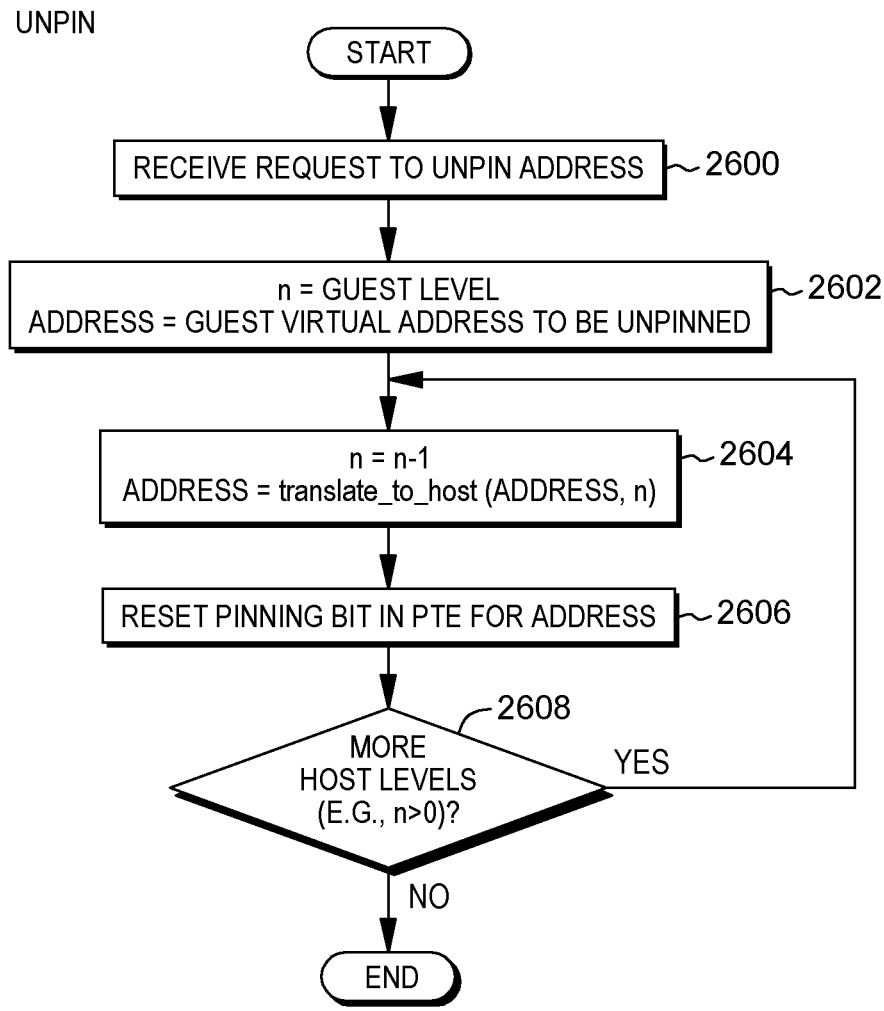
FIG. 26 depicts one embodiment of specifying an unpin operation in a page table entry, in accordance with an aspect of the present invention.

One example of processing relating to translate and unpin operations is described with reference to FIG. 26. In one example, a processor performs this processing. Initially, a request is received to unpin an address, STEP 2600. This request includes a guest virtual address to be unpinned. Further, n is set equal to the guest level, and ADDRESS is set equal to the guest virtual address to be unpinned, STEP 2602. Next, n is decremented by a defined value, such as 1, and ADDRESS is set equal to translate_to_host (ADDRESS, n), STEP 2604. That is, ADDRESS is set to the translated host address for the host level. The pinning indicator (e.g., bit) in the page table entry for the address is reset (e.g., set to zero), STEP 2606. Thereafter, a determination is made as to whether there are more host levels (e.g., is n greater than 0), STEP 2608. If there are more host levels, then processing continues with STEP 2604. Otherwise, processing ends. At this point, ADDRESS corresponds to the physical address of the unpinned page.

As described herein, based on determining that a unit of memory is to be pinned, notification is, e.g., automatically provided. The notification may be by setting an indicator, raising an interrupt, providing an exception, etc. Many variations are possible.

In a further aspect, efficient pinning management is provided via paravirtualized pinning calls. It is desirable to not have to pin and unpin pages every time they are installed. On the other hand, it is also desirable to limit the number of pinned pages so as to not unnecessarily fragment the host's page cache, and limit its page allocation freedom. Consequently, pinning HCALLs (hypervisor calls) are introduced in which a guest specifies a page to be unpinned by a host. A hypervisor can indicate whether a page to be unpinned was unpinned or not, thereby giving the guest the flexibility to not have to call a pin request for every page, if the hypervisor has resources available.

This call includes, in one embodiment, updating the base pointer or address (base) to the CSR memory backing page. Further, in one embodiment, the guest specifies whether it would like to retain a page as pinned.

In another embodiment, a hypervisor may request, by callback to an operating system, the return of pinned pages that have been previously left to the operating system when the hypervisor runs into a low resource situation. In one embodiment, the operating system specifies the one or more pages it would like to unpin as a response to the callback.

Figure 27:
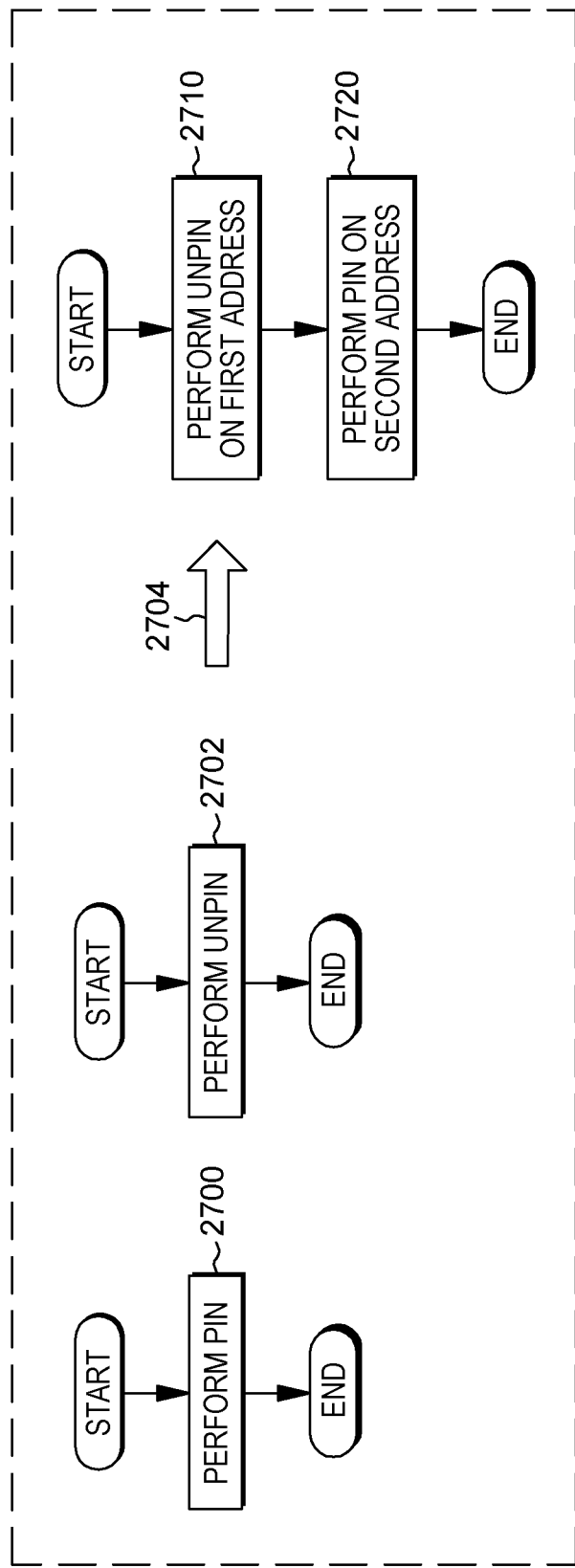
FIG. 27 depicts one example of combining a pin and an unpin operation in one hypervisor call, in accordance with an aspect of the present invention.

In accordance with one or more aspects, a single call, such as one HCALL, is used to perform pin and unpin operations by, e.g., a host executing on a processor, as described with reference to FIG. 27. As depicted, in one example, a pin operation 2700 and an unpin operation 2702 are performed in response to one hypervisor call 2704. In one example, an unpin operation is performed on a first address (e.g., a first base address) to unpin an old page, STEP 2710, and a pin operation is performed on a second address (e.g., a second base address) to pin a new page, STEP 2720. The one call is used, instead of multiple calls, saving processing time. The number of unpin and pin calls are reduced by having a combined pin and unpin call, specifying a new page (e.g., CSR backing memory page) to be pinned, and specifying a previous page to be unpinned.

In one embodiment, the operating system can request that the address specified in the call to be unpinned not be unpinned, if hypervisor console management constraints allow this. A response on whether the address is pinned or unpinned is returned. Later, the hypervisor can still use callback to request the operating system to have one or more pinned pages unpinned.

In one example, the operating system holds more than the number of pages necessary for active in-memory configuration state register pages. In a further example, the operating system pins all pages holding in-memory configuration state registers, whether active or not. This eliminates the need for future pinning. However, this may lead to an excessive number of pinned pages and system inefficiency. Therefore, in one embodiment, the operating system offers a callback function, in which the hypervisor can call the operating system to deallocate pinned pages when too many pages (or a number greater than a selected number) are pinned in a system for in-memory configuration state register use.

Further details relating to unpinning/pinning are described with reference to the below example in which unpinning/pinning are performed in a context switch. In particular, the below example describes one example of context pinning in which a guest (OS) requests a host (HV) to switch pinning, and further optionally, retain a pin.

In one embodiment, when a context (e.g., a thread context, or a process context, or a logical partition context, or a virtual machine context, or an operating system context, and so forth) is initialized by supervisory software, the supervisor allocates memory to provide storage for one or more configuration state registers corresponding to the context being initialized.

In one example, this may be performed by calling an allocation routine providing memory of suitable alignment and size. In accordance with at least one embodiment, the returned address is stored in a memory area storing information corresponding to the context. In one embodiment, this memory area is referred to as the "u area" and denoted by the variable "u". In at least one embodiment, the variable u is a record, struct, class or other composite data type with a plurality of members corresponding to various attributes to be recorded for a context. In at least one embodiment, this structure includes a member (field) corresponding to the address of at least one CSR backing memory page. In at least one example, this member is named "csr_page".

my_csr_page_pointer=allocate backing page
u.csr_page=my_csr_page_pointer

When performing pinning of CSR backing memory using e.g., HCALLs to a hypervisor in a paravirtualized environment, the context switch context sequence (e.g., a sequence in accordance with one of FIGS. 19A and 19B) is augmented with pinning and unpinning HCALLs. In accordance with one embodiment of a context switch with this aspect of the present invention, the following steps are performed:

(1) Save non-CSR state of previous context, including but not limited to general purpose registers, floating point registers, vector registers, etc., in accordance with known techniques;

(2) Save in-processor configuration state registers (e.g., based on the techniques of one of FIGS. 19A and 19B);

(3) Optionally, in at least one embodiment, sync outgoing configuration state registers; sync_o_csr;

(4) If not (next_u->csr_page_pinned)
Find page to unpin victim=select_TCBR_for_unpin( );
Desirable to retain? retain=retain_desirable_p(victim);
Give to get pin page lost_victim=HCALL(PIN_give_to_get, next_u->csr_page, victim, retain)
Victim was lost? if (lost_victim) mark_unpinned (victim);

(5) Optionally, in at least one embodiment, sync incoming configuration state registers: sync_i_csr;

(6) Load other non-CSR state of next context, including but not limited to general purpose registers, floating point registers, vector registers, etc., in accordance with known techniques;

(7) Transfer control to the newly activated context, e.g., transfer from operating system to application thread or process context using, e.g., the rfid instruction (in an implementation in conjunction with Power ISA).

Figure 28:
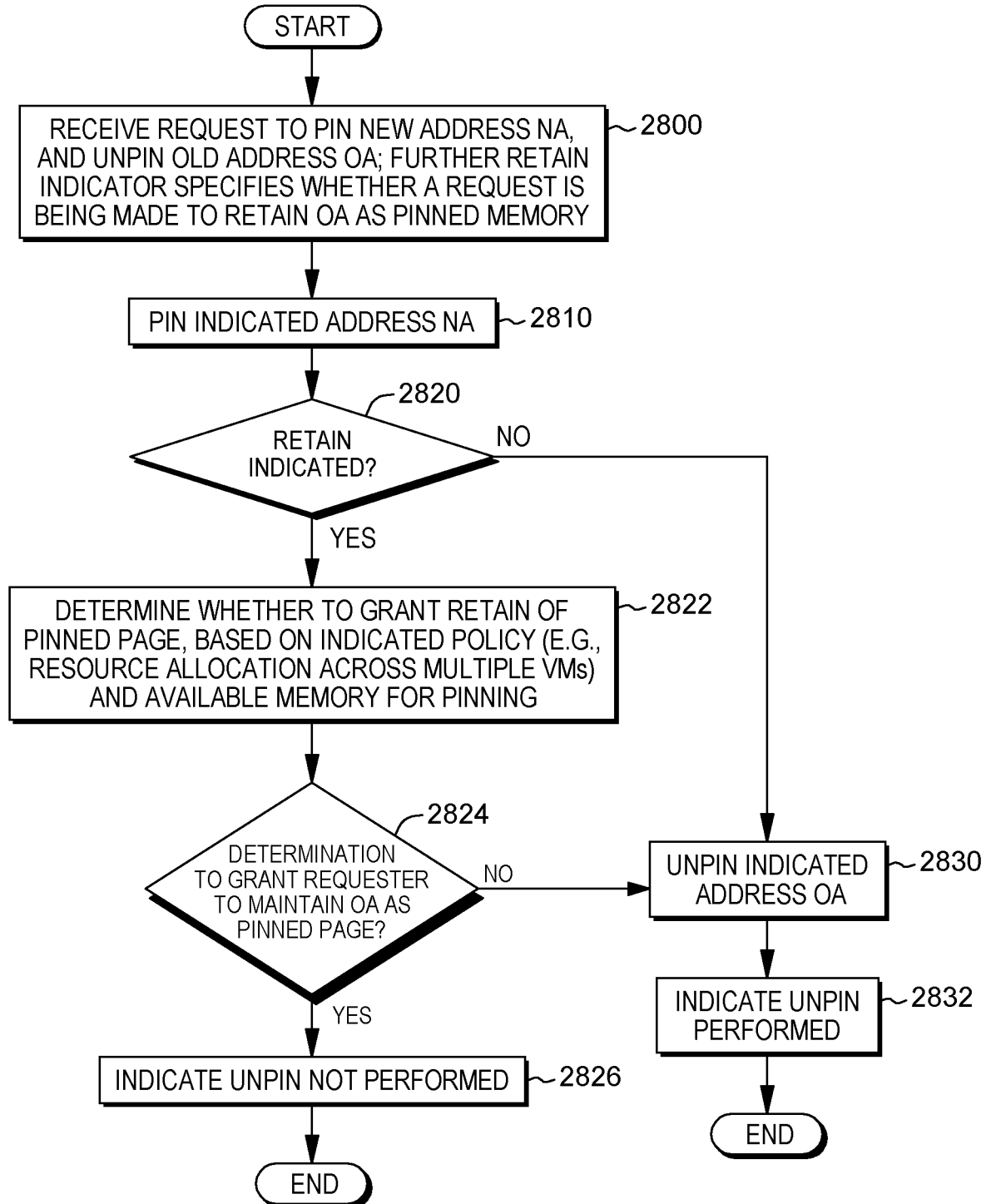
FIG. 28 depicts further details associated with performing a pin and an unpin operation based on a single call, in accordance with an aspect of the present invention.

Further details of one example of performing pin/unpin operations are described with reference to FIG. 28. A request to pin a new address, NA, and to unpin an old address, OA, is received via, e.g., a single hypervisor call, as well as a retain indicator (or an indication of such) specifying whether a request is being made to retain OA as pinned memory, STEP 2800. As an example, the new address indicates a CSR memory backing page. Address NA is pinned, STEP 2810, and a determination is made as to whether the retain indicator specifies a request to retain address OA as pinned in memory, INQUIRY 2820. If there is a request to retain the pinning of OA, a determination is made as to whether to grant the maintaining of the pinned page based on an indicated policy (e.g., resource allocation across multiple virtual machines) and available memory for pinning, INQUIRY 2822. If the request is granted, INQUIRY 2824, an indication that an unpin operation is not to be performed is made, STEP 2826. Otherwise, address OA is unpinned, STEP 2830, and an indication is provided that the unpin is performed, STEP 2832.

Returning to INQUIRY 2820, if the retain indicator specifies that the pinning is not to be retained, then processing continues with STEP 2830.

As described above, one call may be used to unpin one address, pin another address and/or request that the address to be unpinned actually not be unpinned. By using one call, processing is facilitated and performance is improved.

As described herein, selected configuration state registers are stored in-memory, instead of in-processor. By storing the registers in-memory, certain benefits and optimizations may be achieved, including those associated with data corruption detection and correction.

In one example, memory-backed state is used to enhance resiliency and to address single event upsets (SEU) or soft errors. Single event upsets are state changes introduced by the effect of ionizing radiation. As CMOS (complementary metal-oxide-semiconductor) feature sizes shrink, the amount of charge QCRIT used to change a bit shrinks with it, as less charge is stored for each bit. To remediate the impact of single event upsets, data protection is applied. This includes, for instance, using parity or error correction code (ECC) protection of registers, to detect and repair, respectively, damaged state register values. Error correction code or parity protection is used, as repair is reasonably affordable for register files when the design across an area can be amortized over many registers. For in-processor configuration registers, oftentimes this is unaffordable because separate protection and recovery would have to be designed for each register.

However, in accordance with an aspect of the present invention, configuration state registers are stored in-memory where they are protected with one or more advanced protection mechanisms, including, but not limited to, parity bits and error correction codes (ECC), in accordance with an aspect of the present invention.

In one aspect, in-processor configuration state registers are also protected by using the SEU-resilient system memory hierarchy. In one embodiment, in-processor configuration state registers are protected with a technique to detect SEU-induced corruption. A variety of detection techniques may be used in conjunction with aspects of the present invention. In one example, the corruption detection mechanism corresponds to the use of data parity protection for in-processor configuration state registers. In another embodiment, SEU-induced corruption may be detected by testing for signatures of register value changes in the absence of a write to a configuration register. In addition, such in-processor registers are also stored in-memory to ensure an ECC-protected copy of the in-processor configuration registers is available. In one embodiment, responsive to updates of the in-processor configuration registers which are so protected, a copy of the update is also stored to the in-memory copy. When the processor recognizes a parity error, the value is retrieved from the ECC protected in-memory copy and the in-processor register is updated.

Further, in one embodiment, high use-rate values, such as instruction address, data address and content break point registers, are stored in backing memory and can be recovered when a single event upset is detected. Recovery includes parity protection, either via a hardware reload path or by performing a machine check, and having a machine check handler reload those registers. Thus, in accordance with an aspect of the present invention, configuration register state is protected by storing the configuration state registers in system memory and using, e.g., ECC, to protect the single event upsets.

Further details relating to using error correction code for configuration state registers are described below. In particular, examples of using error correction code for data writes are described with reference to FIGS. 29A-29C, and examples of using error correction code for data reads are described with reference to FIGS. 30A-30C.

Referring initially to FIG. 29A, in this example, a data write is unprotected. In this example, a value is received for an in-processor configuration state register, STEP 2900, and that value is written to a latch implementing the configuration state register, STEP 2902. This data write is unprotected for single event upsets and other types of errors.

In contrast, with reference to FIG. 29B, a value is received for an in-processor configuration state register, STEP 2920, and error protection or an error correction code is computed, STEP 2922. The received value is written to the configuration state register (e.g., the latch implementing the configuration state register) in conjunction with the protection or error correction code, STEP 2924.

Yet further, with reference to FIG. 29C, one embodiment of a data write for an in-memory configuration state register is described. In this example, a value for the in-memory configuration state register is received, STEP 2952, and a determination is made as to the system memory address at which the configuration state register is stored, STEP 2954. The value is then stored to that system memory address which is protected, since it is part of memory benefiting from error protection, STEP 2956.

In one aspect, the storing includes, for instance, computing an error correction code for a received in-memory configuration state register value, and storing the computed error correction code with the received value. As known, an error correction code adds one or more parity bits to the data bits representing the value (e.g., one or more parity bits per one or more subsets of the data bits) and uses those parity bits to determine any errors. If there is an error in the data, the parity bits indicate where in the data bits there is an error, allowing a correction to be made (e.g., change one or more data bits, represented in binary, to another value).

In addition to the above, one example of performing data reads for in-processor configuration state registers and in-memory configuration state registers are described with reference to FIGS. 30A-30C.

Referring to FIG. 30A, one example of a data read for an in-processor configuration state register, in which no protection is offered is described. In this example, the value is provided to the processor logic, STEP 3000.

In contrast, one example of processing associated with reading a value from an in-processor configuration state register in which protection is provided is described with reference to FIG. 30B. In this example, the value is received from the latch, STEP 3020, and the correction code is checked, STEP 3022. If corruption is not detected, INQUIRY 3024, the value is provided to the processor logic, STEP 3030. However, returning to INQUIRY 3024, if corruption is detected, then the corrected value is computed, STEP 3026, and the corrected value is written back to the latch, STEP 3028. Further, that value is provided to the processor logic, STEP 3030.

Additionally, a data read that uses an in-memory configuration state register is described with reference to FIG. 30C.

In this example, a configuration state register number is received, STEP 3050. A determination is made as to the system memory address for the configuration state register, STEP 3052. The value is read from the protected system memory, STEP 3054, and that value is provided to the processor logic, STEP 3056.

In one aspect, the reading includes determining, using the error correction code, whether corruption of the data (e.g., the value) has occurred. If corruption is detected, one or more actions may be taken, including but not limited to, performing recovery. Recovery may include computing a corrected value for the corrupted value using the error correction code. Other examples also exist.

By using in-memory configuration state registers, error protection benefits are received, avoiding expensive additional steps and latency to add such protection to the latches implementing in-processor configuration state registers.

As examples, error correction is provided based on writing to an in-memory configuration state register. Error detection and correction code may be generated based on receiving a value of a configuration state register to be stored in memory. Error detection and correction code may be used to detect whether corruption has occurred, based on receiving a read request for memory storing a configuration state register. Corruption is corrected, based on reading an in-memory configuration state register and detecting corruption has occurred.

Described in detail herein are aspects related to providing in-memory configuration state registers. By providing configuration state registers in-memory, processing is facilitated, and performance may be enhanced. Certain improvements and optimizations may be realized.

The in-memory configuration state registers may be used in instruction processing, as well as in other operation sequences. For example, an exception may be received based on receiving an interrupt signal from an external device. In processing the exception, one or more configuration state registers, such as a SRR0 and SRR1, may be accessed. When these registers are in-memory configuration state registers, the interrupt processing sequence is expanded to include load and/or store operations. Other examples and/or variations are possible.

One or more aspects of the present invention are inextricably tied to computer technology and facilitate processing within a computer, improving performance thereof. Further details of one embodiment of facilitating processing within a computing environment, as it relates to one or more aspects of the present invention, are described with reference to FIGS. 31A-31B.

Referring to FIG. 31A, in one embodiment, a request to access an in-memory configuration state register is obtained (3100). The in-memory configuration state register is mapped to memory (3102), and error correction code of the memory is used to protect the access to the in-memory configuration state register (3104).

As one example, the request is a write request and includes a value to be stored in the in-memory configuration state register (3106). In one embodiment, a determination is made of a memory address for a unit of memory storing the in-memory configuration state register (3108), and the value is stored at the memory address (3110).

Further, in one aspect, the storing the value includes computing an error correction code for the value (3112). The value is a received in-memory configuration state register value (3114), and the computed error correction code is stored in conjunction with the received in-memory configuration state register value (3116).

As another example, with reference to FIG. 31B, the request is a read request that includes an indication of the in-memory configuration state register from which data is to be read (3120). Based on the indication of the in-memory configuration state register, a memory address from which the data is to be obtained is determined (3122). The data is read from the memory address (3124).

In one aspect, a determination is made, at least in part by using the error correction code, as to whether corruption has occurred, in which the data is corrupted (3126). Based on determining the data is corrupted, one or more actions are performed (3128). The one or more actions include, for example, performing recovery (3130). The recovery includes, for instance, computing a corrected value for the corrupted data using the error correction code (3132).

Other variations and embodiments are possible.

Figure 32A:
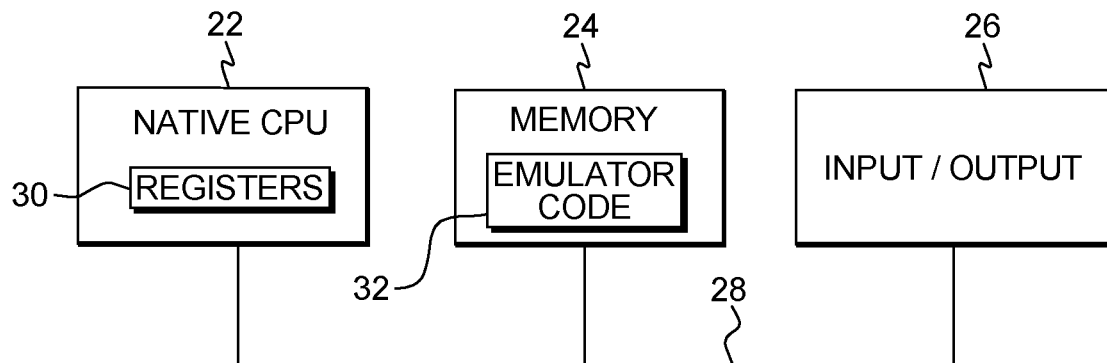
FIG. 32A depicts another example of a computing environment to incorporate and use one or more aspects of the present invention.

Other types of computing environments may also incorporate and use one or more aspects of the present invention, including, but not limited to, emulation environments, an example of which is described with reference to FIG. 32A. In this example, a computing environment 20 includes, for instance, a native central processing unit (CPU) 22, a memory 24, and one or more input/output devices and/or interfaces 26 coupled to one another via, for example, one or more buses 28 and/or other connections. As examples, computing environment 20 may include a PowerPC processor or a pSeries server offered by International Business Machines Corporation, Armonk, N.Y.; and/or other machines based on architectures offered by International Business Machines Corporation, Intel, or other companies.

Native central processing unit 22 includes one or more native registers 30, such as one or more general purpose registers and/or one or more special purpose registers used during processing within the environment. These registers include information that represents the state of the environment at any particular point in time.

Moreover, native central processing unit 22 executes instructions and code that are stored in memory 24. In one particular example, the central processing unit executes emulator code 32 stored in memory 24. This code enables the computing environment configured in one architecture to emulate another architecture. For instance, emulator code 32 allows machines based on architectures other than the z/Architecture, such as PowerPC processors, pSeries servers, or other servers or processors, to emulate the z/Architecture and to execute software and instructions developed based on the z/Architecture.

Figure 32B:
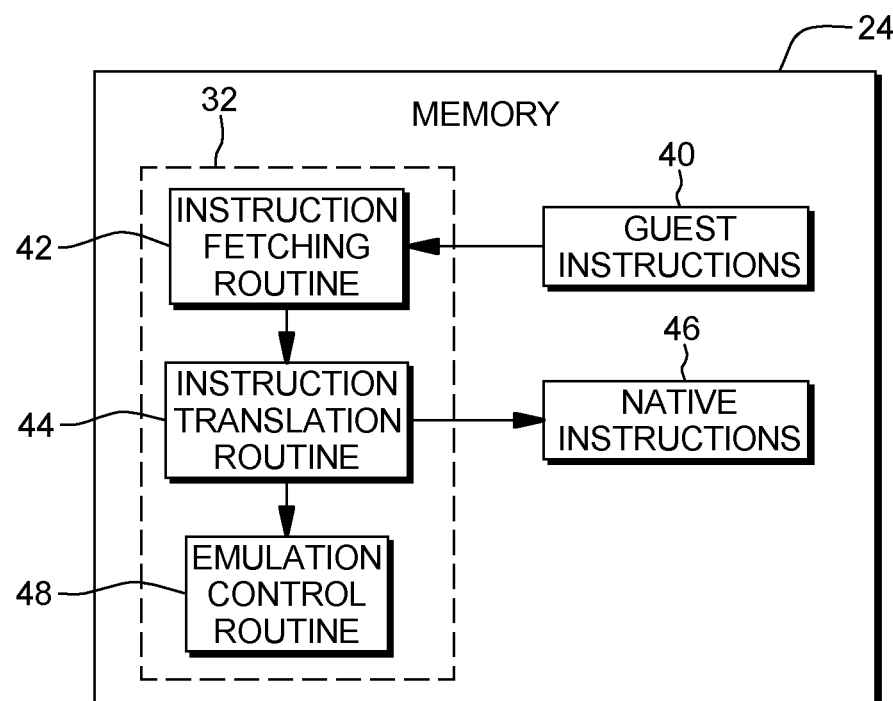
FIG. 32B depicts further details of the memory of FIG. 32A.

Further details relating to emulator code 32 are described with reference to FIG. 32B. Guest instructions 40 stored in memory 24 comprise software instructions (e.g., correlating to machine instructions) that were developed to be executed in an architecture other than that of native CPU 22. For example, guest instructions 40 may have been designed to execute on a z/Architecture processor, but instead, are being emulated on native CPU 22, which may be, for example, an Intel processor. In one example, emulator code 32 includes an instruction fetching routine 42 to obtain one or more guest instructions 40 from memory 24, and to optionally provide local buffering for the instructions obtained. It also includes an instruction translation routine 44 to determine the type of guest instruction that has been obtained and to translate the guest instruction into one or more corresponding native instructions 46. This translation includes, for instance, identifying the function to be performed by the guest instruction and choosing the native instruction(s) to perform that function.

Further, emulator code 32 includes an emulation control routine 48 to cause the native instructions to be executed. Emulation control routine 48 may cause native CPU 22 to execute a routine of native instructions that emulate one or more previously obtained guest instructions and, at the conclusion of such execution, return control to the instruction fetch routine to emulate the obtaining of the next guest instruction or a group of guest instructions. Execution of native instructions 46 may include loading data into a register from memory 24; storing data back to memory from a register; or performing some type of arithmetic or logic operation, as determined by the translation routine.

Each routine is, for instance, implemented in software, which is stored in memory and executed by native central processing unit 22. In other examples, one or more of the routines or operations are implemented in firmware, hardware, software or some combination thereof. The registers of the emulated processor may be emulated using registers 30 of the native CPU or by using locations in memory 24. In embodiments, guest instructions 40, native instructions 46 and emulator code 32 may reside in the same memory or may be disbursed among different memory devices.

As used herein, firmware includes, e.g., the microcode or Millicode of the processor. It includes, for instance, the hardware-level instructions and/or data structures used in implementation of higher level machine code. In one embodiment, it includes, for instance, proprietary code that is typically delivered as microcode that includes trusted software or microcode specific to the underlying hardware and controls operating system access to the system hardware.

A guest instruction 40 that is obtained, translated and executed may be, for instance, one of the instructions described herein. The instruction, which is of one architecture (e.g., the z/Architecture), is fetched from memory, translated and represented as a sequence of native instructions 46 of another architecture (e.g., PowerPC, pSeries, Intel, etc.). These native instructions are then executed.

One or more aspects may relate to cloud computing.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for loadbalancing between clouds).

A cloud computing environment is service oriented with a focus on statelessness, low coupling, modularity, and semantic interoperability. At the heart of cloud computing is an infrastructure comprising a network of interconnected nodes.

Figure 33:
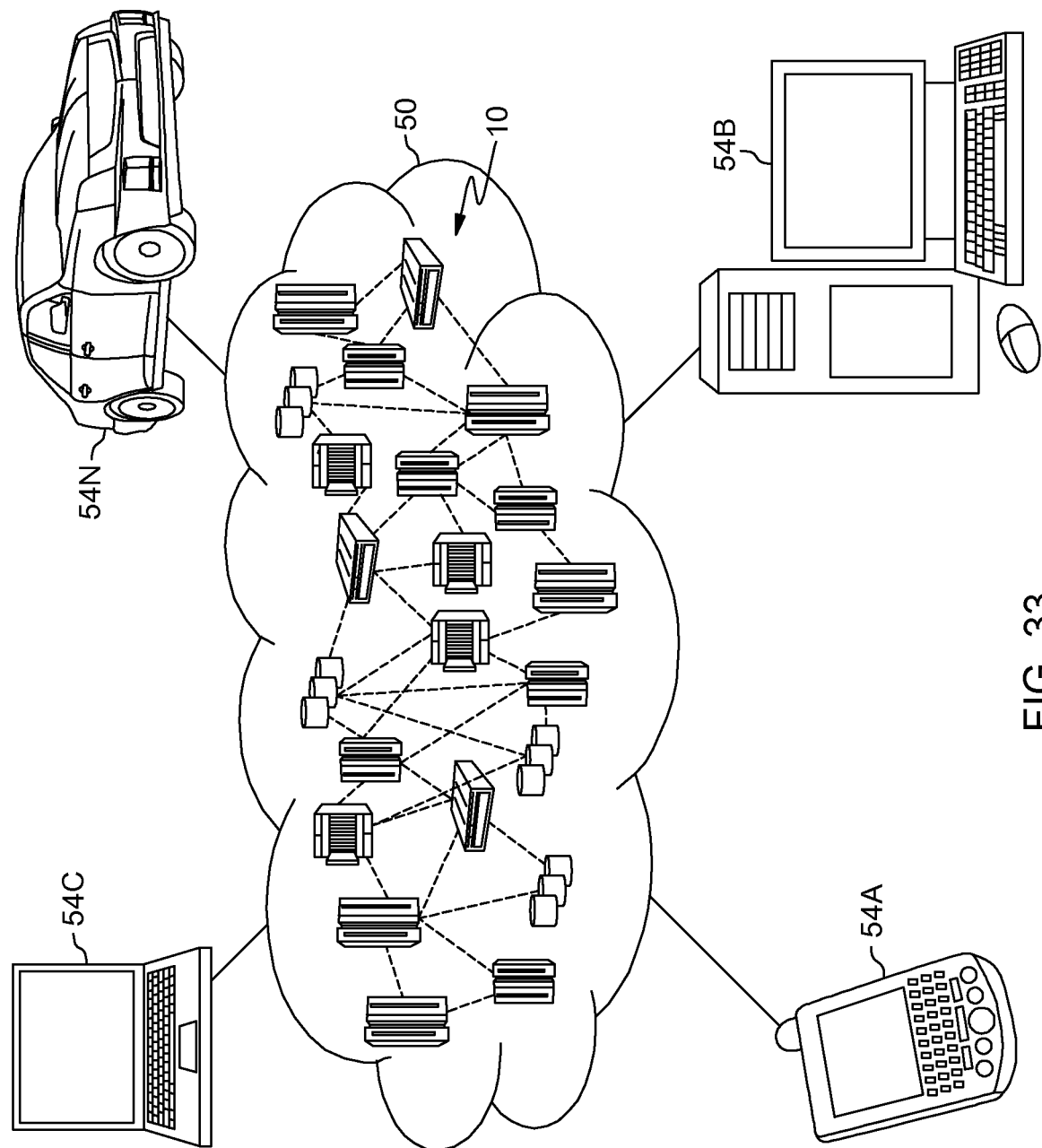
FIG. 33 depicts one embodiment of a cloud computing environment.

Referring now to FIG. 33, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 33 are intended to be illustrative only and that computing nodes 10 and cloud computing environment 50 can communicate with any type of computerized device over any type of network and/or network addressable connection (e.g., using a web browser).

Figure 34:
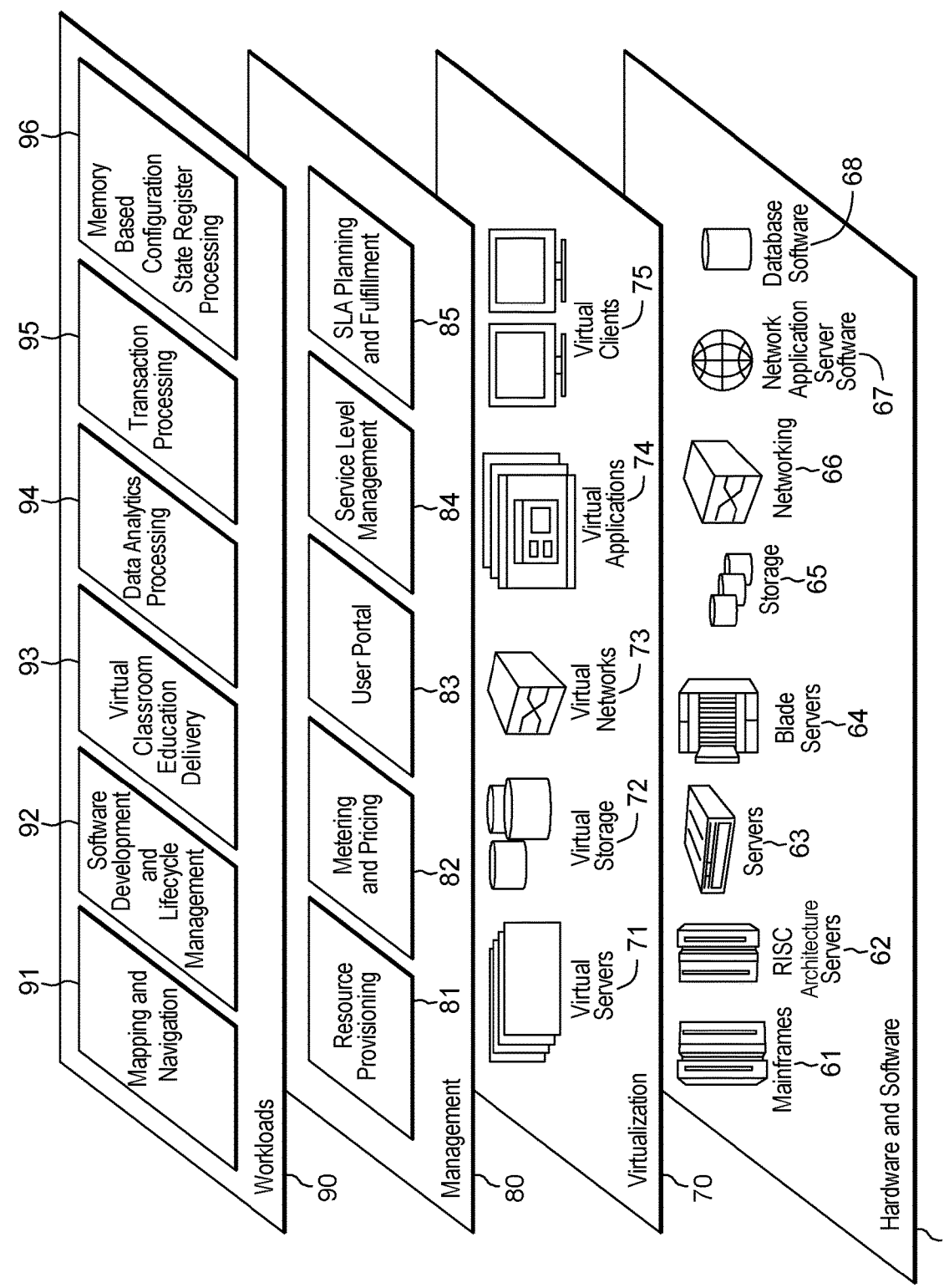
FIG. 34 depicts one example of abstraction model layers.

Referring now to FIG. 34, a set of functional abstraction layers provided by cloud computing environment 50 (FIG. 33) is shown. It should be understood in advance that the components, layers, and functions shown in FIG. 34 are intended to be illustrative only and embodiments of the invention are not limited thereto. As depicted, the following layers and corresponding functions are provided:

Hardware and software layer 60 includes hardware and software components. Examples of hardware components include mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and table of contents processing 96.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments. Further, different instructions or operations may be used. Additionally, different registers may be used and/or other types of indications (other than register numbers) may be specified. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer program product for facilitating processing within a computing environment, the computer program product comprising:
a computer readable storage medium readable by a processing circuit and storing instructions for performing a method comprising:
obtaining a request to access an in-memory configuration state register, the in-memory configuration state register being mapped to memory, and wherein the request is a write request, the write request including a value to be stored in the in-memory configuration state register;
determining a memory address for a unit of memory storing the in-memory configuration state register;
storing the value at the memory address, wherein the storing the value includes computing an error correction code for the value, the value being a received in-memory configuration state register value, and storing the computed error correction code in conjunction with the received in-memory configuration state register value; and
using the error correction code of the memory to protect the access to the in-memory configuration state register.

2. The computer program product of claim 1, wherein the method further comprises obtaining another request, wherein the other request is a read request, the read request including an indication of the in-memory configuration state register from which data is to be read.

3. The computer program product of claim 2, wherein the method further comprises:
determining, based on the indication of the in-memory configuration state register, a memory address from which the data is to be obtained; and
reading the data from the memory address from which the data is to be obtained.

4. The computer program product of claim 3, wherein the reading comprises:
determining, at least in part by using the error correction code, whether corruption has occurred, in which the data is corrupted; and
performing one or more actions based on determining the data is corrupted.

5. The computer program product of claim 4, wherein the one or more actions include performing recovery.

6. The computer program product of claim 5, wherein the recovery includes computing a corrected value for the corrupted data using the error correction code.

7. A computer system for facilitating processing within a computing environment, the computer system comprising:
a memory; and
a processor in communication with the memory, wherein the computer system is configured to perform a method, said method comprising:
obtaining a request to access an in-memory configuration state register, the in-memory configuration state register being mapped to memory, and wherein the request is a write request, the write request including a value to be stored in the in-memory configuration state register;
determining a memory address for a unit of memory storing the in-memory configuration state register;
storing the value at the memory address, wherein the storing the value includes computing an error correction code for the value, the value being a received in-memory configuration state register value, and storing the computed error correction code in conjunction with the received in-memory configuration state register value; and
using the error correction code of the memory to protect the access to the in-memory configuration state register.

8. The computer system of claim 7, wherein the method further comprises obtaining another request, wherein the other request is a read request, the read request including an indication of the in-memory configuration state register from which data is to be read, and wherein the method further comprises:
determining, based on the indication of the in-memory configuration state register, a memory address from which the data is to be obtained; and
reading the data from the memory address from which the data is to be obtained.

9. The computer system of claim 8, wherein the reading comprises:
determining, at least in part by using the error correction code, whether corruption has occurred, in which the data is corrupted; and
performing one or more actions based on determining the data is corrupted.

10. The computer system of claim 9, wherein the one or more actions include performing recovery, and wherein the recovery includes computing a corrected value for the corrupted data using the error correction code.

11. A computer-implemented method of facilitating processing within a computing environment, the computer-implemented method comprising:
obtaining a request to access an in-memory configuration state register, the in-memory configuration state register being mapped to memory, and wherein the request is a write request, the write request including a value to be stored in the in-memory configuration state register;
determining a memory address for a unit of memory storing the in-memory configuration state register;
storing the value at the memory address, wherein the storing the value includes computing an error correction code for the value, the value being a received in-memory configuration state register value, and storing the computed error correction code in conjunction with the received in-memory configuration state register value; and
using the error correction code of the memory to protect the access to the in-memory configuration state register.

12. The computer-implemented method of claim 11, further comprising obtaining another request, wherein the other request is a read request, the read request including an indication of the in-memory configuration state register from which data is to be read, and further comprising:

determining, based on the indication of the in-memory configuration state register, a memory address from which the data is to be obtained; and reading the data from the memory address from which the data is to be obtained.

13. The computer-implemented method of claim 12, wherein the reading comprises:

determining, at least in part by using the error correction code, whether corruption has occurred, in which the data is corrupted; and performing one or more actions based on determining the data is corrupted.

14. The computer-implemented method of claim 13, wherein the one or more actions include performing recovery.

15. The computer-implemented method of claim 14, wherein the recovery includes computing a corrected value for the corrupted data using the error correction code.

\* \* \* \* \*